United States Patent
Fukuda

[19]

[11] Patent Number: 5,841,793
[45] Date of Patent: Nov. 24, 1998

[54] OPTICAL REPRODUCTION SYSTEM HAVING FUNCTION OF RATIONALLY CHANGING ERROR DATA CHUNK AND REPRODUCING MULTIMEDIA INFORMATION AS CODE DATA

[75] Inventor: Hiroyuki Fukuda, Hachioji, Japan

[73] Assignee: Olympus Optical Co., Ltd., Tokyo, Japan

[21] Appl. No.: 592,567

[22] Filed: Jan. 26, 1996

[30] Foreign Application Priority Data

Feb. 2, 1995 [JP] Japan .................................. 7-015813

[51] Int. Cl.[6] .............................. H03M 13/00; G11B 5/09
[52] U.S. Cl. .................................. 371/37.01; 371/37.05; 369/47
[58] Field of Search .................................. 371/37.1, 37.2, 371/37.3, 37.4, 37.5, 38.1, 40.1, 40.2, 43, 45, 37.01, 37.02, 37.05, 37.07; 369/47, 48, 50, 53, 58, 59, 275.3, 275.4

[56] References Cited

U.S. PATENT DOCUMENTS

| 5,457,673 | 10/1995 | Nakamura et al. | 369/53 |
|---|---|---|---|
| 5,465,244 | 11/1995 | Kobayashi et al. | 369/50 |
| 5,592,450 | 1/1997 | Yonemitsu et al. | 369/48 |
| 5,596,565 | 1/1997 | Yonemitsu et al. | 369/275.3 |

*Primary Examiner*—Thomas C. Lee
*Assistant Examiner*—Thomas E. Brown
*Attorney, Agent, or Firm*—Frishauf, Holtz, Goodman, Langer & Chick

[57] ABSTRACT

In a system for converting multimedia information to an optically readable code, printing/recording the code on an information recording medium, and reading the code to restore it to the original multimedia information, a read unit optically reads the code. A decoding unit demodulates the code read by the read unit and outputs demodulated data. A reproduction unit performs processing associated with error correction in units of partial data chunks each consisting, as a unit of an aggregate of a predetermined amount of demodulated data output from the decoding unit. An output unit acquires a predetermined number of partial data chunks output from the reproduction unit to form final output data and outputs the data as the recognizable original multimedia information. An error partial data chunk detection units detects an omitted portion or a portion for which error correction by the reproduction unit has failed as an error partial data chunk in units of partial data chunks output from the output unit. A data change unit recognizes the error partial data chunk detected by the error partial data chunk detection unit and changes data of a portion corresponding to the error partial data chunk.

21 Claims, 37 Drawing Sheets

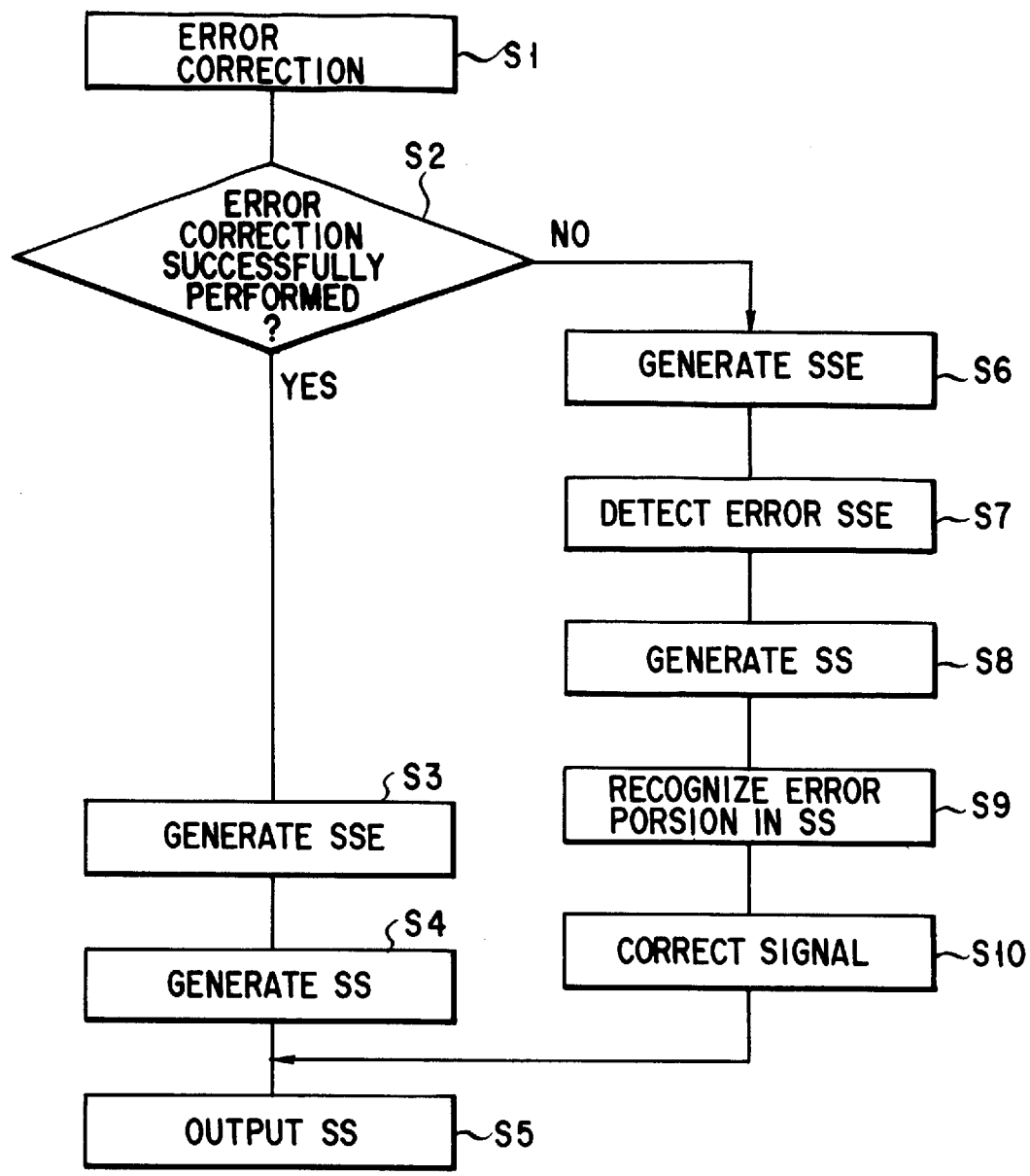
F I G. 2

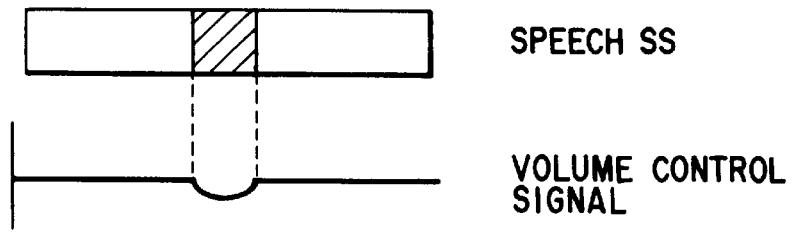
F I G. 3A
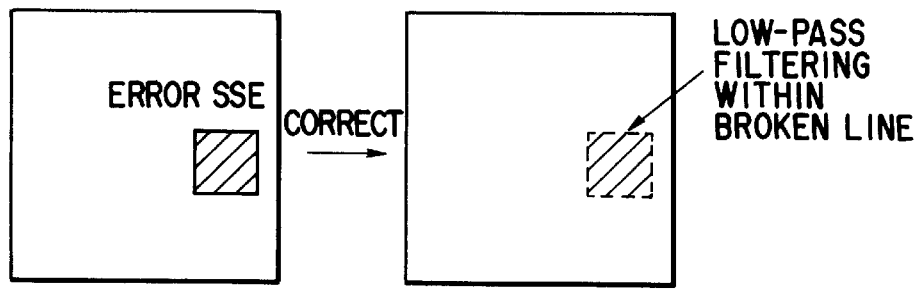
F I G. 3B
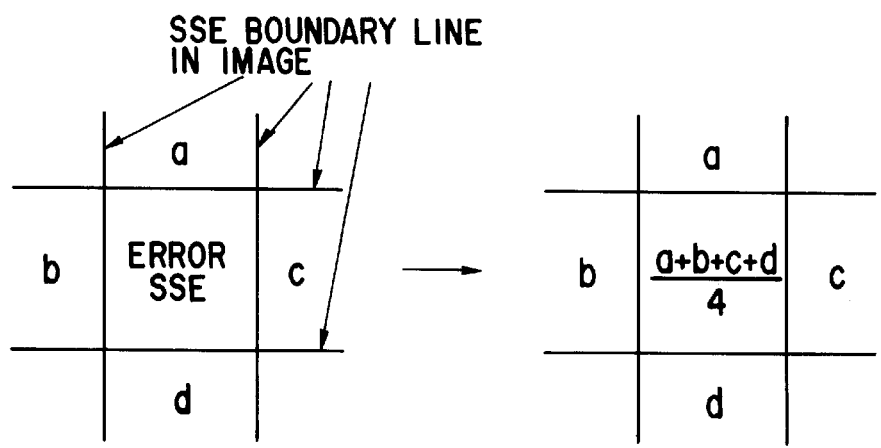
SET AVERAGE VALUE OR FOUR
PERIPHERAL SSES IN ERROR SSE
F I G. 3C

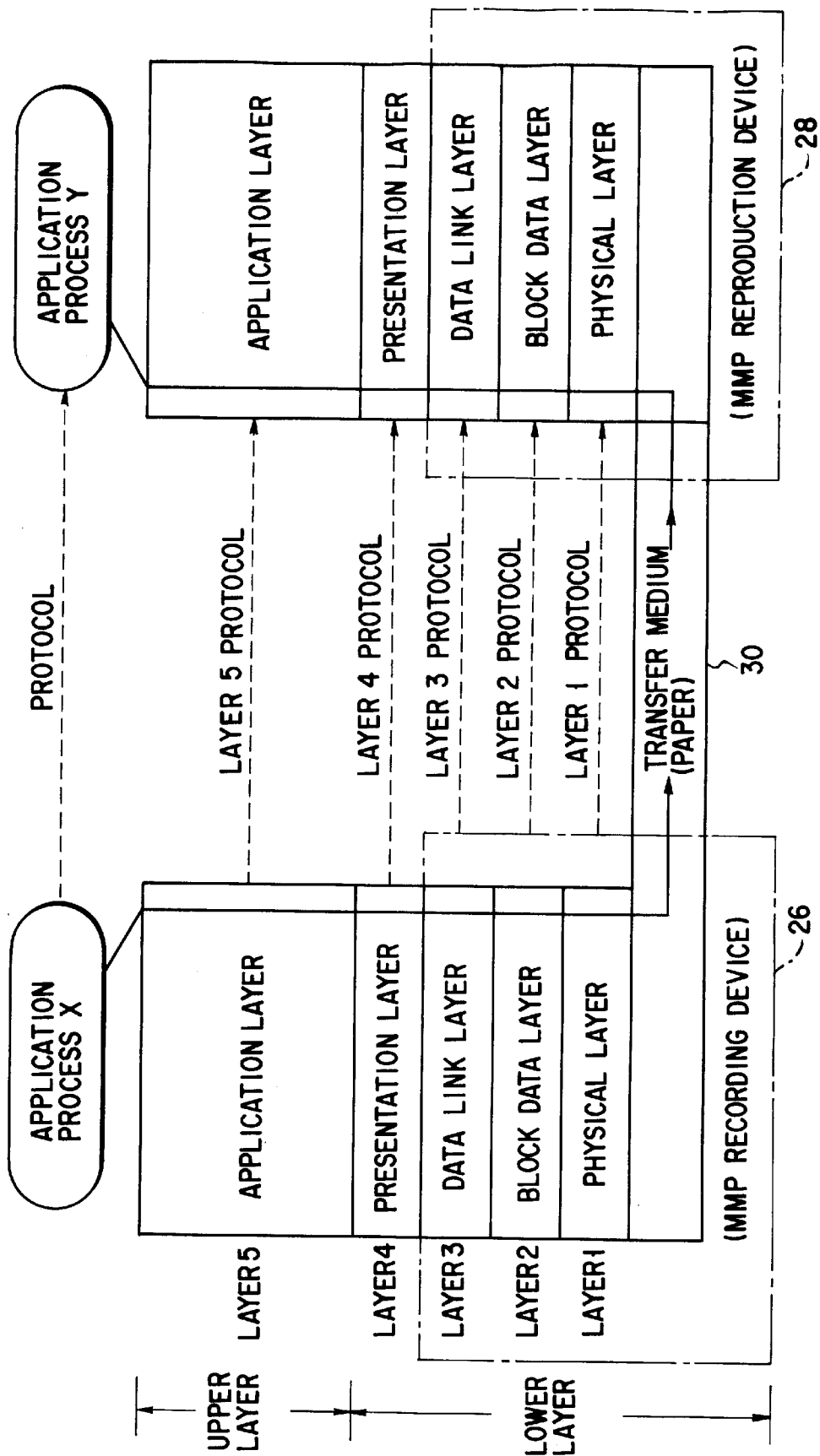
F I G. 10

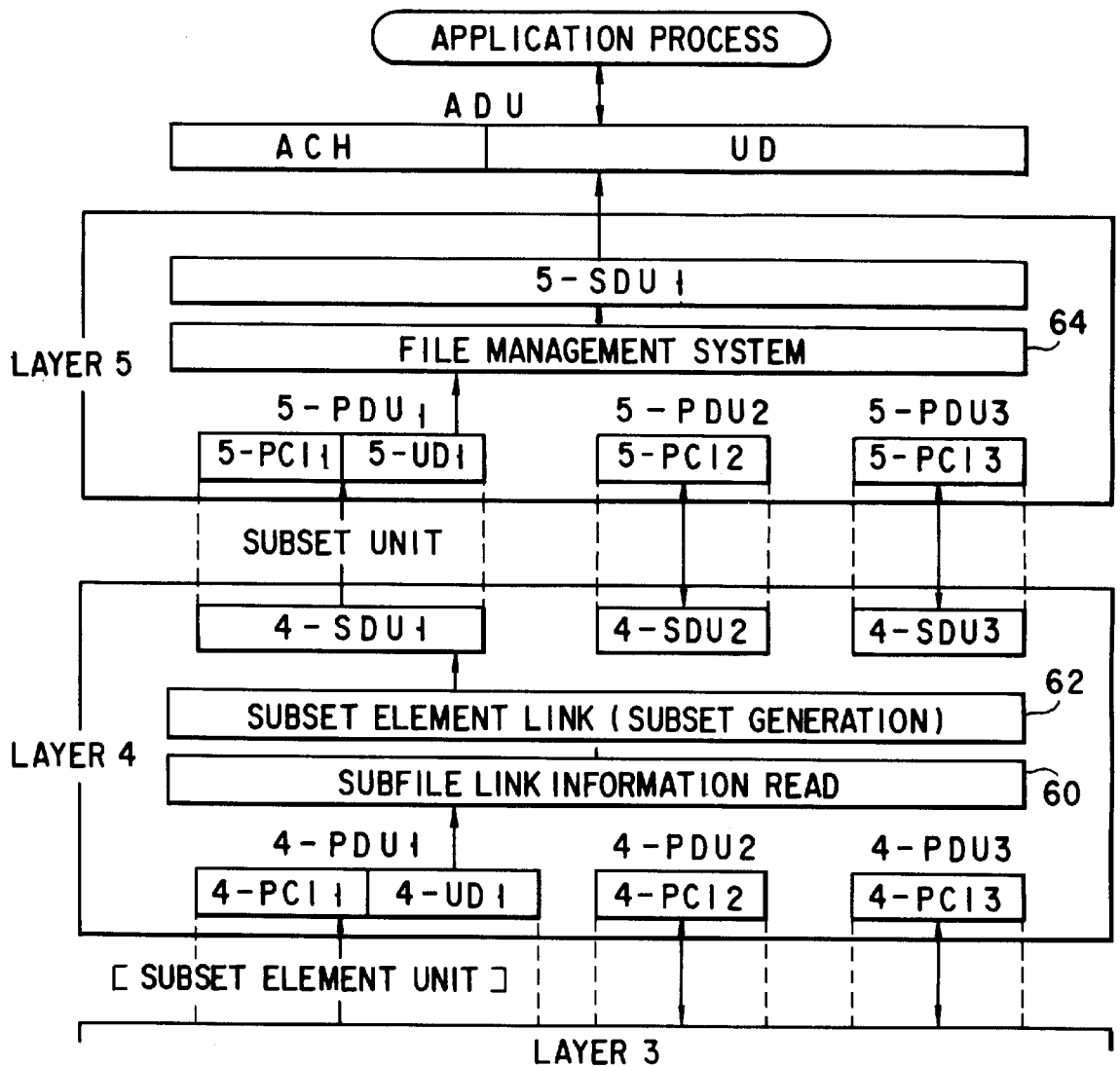
F I G. 12

FIG. 13A

| SET STANDARD IDENTIFICATION CODE (96) | USER DATA FORMAT TYPE (98) | BLOCK ADDRESS (100) | BLOCK USER DATA SIZE (102) | BLOCK USER DATA SIZE (104) |
|---|---|---|---|---|

FIG. 13B

| SET STANDARD IDENTIFICATION CODE (96) | USER DATA FORMAT TYPE (98) | BLOCK ADDRESS (100) | BLOCK ADDRESS ERROR STATUS FLAG (106) | BLOCK USER DATA SIZE (102) | BLOCK USER DATA SIZE (104) |
|---|---|---|---|---|---|

FIG. 13C

| SET STANDARD IDENTIFICATION CODE (96) | USER DATA FORMAT TYPE (98) | BLOCK ADDRESS (100) | BLOCK ADDRESS ERROR STATUS FLAG (106) | BLOCK USER DATA SIZE (102) | BLOCK USER DATA DEMODULATION ERROR COUNT (108) | BLOCK USER DATA SIZE (104) |
|---|---|---|---|---|---|---|

FIG. 13D

| SET STANDARD IDENTIFICATION CODE (96) | USER DATA FORMAT TYPE (98) | BLOCK ADDRESS (100) | BLOCK ADDRESS ERROR STATUS FLAG (106) | BLOCK USER DATA SIZE (102) | BLOCK USER DATA DEMODULATION ERROR POSITION (110) | BLOCK USER DATA SIZE (104) |
|---|---|---|---|---|---|---|

106 BLOCK ADDRESS ERROR STATUS FLAG

FIG. 13E

| STATUS | NO ERROR | CORRECTION OK | ERRONEOUS CORRECTION OR CORRECTION WITH ADJACENT BLOCK VALUE NG AFTER CORRECTION NG | ERRONEOUS CORRECTION OR CORRECTION WITH ADJACENT BLOCK VALUE NG AFTER CORRECTION NG |
|---|---|---|---|---|
| VALUE OF FLAG | 1 | 2 | 3 | 4 |

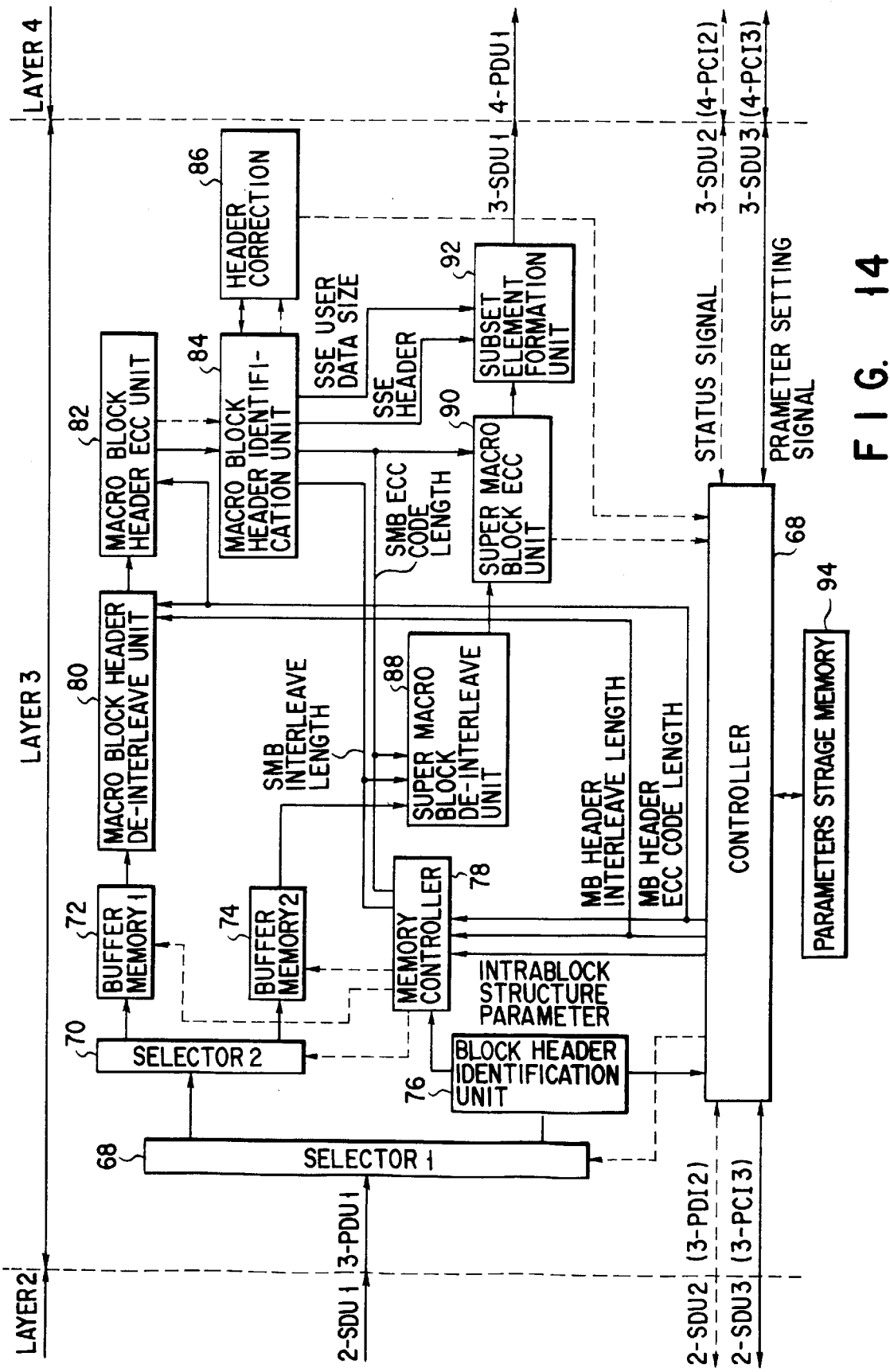
F I G. 14

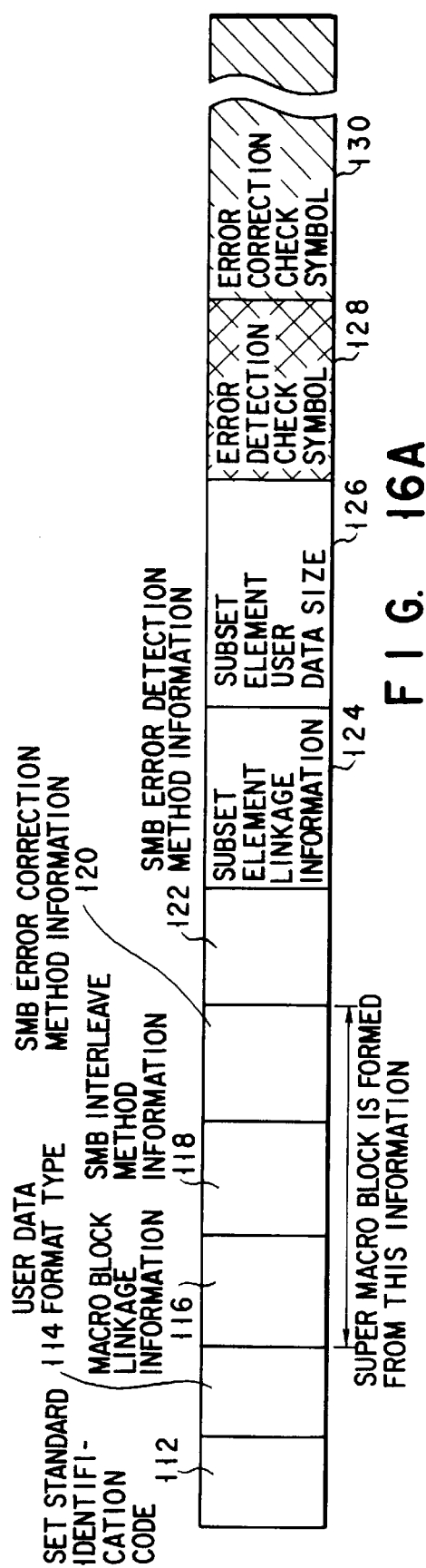
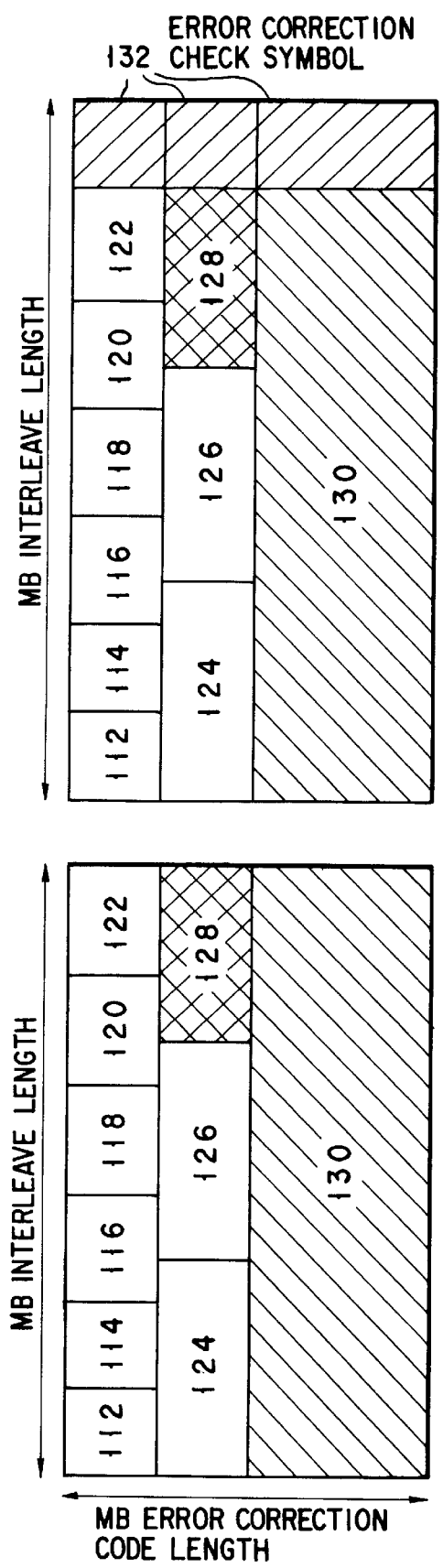
FIG. 16A
FIG. 16B
FIG. 16C

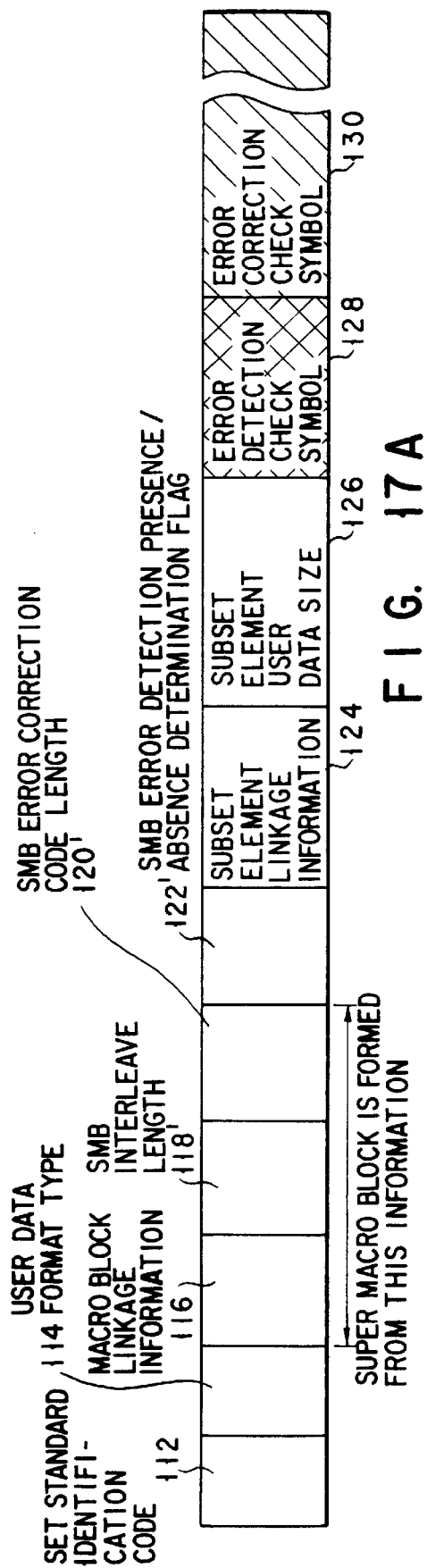
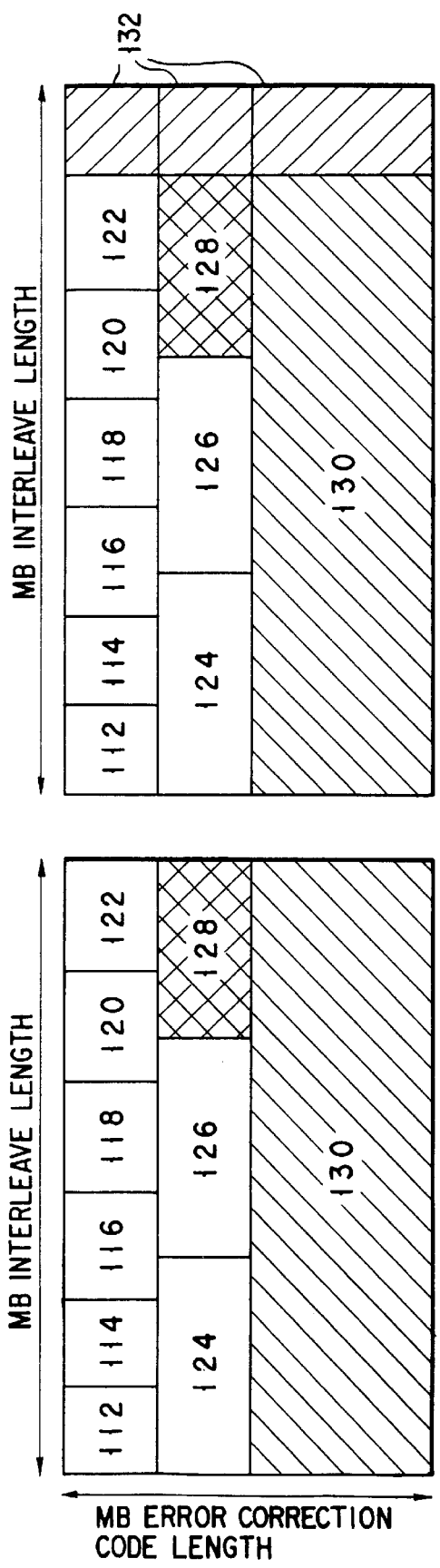
FIG. 17A
FIG. 17B
FIG. 17C

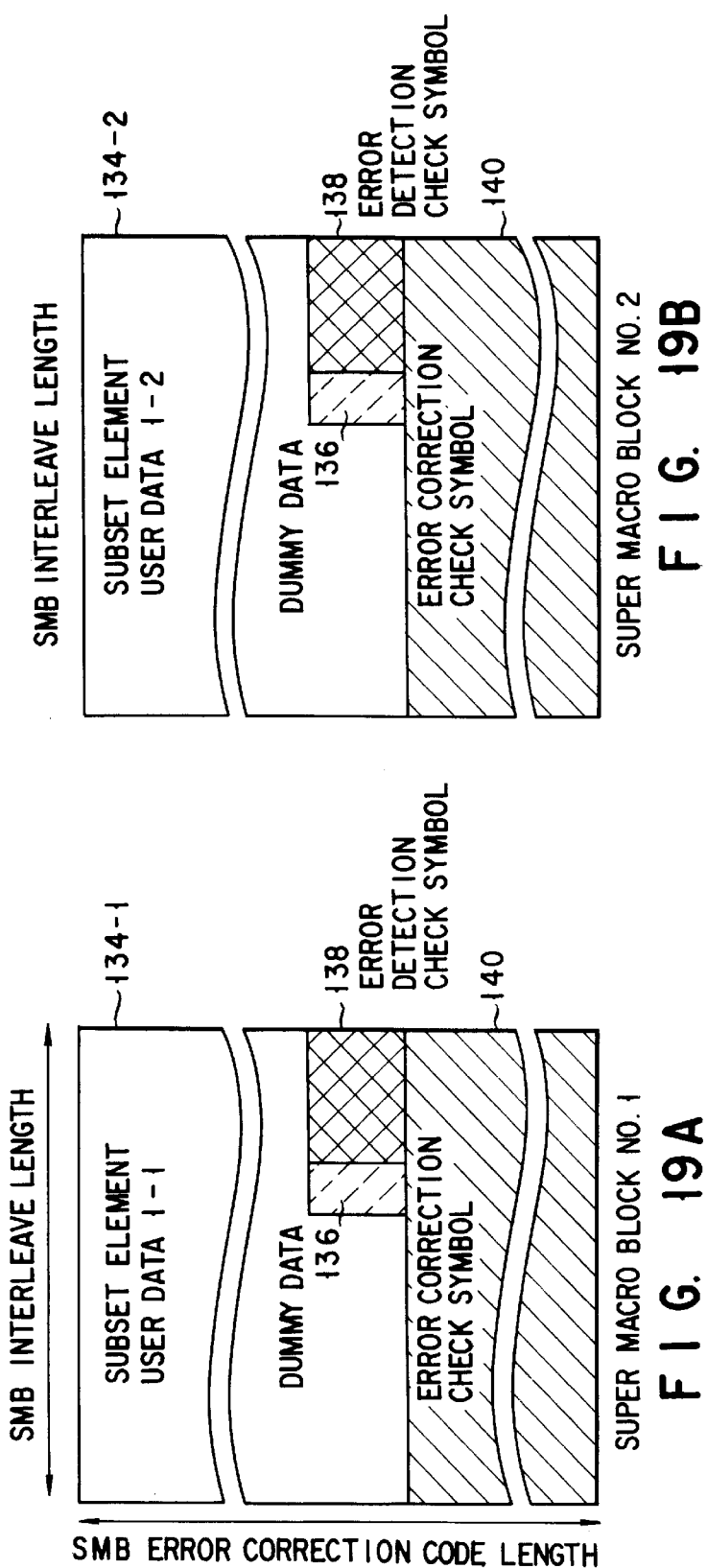
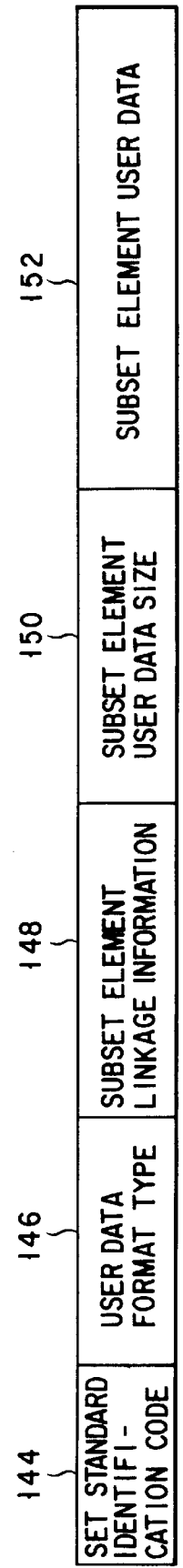
FIG. 19A
FIG. 19B
FIG. 19C

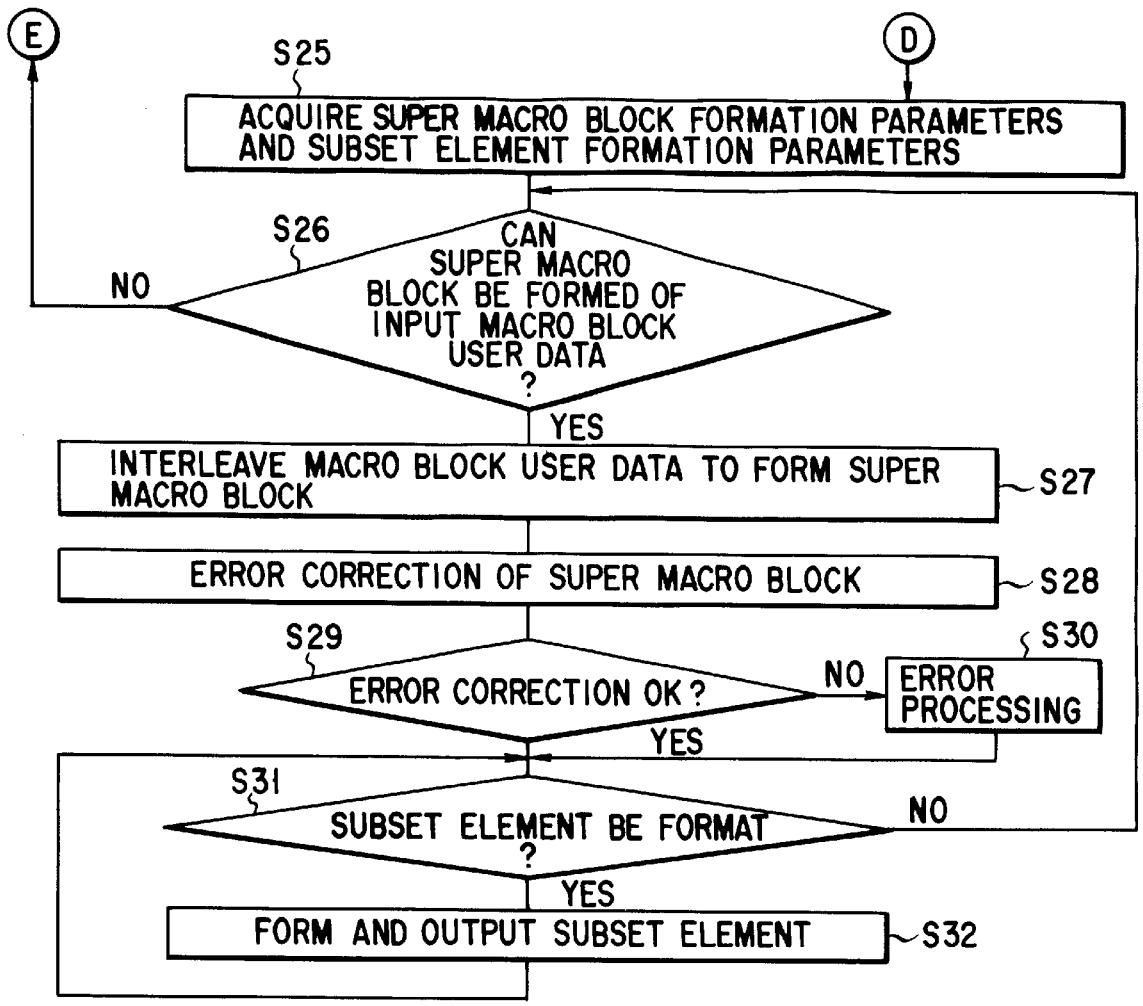
F I G. 21B

| PROTOCOL CONTROL INFORMATION (4-PCI) | |
|---|---|
| PERTINENT SUBSET ID NUMBER | ~154 |
| SUBSET GENERATION REFERENCE STANDARD ID NUMBER | ~156 |
| COUNT OF SUBSET ELEMENTS CONSTITUTING SUBSET | ~158 |
| SUBSET GENERATION STRUCTURE IDENTIFIER | ~160 |
| USER DATA (4-UD) | ~162 |

FIG. 22A

| PROTOCOL CONTROL INFORMATION | |
|---|---|
| SUBSET STANDARD TITLE IDENTIFIER (SET STANDARD IDENTIFICATION CODE) | ~164 |
| MMP FILE TYPE | ~166 |
| SUBSET ID NUMBER | ~168 |
| SUBSET LINKAGE INFORMATION | ~170 |
| PERTINENT FILE ID NUMBER | ~172 |
| PAGE NUMBER | ~174 |
| POSITION IN PAGE | ~176 |
| BOOK ID NUMBER | ~188 |
| DATA FORMAT TYPE (FILE STRUCTURE STANDARD RECOGNITIONCODE) | ~190 |
| SUBSET DATA CONTROL HEADER (DEFINED HEADER/USER REGISTRATION HEADER) | ~192 |
| USER DATA | ~194 |

FIG. 22B

| | |
|---|---|
| PROTOCOL CONTROL INFORMATION | |
| SUBSET STANDARD TITLE IDENTIFIER (SET STANDARD IDENTIFICATION CODE) | ~164 |
| MMP FILE TYPE | ~166 |
| SUBSET ID NUMBER | ~168 |
| SUBSET LINKAGE INFORMATION | ~170 |
| PERTINENT FILE ID NUMBER | ~172 |
| PAGE NUMBER | ~174 |
| POSITION IN PAGE | ~176 |
| FILE NAME | ~178 |
| FILE STRUCTURE TYPE (SINGLE FILE/FILE OF SUBSET LINKAGE STRUCTURE TYPE) | ~180 |
| DOS FILE TYPE (EXTENTION:MAY BE INCLUDED IN FILE MANE) | ~182 |
| DOS FILE ATTRIBUTE (READ ONLY FILE/HIDDEN FILE ETC.) | ~184 |
| BOOK NAME | ~186 |
| BOOK ID NUMBER | ~188 |
| DATA FORMAT TYPE (FILE STRUCTURE STANDARD RECOGNITIONCODE) | ~190 |
| SUBSET DATA CONTROL HEADER (DEFINED HEADER/USER REGISTRATION HEADER) | ~192 |
| USER DATA | ~194 |

F I G.   22C

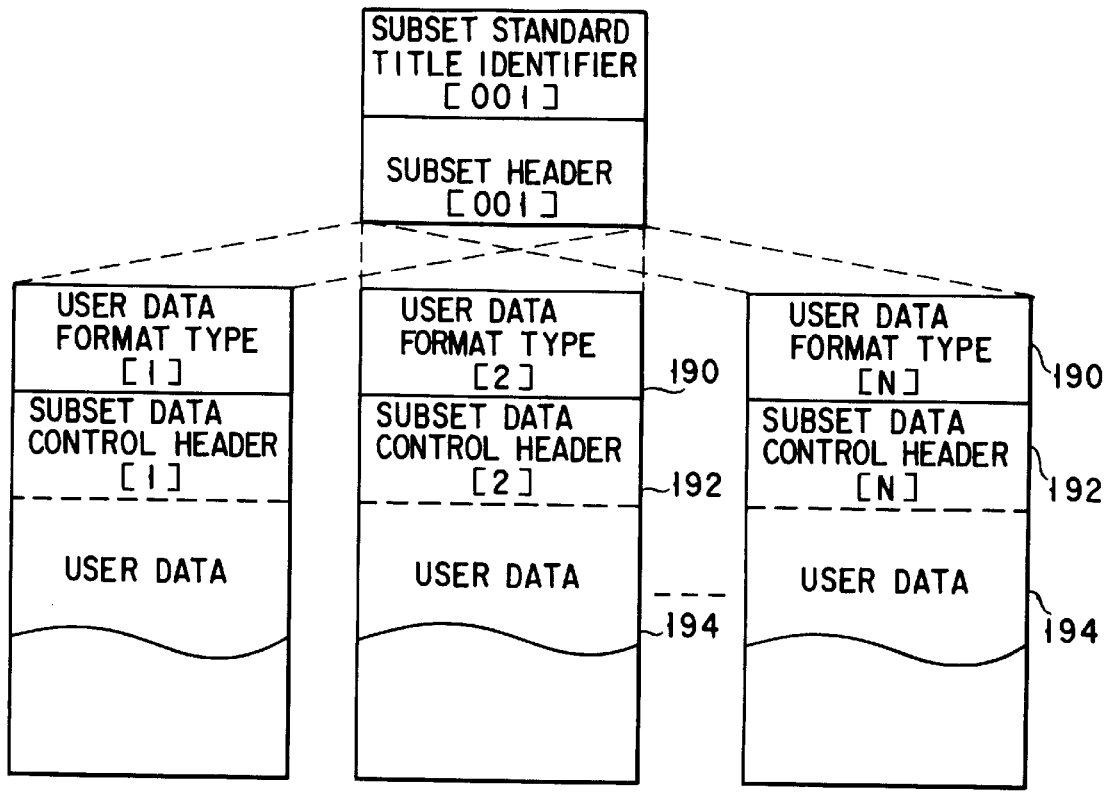
F I G. 23A
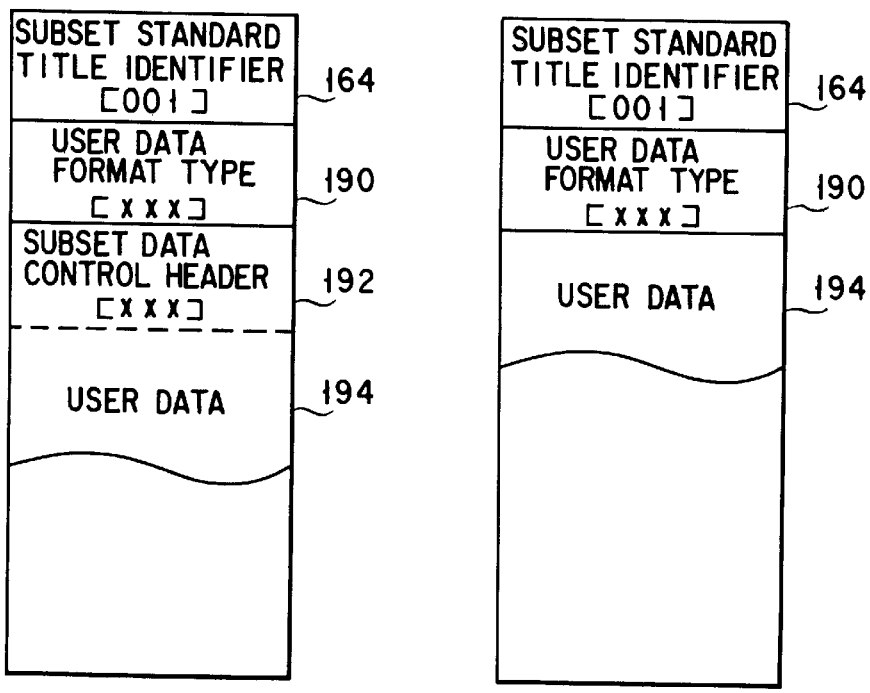
F I G. 23B    F I G. 23C

| |
|---|
| PROTOCOL CONTOROL INFORMATION |
| SUBSET STANDAR TITLE IDENTIFIER (SET STADARDIDENTIFICATION CODE) |
| MMP FILE |
| SUBSET ID NUMBER |
| SUBSET LINKAGE INFORMATION |
| PERTINENT FILE ID NUMBER |
| PAGE NUMBER |
| POSITION IN PAGE |
| FILE NAME |
| FILE STRUCTURE TYPE (SINGLE FILE/FILE OF SUBSET LINKAGE STRUCTURE TYPE) |
| DOS FILE TYPE (EXTENTION:MAY BE INCLUDED IN FILE ETC.) |
| DOA FILE ATTRIBUTE (READ ONLY FILE/HIDDEN FILE ETC.) |
| BOOK NAME |
| BOOK ID NUMBER |
| USER DATA FORMAT TYPE=INDEX FILE TYPE (UFT) (FILE STRUCTURE STANDARD RECOGNITION CODE) |
| SUBSET DATA CONTROL HEADER (SDCH) (DEFINED HEADER/USER REGISTRATIONHEADER) |
| USER DATA |
| PROTOCOL CONTOROL INFORMATION |
| SUBSET STANDAR TITLE IDENTIFIER (SET STADARDIDENTIFICATION CODE) |
| MMP FILE |
| SUBSET ID NUMBER |
| SUBSET LINKAGE INFORMATION |
| PERTINENT FILE ID NUMBER |
| PAGE NUMBER |
| POSITION IN PAGE |
| BOOK ID NUMBER |
| USER DATA FORMAT TYPE=INDEX FILE TYPE (UFT) (FILE STRUCTURE STANDARD RECOGNITION CODE) |
| SUBSET DATA CONTROL HEADER (SDCH) (DEFINED HEADER/USER REGISTRATIONHEADER) |
| USER DATA |

FIG. 24A1

| |
|---|
| PROTOCOL CONTOROL INFORMATION |
|    SUBSET STANDAR TITLE IDENTIFIER (SET STADARDIDENTIFICATION CODE) |
|    MMP FILE |
|    SUBSET ID NUMBER |
|    SUBSET LINKAGE INFORMATION |
|    PERTINENT FILE ID NUMBER |
|    PAGE NUMBER |
|    POSITION IN PAGE |
|    BOOK ID NUMBER |
| USER DATA FORMAT TYPE=INDEX FILE TYPE (UFT) (FILE STRUCTURE STANDARD RECOGNITION CODE) |
| SUBSET DATA CONTROL HEADER (SDCH) (DEFINED HEADER/USER REGISTRATIONHEADER) |
| USER DATA |

FIG. 24A2

| PROTOCOL CONTOROL INFORMATION |
|---|
| SUBSET STANDAR TITLE IDENTIFIER (SET STADARDIDENTIFICATION CODE) |
| MMP FILE |
| SUBSET ID NUMBER |
| SUBSET LINKAGE INFORMATION |
| PERTINENTFILE ID NUMBER |
| PAGE NUMBER |
| POSITION IN PAGE |
| FILE NAME |
| FILE STRUCTURE TYPE (SINGLE FILE/FILE OF SUBSET LINKAGE STRUCTURE TYPE) |
| BOOK NAME |
| BOOK ID NUMBER |
| USER DATA FORMAT TYPE=INDEX FILE TYPE (UFT) (FILE STRUCTURE STANDARD RECOGNITION CODE) |

FIG. 24B1

```
USER DATA
┌─────────────────────────────────────────────┐
│ FILE NAME                                   │
│ DOS FILE TYPE (EXTENTION)                   │
│ DOS FOLE ATTRIBUTE (READ ONLY FILE ETC.)    │
│ FILE FORMATION TIME                         │──198
│ FILE FORMATION DATE                         │
│ FIRST PAGE NUMBER/POSITION IN PAGE OF       │
│ CORRESPONDING FILE                          │
│ FILE SIZE                                   │
│ FAT ID                                      │
├─────────────────────────────────────────────┤
│ FILE NAME                                   │
│ DOS FILE TYPE (EXTENTION)                   │
│ DOS FOLE ATTRIBUTE (READ ONLY FILE ETC.)    │
│ FILE FORMATION TIME                         │──198
│ FILE FORMATION DATE                         │
│ FIRST PAGE NUMBER/POSITION IN PAGE OF       │
│ CORRESPONDING FILE                          │
│ FILE SIZE                                   │
│ FAT ID                                      │
├─────────────────────────────────────────────┤
│ FILE NAME                                   │
│ DOS FILE TYPE (EXTENTION)                   │
│ DOS FOLE ATTRIBUTE (READ ONLY FILE ETC.)    │
│ FILE FORMATION TIME                         │──198
│ FILE FORMATION DATE                         │
│ FIRST PAGE NUMBER/POSITION IN PAGE OF       │
│ CORRESPONDING FILE                          │
│ FILE SIZE                                   │
│ FAT ID                                      │
└─────────────────────────────────────────────┘
```

FIG. 24B2

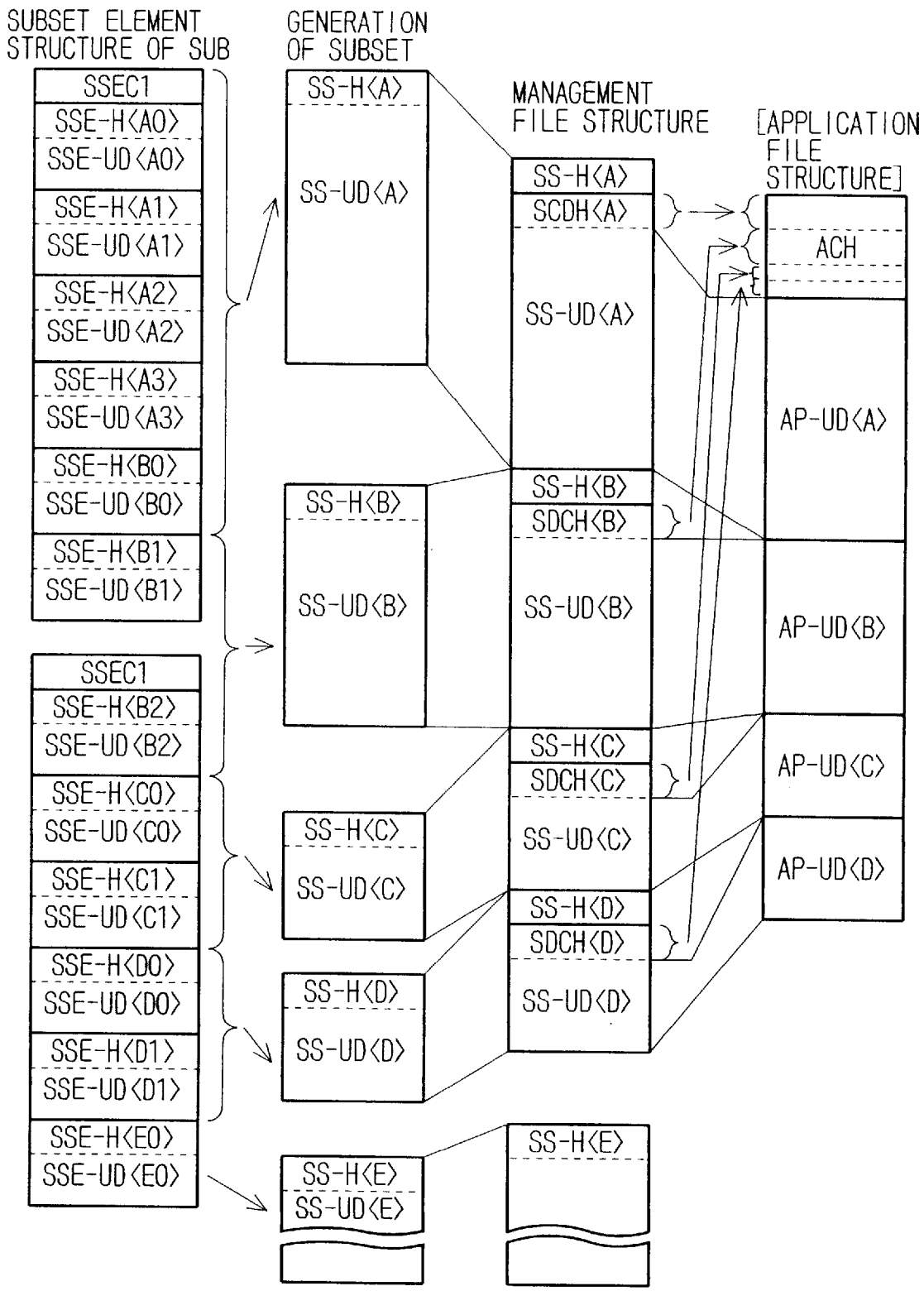
F I G. 25

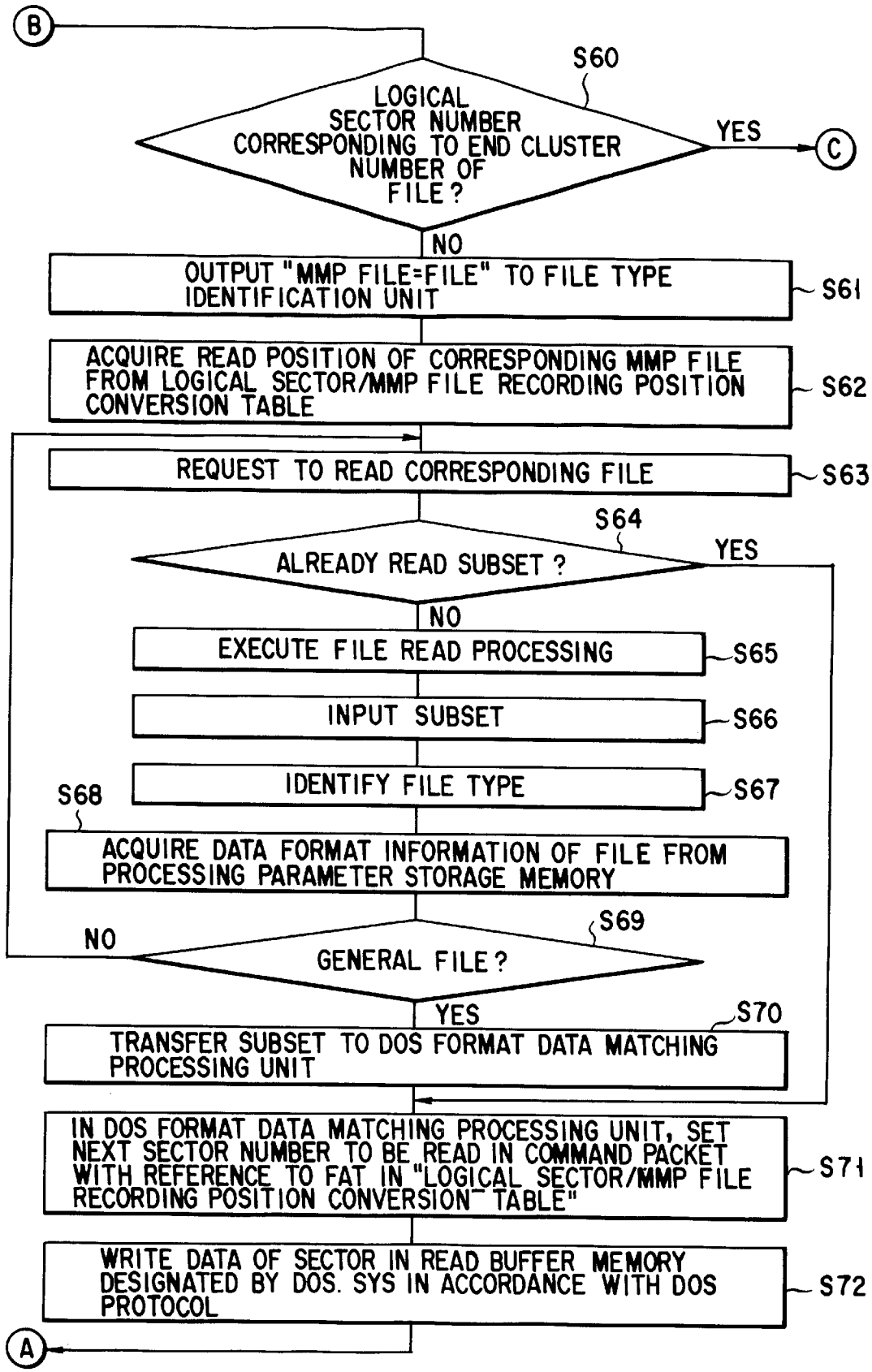
F I G. 28A

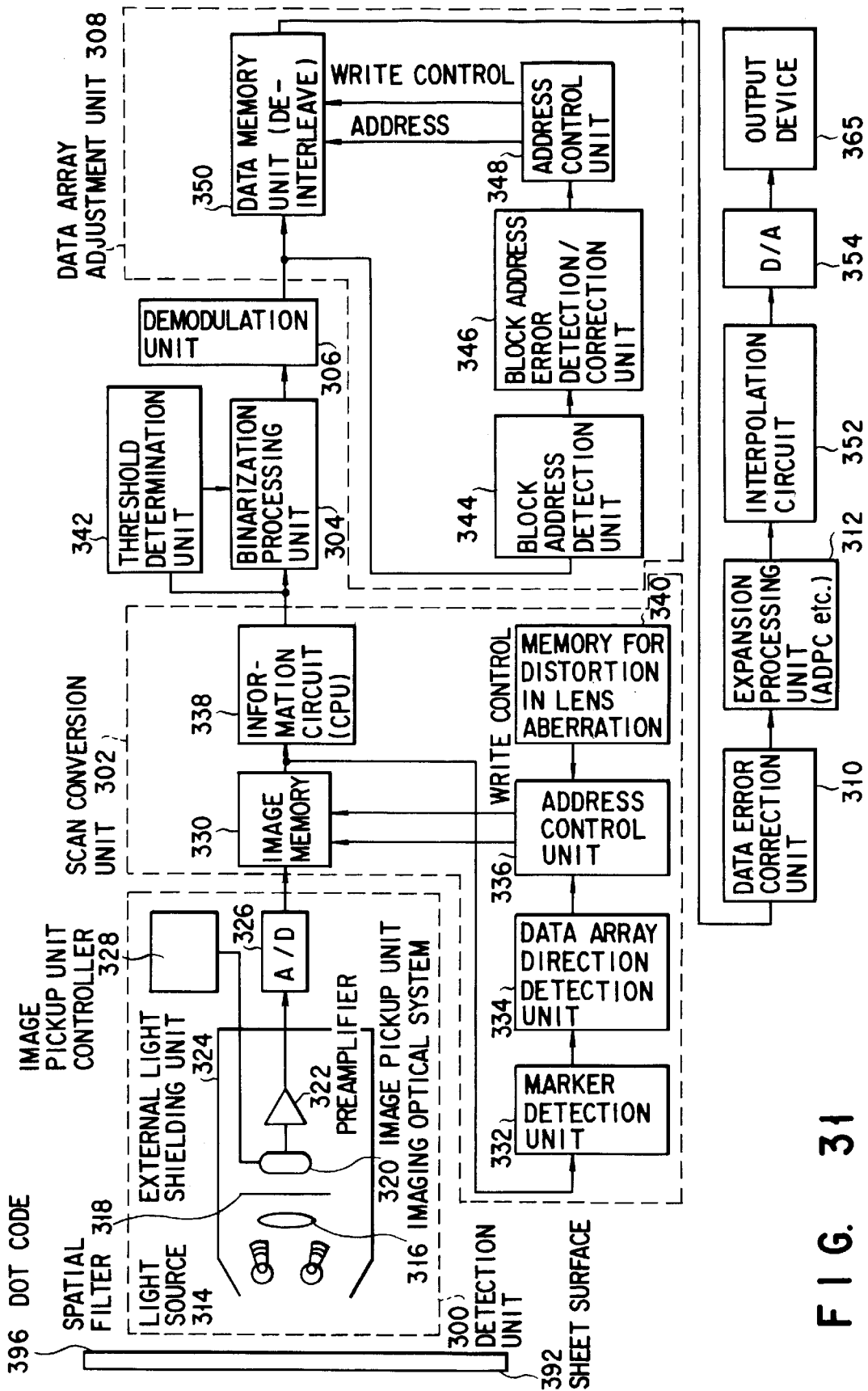
F I G. 31

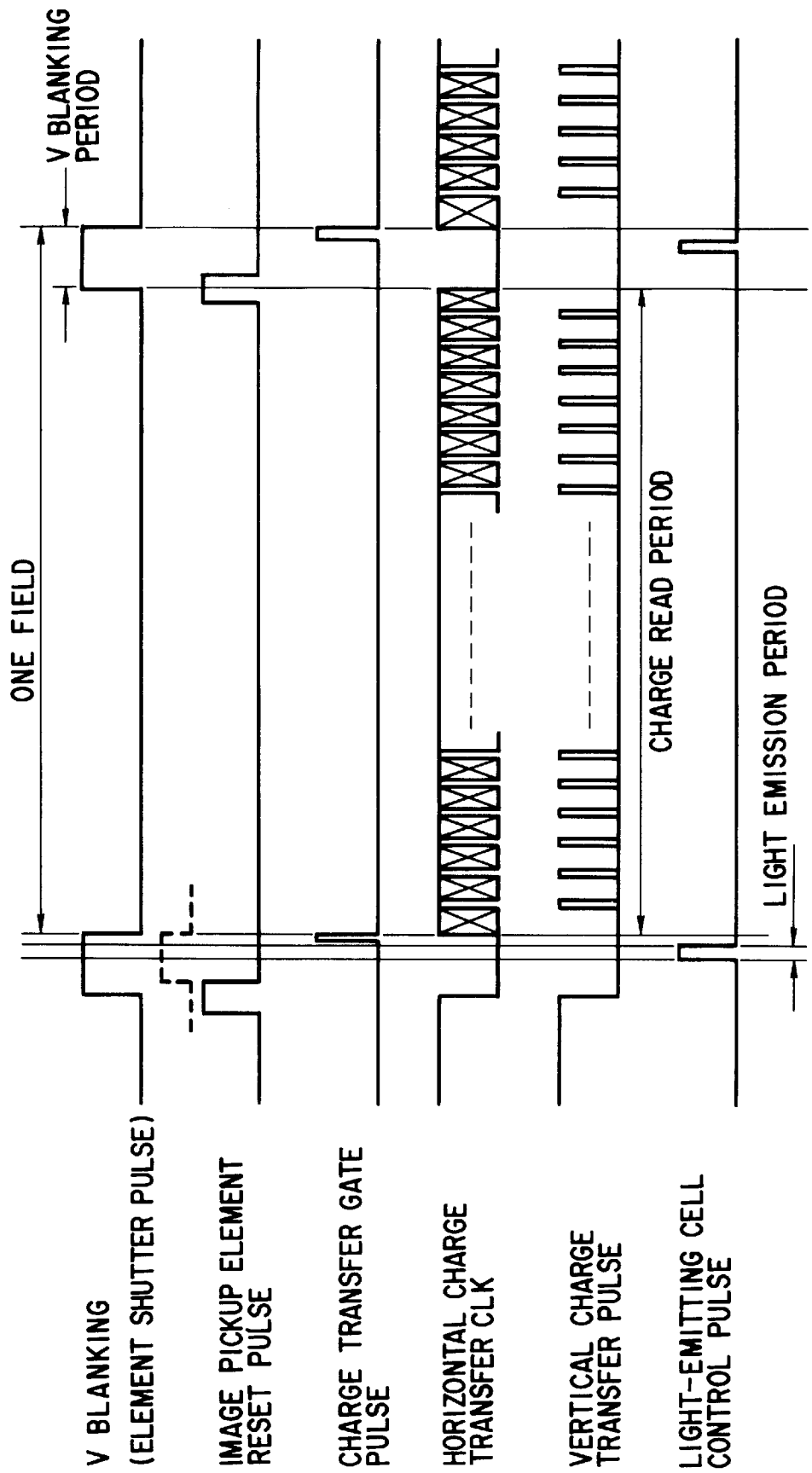
F I G. 32

OPTICAL REPRODUCTION SYSTEM HAVING FUNCTION OF RATIONALLY CHANGING ERROR DATA CHUNK AND REPRODUCING MULTIMEDIA INFORMATION AS CODE DATA

BACKGROUND OF THE INVENTION

1. Field of the Invention

The present invention relates to an information reproduction system for converting so-called multimedia information including, e.g., audio information such as speech and music information, video information obtained by a camera, a video equipment, and the like, and digital code data obtained from a personal computer, a wordprocessor, and the like to an optically readable code pattern, and optically reading the code pattern recorded on an information recording medium such as paper to reproduce the original multimedia information and, more particularly, to an information reproduction system capable of rationally correcting/changing an error partial data chunk present in reproduction information.

2. Description of the Related Art

As media for recording speech information, music information, and the like, a magnetic tape, an optical disk, and the like are conventionally known. However, even if copies of these media are produced in large quantities, the unit cost of production is relatively high, and storage of such copies requires a large space.

In addition, when a medium on which speech information is recorded needs to be provided to a person in a remote place, it takes a great deal of labor and time to mail or directly take the medium to the person.

So-called multimedia information other than audio information, including video information obtained by a camera or video equipment, and digital code data obtained from a personal computer or wordprocessor have the same problems.

The assignee of the present invention has assigned an application filed as In U.S. Ser. No. 08/407,018, a system is disclosed which can transmit multimedia information including at least one of audio information, video information, and digital code data through a facsimile apparatus and records the information in the form of dot codes as image information, i.e., coded information allowing production of copies in large quantities at a low cost, on an information recording medium such as paper, and a system for reproducing this information.

As shown in FIG. 31, an information reproduction system disclosed in U.S. Ser. No. 08/407,018 uses a technique in which a pen type reproduction device for optically reading and reproducing a dot code on an information recording medium is used to manually scan the recording medium along the recorded dot codes, thereby reading and reproducing information.

More specifically, this pen type reproduction device comprises a detection unit 300 for reading a dot code 396 on a sheet surface 392 on which the dot code (in this case, only audio information) 396 is printed, a scan conversion unit 302 for recognizing image data supplied from the detection unit 300 as a dot code and performing normalization, a binarization processing unit 304 for binarizing multi-valued data, a demodulation unit 306, a data array adjustment unit 308 for adjusting a data array, a data error correction unit 310 for correcting a read error or data error in reproduction, and an expansion processing unit 312 provided in correspondence with data compression processing by an ADPCM circuit 368.

In the detection unit 300, the dot code 396 on the sheet surface 392 is illuminated by a light source 314. The reflected light beam is detected as an image signal by an image pickup unit 320 such as a charge-coupled device (CCD) or a charge-modulated device (CMD) for converting optical information to an electrical signal through an imaging optical system 316 such as a lens and a spatial filter 318 for removing moir and the like, amplified by a preamplifier 322, and output.

The light source 314, the imaging optical system 316, the spatial filter 318, the image pickup unit 320, and the preamplifier 322 are constituted in an external light shielding unit 324 for preventing disturbance by external light.

The image signal amplified by the preamplifier 322 is converted to digital information by an A/D converter 326 and the obtained digital information is supplied to the scan conversion unit 302 at the subsequent stage.

The image pickup unit 320 is controlled by an image pickup unit controller 328.

When an interline transfer type CCD is used as the image pickup unit 320, the image pickup unit controller 328 outputs, as control signals for the image pickup unit 320, a vertical (V) blanking signal for vertical synchronization, an image pickup element reset pulse signal for resetting information charges, a charge transfer gate pulse signal for sending charges accumulated in a two-dimensionally arranged charge transfer accumulation unit to a plurality of vertical shift registers, a horizontal charge transfer clock (CLK) signal serving as a transfer clock signal for a horizontal shift register for transferring charges in the horizontal direction and externally outputting the charges, a vertical charge transfer pulse signal for transferring the charges from the plurality of vertical shift registers in the vertical direction and sending the charges to the horizontal shift register, and the like.

FIG. 32 is a timing chart showing the timings of these signals.

The image pickup unit controller 328 supplies a light-emitting cell control pulse for adjusting the timing of light emission of the light source 314 to the light source in accordance with the timings of these signals.

Basically, FIG. 32 shows a timing chart corresponding to one field.

Image data is read out between a given V blanking signal and the next V blanking signal in one field.

The light source 314 performs pulsed light emission instead of continuous light emission so that subsequent pulsed light emission is synchronized in units of fields.

In this case, to prevent clock noise of pulsed light emission from mixing in a signal output, the timing is controlled such that exposure is performed during the V blanking period, i.e., while no image charge is output.

More specifically, the light-emitting cell control pulse is a very short digital clock pulse generated upon instantaneous supply of power. For this reason, noise must be prevented from mixing in an analog image signal. For this purpose, the light source is turned on during the V blanking period.

With this arrangement, the signal-to-noise ratio (S/N ratio) can be increased.

Pulsed light emission has the same sense as shortening of the light emission time. Therefore, the influence of blur caused by a shift in the manual operation and a shift in movement can be effectively eliminated. With this arrangement, high-speed scanning is enabled.

Assume that the reproduction device is inclined, and a disturbance by, e.g., external light is caused for some reason, despite the external light shielding unit 324. To minimize a degradation in S/N ratio, a reset pulse is output during the V blanking period immediately before turning on the light source 314, thereby resetting the image signal. Immediately after this operation, light is emitted, and a read operation is performed.

Referring back to FIG. 31, the scan conversion unit 302 will be described.

The scan conversion unit 302 is a unit for recognizing image data supplied from the detection unit 300 as a dot code, and normalizing it.

As a technique for this operation, the image data from the detection unit 300 is stored in an image memory 330, read out therefrom temporarily, and sent to a marker detection unit 332. The marker detection unit 332 detects a marker of each block.

A data array direction detection unit 334 detects the rotation or inclination and the array direction of the data by using the markers.

An address control unit 336 reads out image data from the image memory 330 and supplies the data to an interpolation circuit 338 so as to correct it in accordance with the detection result.

At this time, lens aberration information is read out from a memory 340 for correcting the distortion in lens aberration of the imaging optical system 316 of the detection unit 300, thereby performing lens correction as well.

The interpolation circuit 338 performs interpolation processing of the image data to convert it to an original pattern, i.e., a dot code.

An output from the interpolation circuit 338 is supplied to the binarization processing unit 304.

The dot code 396 is basically a black and white pattern, i.e., binary information. Therefore, the data is binarized by the binarization processing unit 304.

At this time, binarization is adaptively performed while threshold determination is performed by a threshold determination circuit 342 in consideration of the influences of disturbance, signal amplitude, and the like.

Corresponding to the modulation performed during recording of the dot code 396, the demodulation unit 306 demodulates the data, and inputs the resultant data to the data array adjustment unit 308.

In the data array adjustment unit 308, the block addresses of the above two-dimensional blocks are detected by a block address detection unit 344, first, and error detection and correction of the block addresses are then performed by a correction unit 346. Thereafter, an address control unit 348 stores the resultant data in a data memory unit 350 in units of blocks.

By storing the data in units of block addresses in this manner, the data can be efficiently stored even if an intermediate data portion is omitted, or data starts from a halfway position.

After this operation, error correction of the data read out from the data memory unit 350 is performed by the data error correction unit 310.

Expansion processing of an output from the error correction unit 308 is performed by the expansion processing unit 312, which corresponds to data compression in recording the dot code 396. A data interpolation circuit 352 interpolates data in the reproduced data, for which error correction cannot be performed.

An output from the data interpolation circuit 352 is converted to an analog signal by a (digital/analog) D/A converter 354 and output to a loudspeaker, a headphone, an earphone, or an output device 365 equivalent thereto.

However, studies on the dot code pattern used in the above-mentioned information reproduction system are in progress now for the purpose of realizing a structure with an increased recording density. For the information reproduction apparatus and information recording medium disclosed in U.S. Ser. No. 08/407,018, flexibility to changes in the future is not sufficiently taken into consideration.

Therefore, interpolation of an error partial data block for which error correction by the data interpolation circuit 352 has failed, i.e., appropriate data correction in the information reproduction system is not specifically disclosed in this prior art.

SUMMARY OF THE INVENTION

The present invention has been made in consideration of the above situation, and has as its object to provide an information reproduction system which can replace an error partial data block or a destroyed file header in reproduced information with appropriate data or a default value, thereby rationally performing error change processing.

One aspect of the present invention is directed to an information reproduction system including read means for optically reading a code from a recording medium having a portion where multimedia information including at least one of audio information, video information and digital code data is recorded as an optically readable code. The information reproduction system also includes restoration means for demodulating the code read from the read means and for outputting demodulated data, reproduction means for performing processing associated with error correction of the demodulated data output from the restoration means, and output means for outputting the data output from the reproduction means as the recognizable original multimedia information. The data output from the reproduction means includes, as header information, attribute information representing a type of data as an input target. The output means outputs the multimedia information of the corresponding data in accordance with the attribute information. The system also includes attribute information detection means for detecting, from the attribute information, an omitted portion or a portion for which error correction by said reproduction means has failed, and default value setting means for replacing the attribute information of the data as the output target with a default value when the attribute information is not detected by the attribute information detection means.

Another aspect of the present invention is directed to an information reproduction system including read means for optically reading a code from a recording medium wherein the recording medium has at least a portion wherein multimedia information including at least one of audio information, video information and digital code data is recorded as an optically readable code. The system also includes restoration means for demodulating the code read by the read means and for outputting demodulated data, reproduction means for performing error correction processing in units of one partial data chunk which includes an aggregate of a predetermined amount of demodulated data output from the restoration means, and error partial data chunk detection means for detecting an omitted portion of the partial data chunk or a portion of the partial data chunk for which error correction by the reproduction means has failed as an error partial data chunk in units of one partial data chunk. The system also includes output means for acquiring a predetermined number of partial data chunks output from the reproduction means to form final output data which is output as recognizable original multimedia information. The output means, before outputting the final output data as recognizable original multimedia information, executes predetermined processing with respect to a portion of the final output data to be output, which corresponds to the error partial data chunk, so as to change an output form of the data of the portion of the final output data corresponding to the error partial data chunk.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 2 is a flow chart for explaining the operation of the first embodiment;

FIGS. 3A to 3C are views showing examples of error change processing in the first embodiment;

FIG. 10 is a view showing the hierarchy of information transfer protocols in a multimedia paper system;

FIG. 12 is a view showing the upper structure of the hierarchical structure on the reproduction side;

FIGS. 13A to 13D are views showing some structures of block data transferred from layer 2;

FIG. 13E is a view showing four states of a block address error status flag;

FIG. 14 is a block diagram of layer 3;

FIG. 16A is a view showing the structure of a macro block header;

FIG. 16B is a view showing the actual two-dimensional structure of the macro block header shown in FIG. 16A;

FIG. 16C is a view showing a modification of the structure shown in FIG. 16B;

FIG. 17A is a view showing the structure of the macro block header in more detail;

FIG. 17B is a view showing the actual two-dimensional structure of the macro block header shown in FIG. 17A;

FIG. 17C is a view showing a modification of the structure shown in FIG. 17B;

FIGS. 19A and 19B are views showing another structure of the super macro block;

FIG. 19C is a view showing a structure of a subset element;

FIGS. 21A and 21B are flow charts for explaining the operation of layer 3;

FIG. 22A is a view showing a structure of subset element data;

FIG. 22B is a view showing a structure of a start subset in a file;

FIG. 22C is a view showing a structure of a general subset in a file;

FIGS. 23A to 23C are views showing some structures of the subset format;

FIGS. 24A1 and 24A2 are views showing a subset structure in a general file;

FIGS. 24B1 and 24B2 are views showing a subset structure in an index file;

FIG. 25 is a view showing the relationship between subset elements, subsets, and a file;

FIGS. 28A and 28B are flow charts for explaining the remaining operation of the arrangement shown in FIG. 26;

FIG. 31 is a block diagram of a pen type information reproduction system; and

FIG. 32 is a timing chart of light emission in the pen type information reproduction system.

DETAILED DESCRIPTION OF THE PREFERRED EMBODIMENTS

Figure 1:
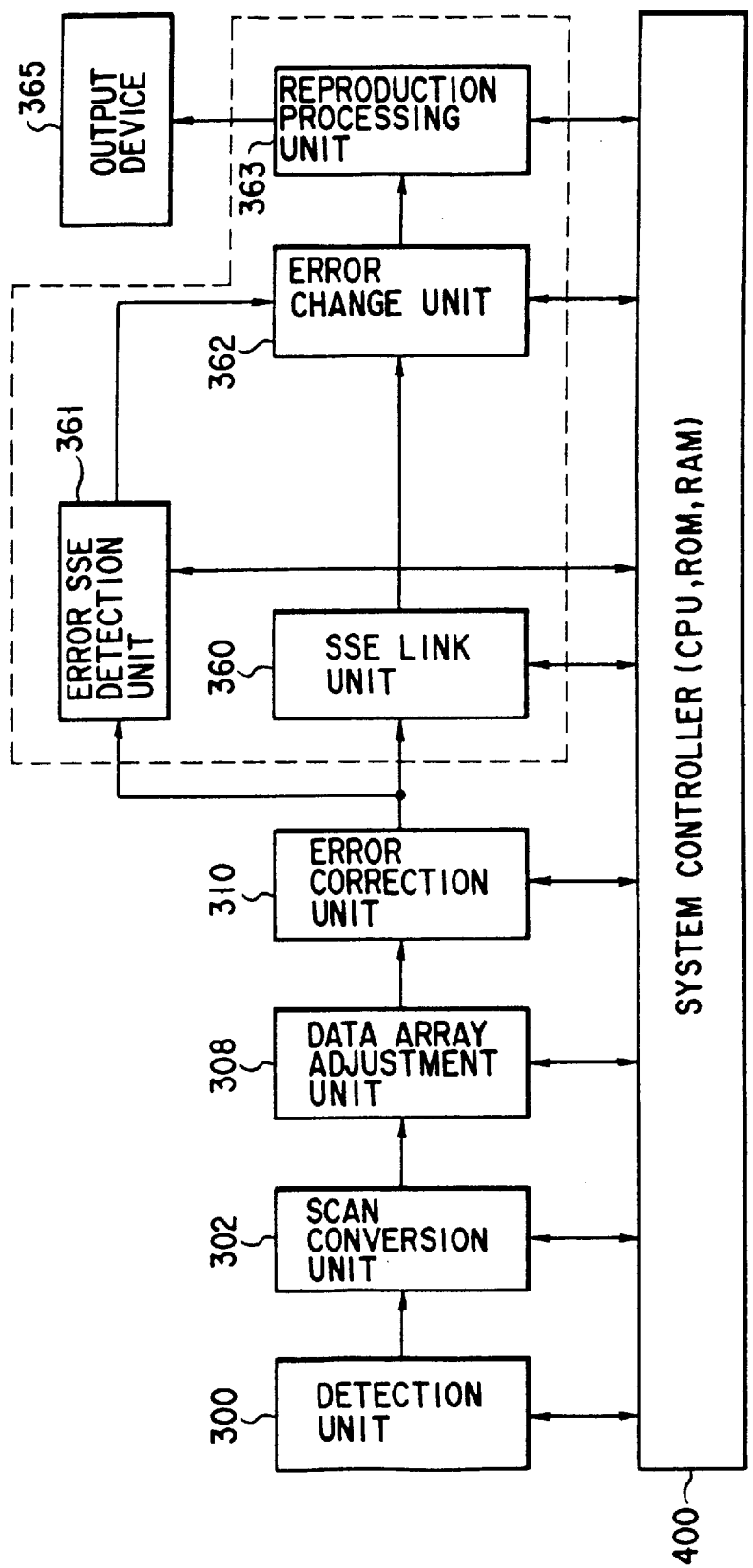
FIG. 1 is a block diagram showing the arrangement of the first embodiment of the present invention.

Reference will now be made in detail to the presently preferred embodiments of the invention as illustrated in the accompanying drawings, in which like reference characters designate like or corresponding parts throughout the several drawings.

A summary of the present invention will be given first. According to each embodiment of the present invention, in a system for printing and recording multimedia information on an information recording medium as an optically readable code pattern, reading the code pattern, and restoring the original multimedia information, the code pattern recorded on the information recording medium includes processing information necessary for edit processing of data in accordance with the restoration processing for restoring the multimedia information. The restoration processing has a hierarchical structure consisting of layers 1 to 5. Layer 5 has a file management function. Layer 4 has a function of acquiring subset elements to generate a subset, and converting it into a data transfer unit (sector) to be processed in layer 5. Layers 1 to 3 have a function of reading the code pattern from the information recording medium, performing predetermined restoration processing, and outputting the subset elements.

Various status signals for error correction to be executed in layer 3 are notified to generate a subset in layer 4. According to the present invention, this processing is used to detect an error correction disabled portion or an omitted portion, thereby changing the error portion to appropriate data.

Prior to a description of embodiments of the present invention, presuppositions of the present invention necessary for realizing the information reproduction system according to the above summary will be described.

For easy understanding of the present invention, the code pattern of a dot code as described in detail in U.S. Ser. No. 08/407,018 will be described below.

Figure 9A:
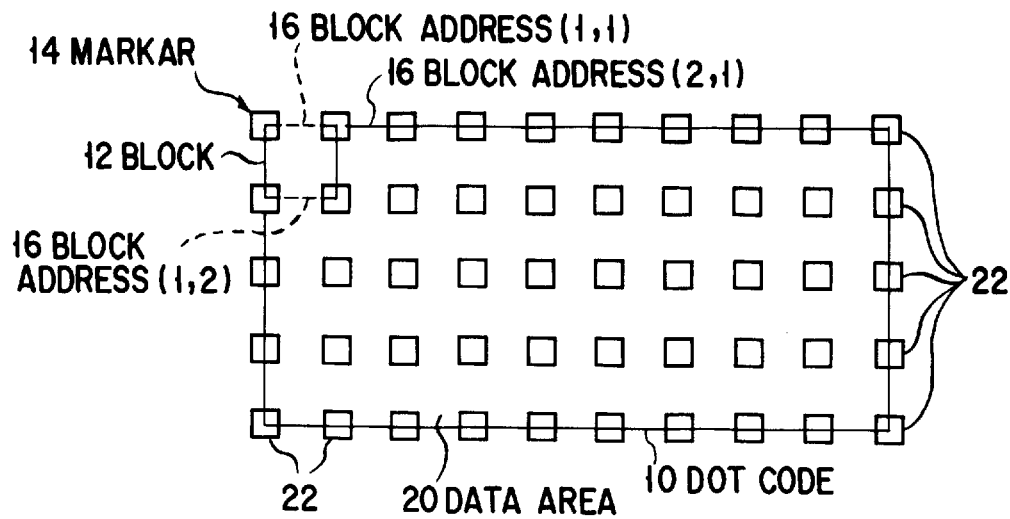
FIGS. 9A and 9B are views showing the format of a dot code.
Figure 9B:
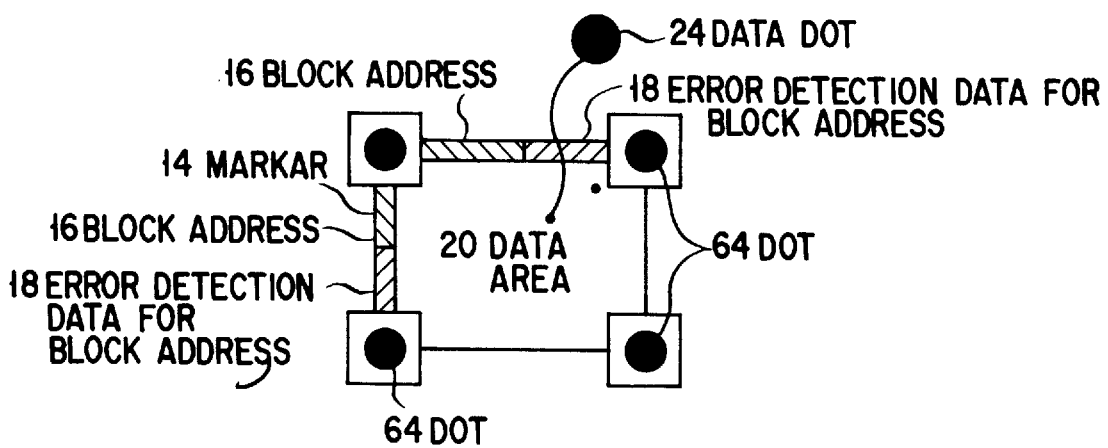

As shown in FIGS. 9A and 9B, a dot code 10 has a format wherein a plurality of blocks 12 each consisting of a plurality of dots arranged in accordance with the content of data are arranged. That is, an aggregate of blocks 12 each as unit data in a predetermined amount are arranged. Each block 12 comprises a marker 14, a block address 16, address error detection data 18, and a data area 20 having actual data.

The blocks 12 constituting the dot code 10 are two-dimensionally arranged in a matrix form. The block address 16 is added to each block 12. The block address 16 has addresses corresponding to X- and Y-addresses. For example, the block at the upper left corner of FIG. 9A is represented by (X-address,Y-address)=(1,1). An adjacent block to the right is represented by block address (2,1). In this manner, the X-address is incremented toward the right side while the Y-address is incremented toward the lower side so that the block addresses 16 are added to all the blocks 12.

The lowermost and rightmost markers are dummy markers 22. More specifically, the block 12 corresponding to one marker 14 has data in a lower right area surrounded by four markers 14, inclusive of the above one marker 14. The lowermost and rightmost markers are auxiliary markers, i.e., dummy markers 22 arranged to define blocks at the second row from the underside and at the second column from the right.

The content of the block 12 will be described below. As shown in FIG. 9B, the block address 16 and the error detection code 18 for the block address are added between the marker 14 and the lower marker of the block 12. Similarly, the block address 16 and the error detection code 18 for the block address are added between the marker 14 and the right marker. In this manner, the block addresses 16 are arranged on the left and upper sides of the data area 20, and the marker 14 is arranged at the upper left corner. The block addresses 16 are recorded at two portions per block although the block address 16 may be recorded at one portion. However, with the addresses recorded at two portions, even if noise is generated in one of the block addresses to cause an error, the other address can be properly detected. Therefore, the block addresses are preferably recorded at two portions.

When the above two-dimensional block division technique is employed, four adjacent markers are detected on the information reproduction apparatus side, and the area between the markers is equally divided in correspondence with the number of dots, thereby performing normalization. This technique is advantageous in enlargement, reduction, deformation, and the like, and also advantageous in shake.

A data dot 24 in the data area 20 has a size of, e.g., several tens $\mu$m. In accordance with an application or application purpose, the dot size can be reduced to several $\mu$m, though, generally, 40, 20, or 80 $\mu$m is used. The data area 20 has a size of, e.g., 64×64 dots. This size can be freely increased or reduced to a range in which an error caused by the above equal division technique can be absorbed. The marker 14 has a function of a position indicator having a dot size different from that of modulated data. More specifically, the marker 14 is a circular black marker having a size corresponding to, e.g., seven or more data dots 24, or 7×7 data dots 24. The block address 16 and the error detection data 18 are constituted by dots similar to the data dots 24.

The hierarchy of information transfer protocols in a multimedia paper (MMP) system which records/reproduces a dot code pattern as an optically readable code pattern of multimedia information on/from an information recording medium such as paper, as described in detail in PCT/JP95/01050 assigned to the assignee of the present invention, will be described below. Note that a layer N (N=1 to 5) protocol is an operation protocol for realizing a function necessary for layer N to respond to a request from an adjacent layer.

As shown in FIG. 10, this hierarchy has logical hierarchical structures of a plurality of layers, i.e., layers 1 to 5, both on the recording and reproduction sides.

On the recording side, so-called multimedia information including audio information such as speech and music information, video information obtained by a camera, a video equipment, and the like, and digital code data obtained from a personal computer, a wordprocessor, and the like, which multimedia information is generated in an application process X, i.e., an application program on a computer, is transferred to an MMP recording device 26 as an information recording device through an application layer (layer 5) and a presentation layer (layer 4) similarly constituted on the computer. In the MMP recording device, the received data is converted to an optically readable dot code pattern through a data link layer (layer 3), a block data layer (layer 2), and a physical layer (layer 1) and printed and recorded on an information recording (transfer) medium 30 such as paper.

The information recording (transfer) medium 30 is transferred to the reproduction side. The code pattern recorded on the medium 30 can also be transferred to the reproduction side through a facsimile apparatus and printed and recorded on an information recording medium 30 such as paper on the reproduction side.

In the MMP reproduction device, the code pattern recorded on the information recording medium 30 is picked up, edit processing of the data is performed in accordance with restoration processing through layer 1 to layer 3 or layer 5, i.e., in an order opposite to that in recording, and the resultant data is transferred to the reproduction side. On the reproduction side, the reproduced multimedia information is transferred to an application process Y through the processing functions of layers 4 and 5, as needed, in an order opposite to that in recording.

Each layer on the reproduction side will be described below in detail. The layers on the recording side are arranged in an order opposite to that on the reproduction side, and a detailed description thereof will be omitted.

Figure 11:
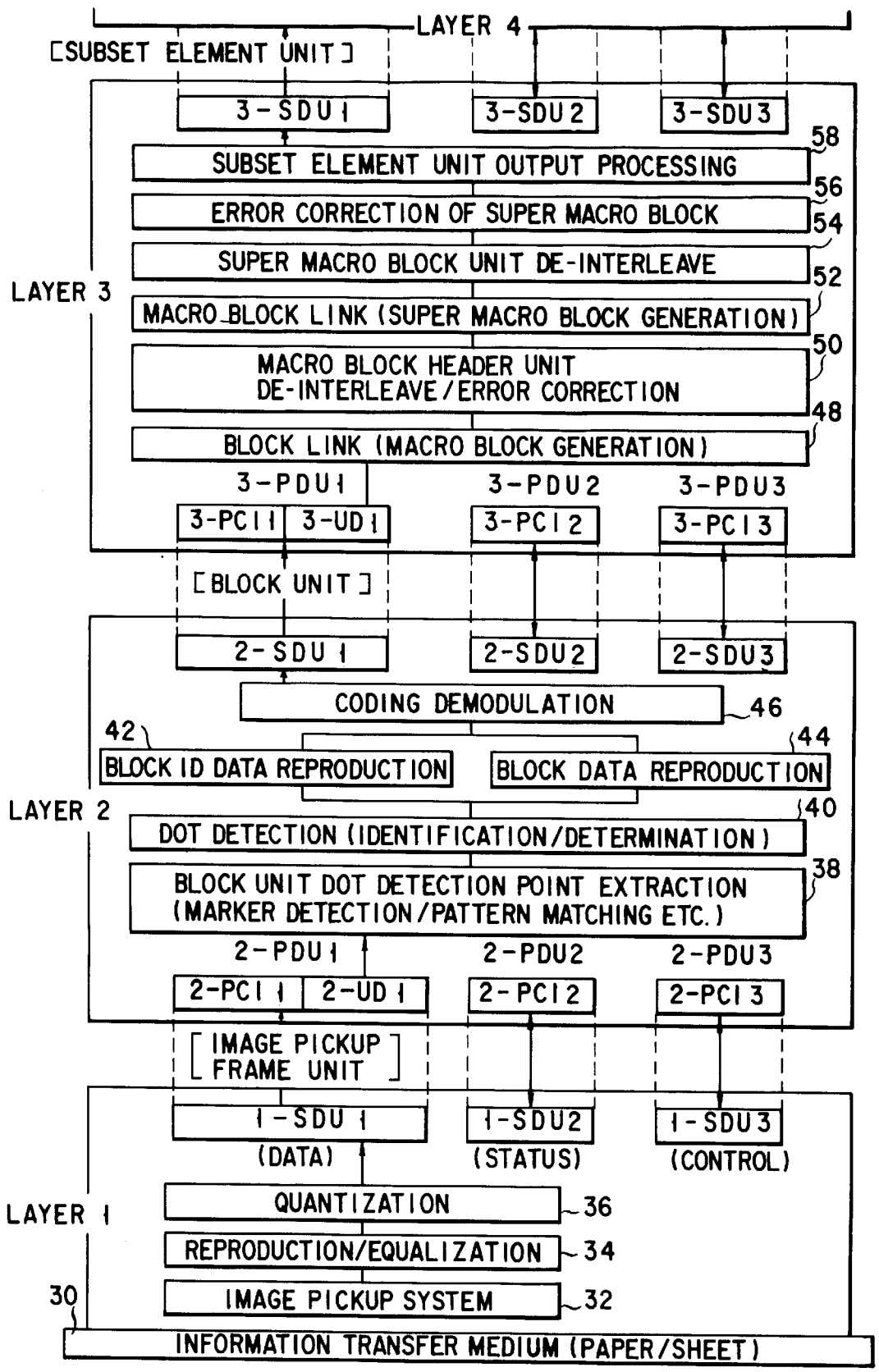
FIG. 11 is a view showing the lower structure of the hierarchical structure on the reproduction side.

FIGS. 11 and 12 are views showing processing through multistages of the hierarchical structure of the plurality of layers on the reproduction side. Referring to FIGS. 11 and 12, N-SDU$_n$ represents an Nth layer service data unit, No. n; N-PDU$_n$, an Nth layer protocol data unit, No. n; N-PCI$_n$, an Nth layer protocol control information No. n (corresponding to various processing information in the present invention); N-UD$_n$, an Nth layer user data, No. n; ADU, an application data unit; and ACH, an application control header (n=1 represents data; 2, status information; and 3, control information).

Layer 1 (physical layer) has as its basic function to guarantee proper transfer of quantized data of a dot image. Layer 1 defines electrical/physical conditions and conditions for quantization (i.e., the dot pattern simple transfer rule, the equalization method, the quantization method, and the like). Layer functions required to layer 1, i.e., services to be provided include provision of a plurality of transfer media (types of paper), allowance for a plurality of dot densities, provision of a plurality of scanner resolutions, provision of a plurality of video signal transfer means, and provision of a read start/end function. In addition, a plurality of dot gradation expressions (binary data or multi-valued data), allowance for multiplexing dot expressions (color image pickup or transfer), and the like can also be included, as needed.

Layer 1, i.e., the physical layer has a functional module (image pickup system module 32) for optically picking up a dot code pattern recorded on the information recording (transfer) medium 30 such as paper and outputting an image signal, and functional modules (a reproduction/equalization module 34 and a quantization module 36) for performing preprocessing (gain control and equalization processing) of the image signal and sampling/quantizing the image signal. Layer 1 also has a functional module for converting the quantized value to digital data to generate image data, a functional module for formatting the image data to convert the image data to a predetermined data format consisting of format information (a header, i.e., first processing information) and data (image data entity), and outputting the data to the upper adjacent layer, i.e., layer 2, and a functional module for inputting/outputting status information and control information associated with processing.

Formatted (image) data as a service data unit (1-SDU1) is transferred from layer 1 to layer 2 in units of image frames.

Layer 2 (block data layer) has as its basic function to properly transfer a block and a bit string in the block. Layer 2 defines conditions for block transfer (i.e., the block detection method, the channel bit detection method, the code modulation/demodulation method, and the like). Layer functions required to layer 2, i.e., services to be provided include block extraction and dot sampling point detection, provision of a plurality of recording methods (provision of the binary data, multi-valued data, and multiplexing methods), provision of a plurality of block patterns, provision of a plurality of code modulation/ demodulation methods, detection of the block relative position, and notification of a block detection error and a recovery operation. Note that the provision of a plurality of block patterns includes the block size detection function, the marker definition/detection function, and adjustment to a variety of dot read orders.

Layer 2, i.e., the block data layer has a functional module for inputting formatted (image) data (1-SDU1) input from the lower adjacent layer, i.e., layer 1 as 2-PDU1, recognizing and separating the format information (2-PCI1, i.e., the first processing information) from the data entity (2-UD1), and converting the data entity to a processing adaptive form, functional modules for processing the data entity converted to the processing adaptive form and extracting a plurality of blocks in predetermined units of information codes (a block unit dot detection point extraction (marker detection, pattern matching, and the like) module 38, and a dot detection (identification/determination) module 40), and functional modules for processing the extracted block and reproducing the information code in units of blocks (a block ID data reproduction module 42 and a block data reproduction module 44). The information code for each block consists of format information for linking a plurality of blocks, code modulation information, and a data entity. Layer 2 also has a functional module for reading the code modulation information from the information for each block and demodulating the data entity in accordance with the code modulation information (a code demodulation module 46), a functional module for outputting the format information of the demodulated block information code (a block header, i.e., second processing information) and the data entity (user data) to the upper adjacent layer, i.e., layer 3 as 2-SDU1, and a functional module for inputting/outputting status information and control information associated with processing.

More specifically, layer 2 detects a block unit dot detection point, i.e., a marker from image data in units of block data which is the first predetermined unit, detects a data dot in units of blocks in accordance with the detected marker, and restores the bit datastream. This processing is described in detail in U.S. Ser. No. 08/407,018 assigned to the assignee of the present invention. For data of each block, a header, i.e., block ID data is reproduced first. Thereafter, block data as user data is reproduced, code demodulation is performed, and the data is transferred to the upper layer, i.e., layer 3 in units of block data.

Layer 3 (data link layer) has as its basic function to generate a predetermined data chunk (subset element (fourth predetermined unit)) whose predetermined error quality is guaranteed and guarantee proper transfer. Layer 3 defines conditions for linking block data (first predetermined unit) or conditions for generating a macro block (third predetermined unit)/super macro block (second predetermined unit) (i.e., interleave method/structure), and (super) macro block header and user data error control (i.e., ECC method/ structure). Layer functions required of layer 3, i.e., services to be provided include provision of block address read/write abnormality recovery function, read state confirmation of a desired block (check of a read valid block), setting of a block array structure, generation of an intermediate data chunk, provision of a plurality of interleave methods/ranges/ structures, and provision of a plurality of ECC methods/ ranges/structures.

Layer 3, i.e., the data link layer has a functional module for inputting the block information code (2-SDU1) input from the lower adjacent layer, i.e., layer 2 as 3-PDU1, recognizing and reading the format information (3-PCI1, i.e., second processing information) from the block information code, linking a plurality of data entities (3-UD1) in units of blocks in accordance with the format information, and generating (constituting) a macro block or a super macro block (a block link (macro block generation) module 48). More specifically, a bit datastream is received from layer 2 in units of blocks. A block header as 3-PCI1 (second processing information) corresponding to a predetermined number of bits from the start of the block is recognized and separated from user data 3-UD1 subsequent to the bits. Blocks are linked in accordance with information written in the block header to generate a macro block. The resultant macro block consists of supplementary information (a macro block header, i.e., part of second processing information) distributed in the macro block, and a data entity (user data).

Layer 3 also includes an error correction functional module for rearranging macro blocks by predetermined de-interleave processing and performing predetermined correction processing of macro block headers (a macro block header unit de-interleave/error correction module 50), a functional module for reading format information for generating (constituting) a super macro block from the macro block header, linking a plurality of macro blocks in accordance with the read information, and generating (constituting) a super macro block (a macro block link (super macro block generation) module 52), a functional module for reading interleave information from the macro block header and performing de-interleave processing of user data of the super macro block in accordance with the interleave information (a super macro block unit de-interleave module 54), a functional module for reading error correction information from the macro block header and performing error correction processing of the user data after de-interleave processing in accordance with the error correction information (a super macro block unit error correction module 56), a functional module for reading subset element structure specification information, i.e., a subset element header from the macro block header and separating a subset element from the user data of the super macro block after error correction processing in accordance with the subset element structure specification information (a subset element unit output processing module 58), a functional module for outputting the separated subset element units to the upper adjacent layer, i.e., layer 4 as 3-SDU1, and a functional module for inputting/outputting status information and control information associated with processing.

Layer 3 has a multistage function of linking blocks first to generate a macro block, and further linking macro blocks to generate a super macro block. After error correction processing, the subset structure specification (third processing information) written in the macro block header is read to divide the super macro block into subset elements, and the subset elements are output. That is, the data is transferred to the upper layer in units of subset elements as 3-SDU1.

Layer 4 (presentation layer) has as its basic function to guarantee generation of a subset. Layer 4 defines conditions for linking subset elements to generate a subset. Layer functions required of layer 4, i.e., services to be provided include selection of subset elements necessary for a target file, generation of a subset and determination of conditions therefor, and adaptive data conversion for DOS or the like. Note that, the subset is recognizable information unit data. More specifically, the macro block or super macro block includes multimedia information consisting of audio information and image information. This multimedia information is divided into data chunks each recognizable as one information unit, i.e., a data block corresponding to only audio information and a data block corresponding to only video information. Each data chunk is called a subset.

Layer 4, i.e., the presentation layer has a functional module for inputting data (3-SDU1) input from the lower adjacent layer, i.e., layer 3 in units of subset elements as 4-PDU1 and reading format information (4-PCI1, i.e., fourth processing information) (a subfile link information read module 60), and a functional module for linking data entities (4-UD1) in units of subset elements in accordance with the read format information to generate (constitute) a subset (a subset element link (subset generation) module 62). Data of each subset element consists of format information (subset element header) for linking subset elements to generate (constitute) a subset, and a user data entity.

Layer 4 also includes a functional module for reading supplementary information necessary for conventional or new interface to the upper adjacent layer from the generated subset and performing interface matching processing, a functional module for outputting part or all supplementary information of the subset and the data entity to the upper adjacent layer, i.e., layer 5 as 4-SDU1, and a functional module for inputting/outputting status information and control information associated with processing.

Layer 5 (application layer) has as its basic function to properly guarantee a satisfactory file management operation. Layer 5 defines conditions for performing file management (i.e., file generation conditions and the like). Layer functions required of layer 5, i.e., services to be provided include filing of an application request, and subset read/write processing.

Layer 5, i.e., the application layer includes a functional module for inputting subset data (4-SDU1) input from the lower adjacent layer, i.e., layer 4 as 5-PDU1, reading file management information from the supplementary information of this subset (5-PCI1, i.e., fifth processing information) or the data entity (5-UDI1), performing file management in accordance with the file management information, linking the subset units or subsets to generate a file, and reading the data in units of files (file management system module 64), a functional module for outputting data units in units of subsets or files generated on the basis of file management to the application process as 5-SDU1, and a functional module for inputting/outputting status information and control information associated with processing.

The application process has as its basic function to realize an application using the MMP system. The application process includes the source sample data shuffling method/structure, the scramble method/structure for encryption, the data compression method/structure, and the audio/text/image data structure. Functions required of the application process, i.e., services to be provided include provision of the source sample data shuffling method, and provision of the scramble method. Provision of a plurality of data compression methods and compression/expansion operations, confirmation of types of information, and selection of data structures can also be included, as needed.

As a detailed example for realizing the hierarchical structure as described in PCT/JP95/01050 assigned to the assignee of the present invention, layer 3 (data link layer), layer 4 (presentation layer), and layer 5 (application layer) described in PCT/JP95/01467 assigned to the assignee of the present invention will be described below.

FIG. 14 is a block diagram showing the arrangement of layer 3.

Layer 3 receives 2nd layer service data unit No. 1 (2-SDU1) from layer 2 as 3rd layer protocol data unit No. 1 (3-PDU1). Layer 3 also receives a status signal 2-SDU2 as 3-PCI2 and a parameter setting signal 2-SDU3 as 3-PCI3, and inversely outputs 3-PCI2 and 3-PCI3 to layer 2 as 2-SDU2 and 2-SDU3, respectively.

The status signal is a signal representing an error state detected in layer 2, a signal representing a scanning state received by layer 2 from layer 1, or a signal representing the output state of a service data unit from layer 2, i.e., a start/stop signal for layer 3. In the opposite direction, a reception state signal for determining whether the service data unit is received by layer 3, and the like are included in the status signal. The parameter setting signal includes a signal for reading, in layer 3, the content of the parameter memory of layer 2, and a signal for setting data in the parameter memory of layer 2.

Layer 3 comprises a controller 66, first and second selectors 68 and 70, first and second buffer memories 72 and 74, a block header identification unit 76, a memory controller 78, a macro block header de-interleave unit 80, a macro block header ECC unit 82, a macro block header identification unit 84, a header correction unit 86, a super macro block de-interleave unit 88, a super macro block ECC unit 90, a subset element formation unit 92, and a parameter storage memory 94.

The controller 66 receives the status signals and the parameter setting signals from layer 2 and layer 4, accordingly reads out parameters stored in the parameter storage memory 94 to control the entire layer 3, and outputs a status signal and a parameter setting signal to layer 2 and layer 4. Of the parameters readout from the parameter storage memory 94, the intrablock structure parameter is set in the memory controller 78, the macro block (MB) header interleave length is set in the memory controller 78 and the macro block header de-interleave unit 80, and the MB header error correction (ECC) code length is set in the memory controller 78, the macro block header de-interleave unit 80, and the macro block header ECC unit 82.

The first selector 68 selectively supplies, of the data 3-PDU1, block user data to the second selector 70 and block header information to the block header identification unit 76 under the control of the controller 66.

The block header identification unit 76 identifies the content of the block header information and outputs the result to the memory controller 78.

The memory controller 78 controls the second selector 70, and the first and second buffer memories 72 and 74 in accordance with the parameters from the controller 66, the identification result from the block header identification unit 76, and the parameters set from the macro block header identification unit 84 (the super macro block (SMB)/interleave length and the SMB/ECC code length).

The second selector 70 selectively supplies, of the block user data from the first selector 68, the first several bytes, i.e., only the interleaved macro block header data to the first buffer memory 72, and the remaining data to the second buffer memory 74 under the control of the memory controller 78.

The first buffer memory 72 stores the macro block header information under the write control of the memory controller 78 and supplies the data read out under the read control to the macro block header de-interleave unit 80.

The second buffer memory 74 stores the block user data other than the data stored in the first buffer memory 72 under the write control of the memory controller 78 and supplies the data read out under the read control to the super macro block de-interleave unit 88.

The macro block header de-interleave unit 80 uses the parameters set from the controller 66 to de-interleave the macro block header information read out from the first buffer memory 72 and supplies the result to the macro block header ECC unit 82.

The macro block header ECC unit 82 uses the parameters set from the controller 66 to perform error correction of the de-interleaved macro block header information and supplies the result to the macro block header identification unit 84. A correction state signal representing whether error correction is completed is also supplied to the macro block header identification unit 84.

The macro block header identification unit 84 determines on the basis of the correction state signal whether error correction is successful. If error correction is successful, the macro block header information after error correction is identified, and the resultant parameters are set in the memory controller 78, the super macro block de-interleave unit 88, the super macro block ECC unit 90, and the subset element formation unit 92. More specifically, the SMB/interleave length and the SMB/ECC code length are set in the memory controller 78 and the super macro block de-interleave unit 88, the SMB/ECC code length is set in the super macro block ECC unit 90, and the subset element (SSE) header and the SSE user data size are set in the subset element formation unit 92. If error correction is not successful, the stored information of an adjacent macro block header is supplied to the header correction unit 86. The macro block header identification unit 84 has a buffer memory (not shown) for storing a plurality of macro block headers, and a new macro block header replaces old data.

The header correction unit 86 corrects the data content of the macro block header, for which correction cannot be performed, by using the adjacent macro block header information. If correction is successful, the corrected macro block header information is returned to the macro block header identification unit 84. If correction is not successful, a correction error signal represented by a dotted line is output to the controller 66. The controller 66 sends, in accordance with the correction error signal, a signal representing that the macro block header cannot be read to layer 4 and the subsequent layer as a status signal (3-SDU2).

The super macro block de-interleave unit 88 de-interleaves, in accordance with the parameters set by the macro block header identification unit 84, the data read out from the second buffer memory 74 under the read control of the memory controller 78 to constitute a super macro block and supplies the super macro block to the super macro block ECC unit 90.

The super macro block ECC unit 90 performs error correction of the super macro block in accordance with the parameters set by the macro block header identification unit 84 and supplies the result to the subset element formation unit 92. If error correction is not successful, a correction error signal represented by a dotted line is output to the controller 66, and the controller 66 sends, in accordance with the correction error signal, a signal representing that the super macro block cannot be read to layer 4 and the subsequent layer as a status signal (3-SDU2).

The subset element formation unit 92 uses the parameters set by the macro block header identification unit 84 to constitute a subset element from the super macro block data after error correction and sends the subset element to the upper layer 4 as 3-SDU1 in units of subset elements.

As shown in FIG. 13A, block data (3-PDU1) transferred from layer 2 is constituted by a set standard identification code 96, a user data format type 98, a block address 100, a block user data size (block data count) 102, and block user data 104. Of these data units, the set standard identification code 96, the user data format type 98, the block address 100, and the block user data size 102 are supplied to the block header identification unit 76 through the first selector 68 as a block header.

The set standard identification code 96 is a code representing parameters such as a dot size and a block size, as described in detail in PCT/JP95/01467 assigned to the assignee of the present invention. More specifically, with reference to this code, such parameters necessary for interpreting the content of a dot code in the upper layer can be obtained from a predetermined memory (e.g., the parameter storage memory 94). For example, when the set standard identification code 96 is "00", a certain parameter is set in layer 1, another necessary parameter is set in layer 2, still another necessary parameter is set in layer 3, still another necessary parameter is set in layer 4, and still another necessary parameter is set in layer 5. That is, although the same code, i.e., "00" is transferred through layer 1, layer 2, ..., and layer 5, different parameters are input to the respective layers. As described in detail in PCT/JP95/01467 assigned to the assignee of the present invention, the set standard identification code 96 is set upon reading a system control file (SCF) recorded on the information recording (transfer) medium 30 such as paper on which the dot code 10 is recorded.

The set standard identification code is sent from the block header identification unit 76 to the controller 66 and used to obtain parameters necessary in layer 3 from the parameter storage memory 94.

The user data format type 98 represents subsequently described parameter items. More specifically, when the user data format type 98 is described, all parameter contents can be omitted. For example, when the user data format type 98 is represented by a code "01", the block address 100 and the block user data size 102 are added to the user data and sent. When the code is "02", the block address 100, the block user data size 102, and another data are added to the user data and sent, and the type or arrangement of information 3-PCI1 is selected and recognized in layer 3.

In this manner, when the block address 100 and the block user data size 102 are added, layer 3 recognizes the information. Therefore, even when code information including a different block data size is transferred from layer 2, layer 3 can recognize the difference and perform processing.

FIG. 13B is a view showing a block data structure in which the user data format type 98 is represented by a code "02". In this case, the block header includes a block address error status flag (presence/absence of block address compensation) 106, in addition to the set standard identification code 96, the user data format type 98, the block address 100, and the block user data size 102.

FIG. 13C is a view showing a block data structure in which the user data format type 98 is represented by a code "03". In this case, the block header includes a block user data demodulation error count 108, in addition to the set standard identification code 96, the user data format type 98, the block address 100, the block user data size 102, and the block address error status flag 106.

FIG. 13D is a view showing a block data structure in which the user data format type 98 is represented by a code "04". In this case, the block header includes a block user data demodulation error position 110, in addition to the set standard identification code 96, the user data format type 98, the block address 100, the block user data size 102, and the block address error status flag 106.

The block address error status flag 106 represents four states shown in FIG. 13E. More specifically, when error correction of the block address is performed in layer 2, and no error is present in the block address, a value "1" is set. When error correction is successfully performed, a value "2" is set. When correction is erroneously performed, or when correction is performed using an adjacent block although correction is unsuccessful at the first time, a value "3" is set. When correction is erroneously performed, or when correction is unsuccessful and correction using an adjacent block is also unsuccessful, a value "4" is set.

When a block is received a plurality of number of times, the memory controller 78 can determine the priority on the basis of the value of the block address error status flag 106 and control data write (overwrite) access to the first and second buffer memories 72 and 74. More specifically, a block with a smaller flag value has a priority for replacement.

Figure 15:
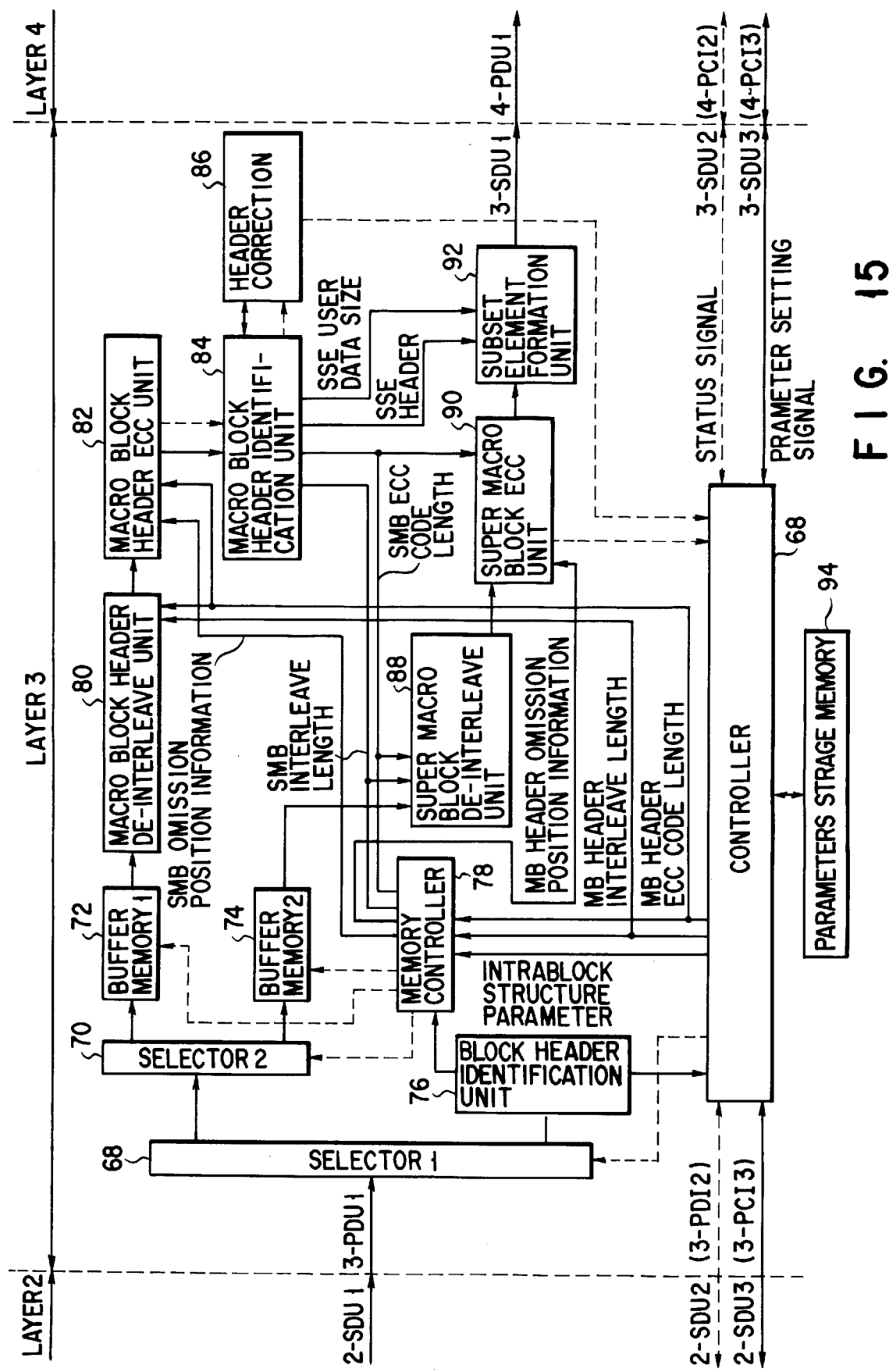
FIG. 15 is a block diagram showing a modification of layer 3.

As shown in FIG. 15, the memory controller 78 can generate MB header omission position information and SMB omission position information on the basis of the block address error status flag 106 and supply the information to the macro block header ECC unit 82 and the super macro block ECC unit 90. More specifically, when the block address error status flag 106 is "4", i.e., when the address of given block data cannot be read, all block data is omitted. The memory controller 78 determines the position of the omitted block by using the block address 100 of the block. The macro block header omission position and the super macro block omission position are determined and supplied to the macro block header ECC unit 82 and the super macro block ECC unit 90 as MB header omission position information and the SMB omission position information.

For error correction processing, two pieces of information, i.e., error position information and error pattern information for correcting the error at that position are necessary. Of these pieces of information, the former can be supplied to the ECC units 82 and 90 as omission position information. As will be described later, an error correction check symbol to be supplied to a corresponding ECC unit as part of the macro block header or super macro block can be used only for the latter information. For this reason, as compared to a case wherein both the information are represented in the same information amount, error pattern information in a doubled amount can be supplied. As a result, when all error positions are detected, the error correction capability of the ECC units 82 and 90 can almost be doubled.

As information for generating the omission information, the block user data demodulation error position 110 can also be used. More specifically, since the position where a demodulation error occurs in a block can be detected, the memory controller 78 can easily obtain information representing the position where omission has occurred in the macro block header or super macro block.

The reason why the block user data demodulation error count 108 is arranged is as follows. Assume that, in linking blocks in layer 3, the same block data is transferred a plurality of number of times, i.e., blocks with the same address are transferred a number of times. If the demodulation error count 108 is sent from layer 2, the previous demodulation error count is compared to the current demodulation error count, and block data with a smaller number of errors is selected and reconstituted. With this processing, the data error rate before error correction can be reduced to allow high-speed error correction. In addition, the error correction failure frequency can be reduced.

The macro block header structure obtained upon de-interleave processing by the macro block header de-interleave unit 80 will be described below.

As shown in FIG. 16A, the macro block header comprises a set standard identification code 112, a user data format type 114, macro block linkage information 116 serving as information for linking macro blocks, SMB interleave method information 118 serving as information of a method of interleaving a super macro block, SMB error correction method information 120 serving as information of a method of performing error correction of the super macro block, SMB error detection method information 122 serving as information of a method of performing error detection of the super macro block, subset element linkage information 124 serving as information for linking subsets, a subset element user data size 126, an error detection check symbol 128, and an error correction check symbol 130.

The error detection check symbol 128 is used to detect whether an error is present in one-dimensional data obtained by one-dimensionally arranging the set standard identification code 112 to the subset element user data size 126.

In fact, the macro block header has a two-dimensional structure, as shown in FIG. 16B. Error correction processing is performed along the column direction so that the error correction check symbol is set with respect to data in a given column, as represented by an MB error correction code length in FIG. 16B. With interleave processing in such two-dimensional structure, a burst error can hardly occur.

As shown in FIG. 16C, an error correction check symbol 132 in the row direction may be further added. Alternatively, error correction may be performed in the oblique direction.

FIGS. 17A to 17C are views showing examples of the structures in FIGS. 16A to 16C in more detail.

The SMB interleave method information 118 is replaced by an SMB interleave length 118', the SMB error correction method information 120 is replaced by an SMB error correction code length 120', and the SMB error detection method information 122 is replaced by an SMB error detection presence/absence determination flag 122'.

The super macro block structure obtained upon de-interleave processing by the super macro block de-interleave unit 88 will be described below.

The structure of the super macro block, i.e., the error correction structure, the interleave method, and the error correction code length are determined in accordance with information in the macro block header, i.e., the set standard identification code 112 or information subsequent to the user data format type 114 in the macro block header.

FIGS. 18A and 18B and 19A and 19B are views showing super macro block structures. As shown in FIGS. 18A and 18B and 19A and 19B, the size of a super macro block is adjustable, and the size of subset element data is also adjustable.

Figure 18A:
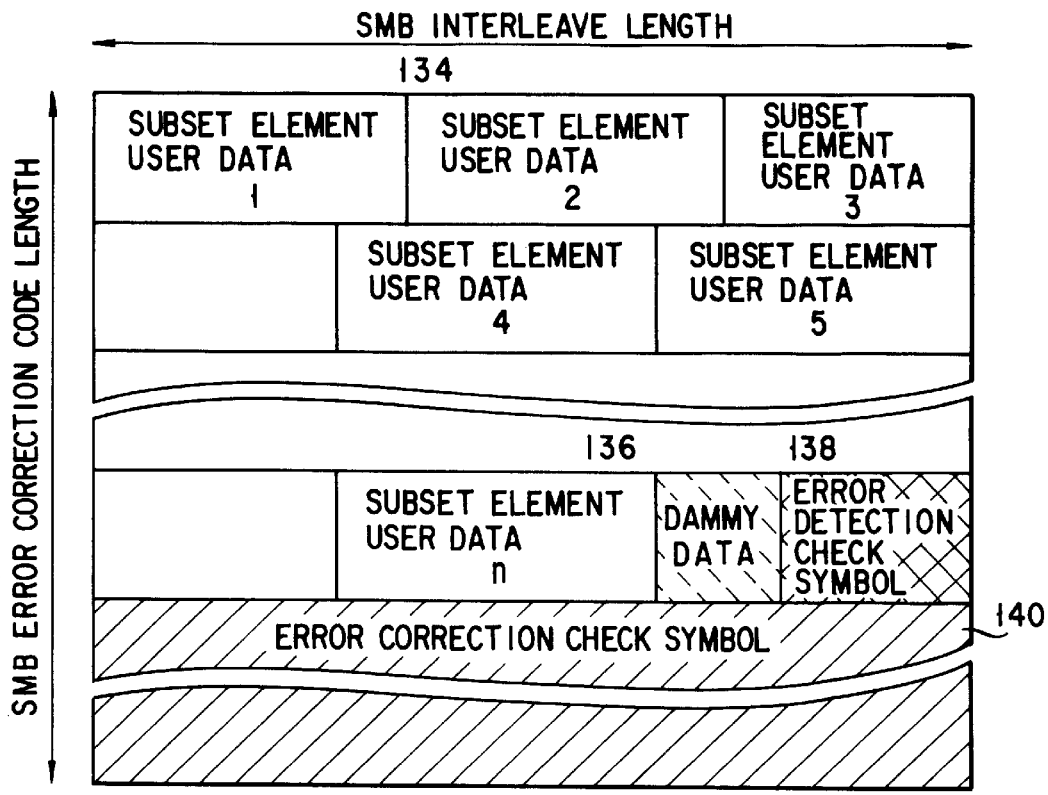
FIGS. 18A and 18B are views showing a structure of a super macro block.
Figure 18B:
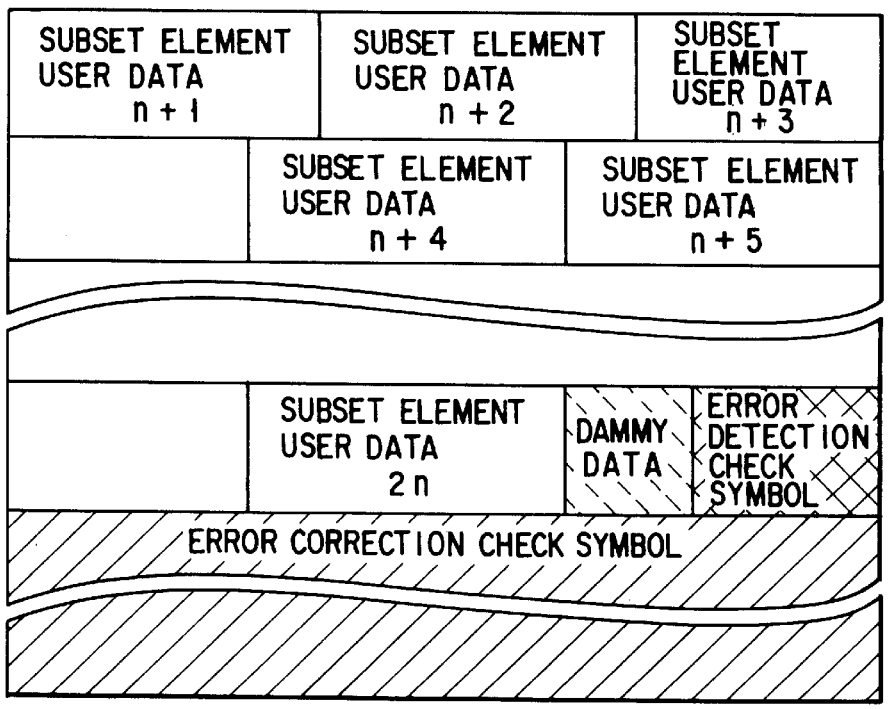

FIGS. 18A and 18B show a case wherein a plurality of subset element data 134 are present in one super macro block. After dummy data 136 is inserted in the remaining portion, an error detection check symbol 138 is arranged. The error detection check symbol 138 is used to detect whether an error is present in one-dimensional data obtained by one-dimensionally arranging subset element user data 1 to n and the dummy data in super macro block No. 1 shown in FIG. 18A. After the error detection check symbol 138, an error correction check symbol 140 is added along the column direction. In decoding processing, therefore, the error correction check symbol 140 is referred to first to decode error correction. After error correction, the error detection check symbol 138 for the one-dimensionally arranged data is used to check whether an error is present in the data.

As in super macro block No. 1, super macro block No. 2 shown in FIG. 18B has a structure wherein n subset element data 134 are present in the order from subset element user data n+1, assuming that n subset element data 134 are present in super macro block No. 1.

FIGS. 19A and 19B show a case wherein two super macro blocks constitute one subset element 134 (each super macro block includes ½ the subset element, i.e., element data 134-1 or 134-2). In this case, the size of the super macro block is smaller than that in FIGS. 18A and 18B.

One super macro block may constitute one subset element user data, as a matter of course.

Figure 20A:
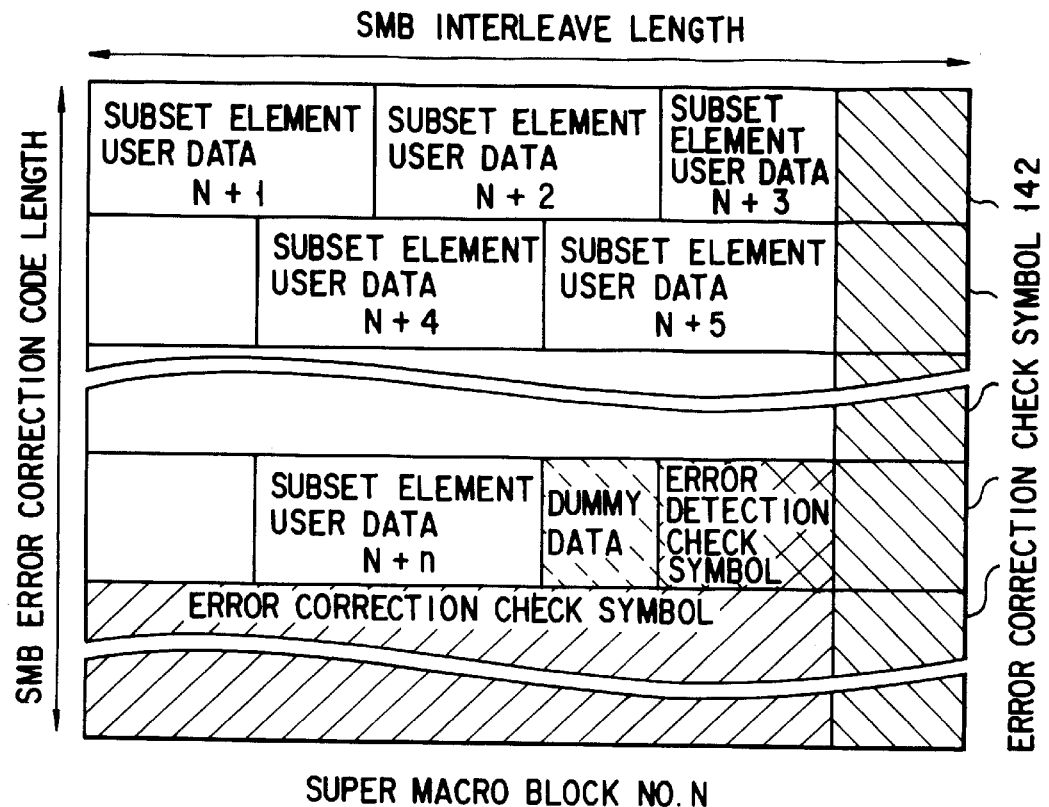
FIGS. 20A and 20B are views showing modifications of the super macro block structures shown in FIGS. 18A and 18B and 19A and 19B.
Figure 20B:
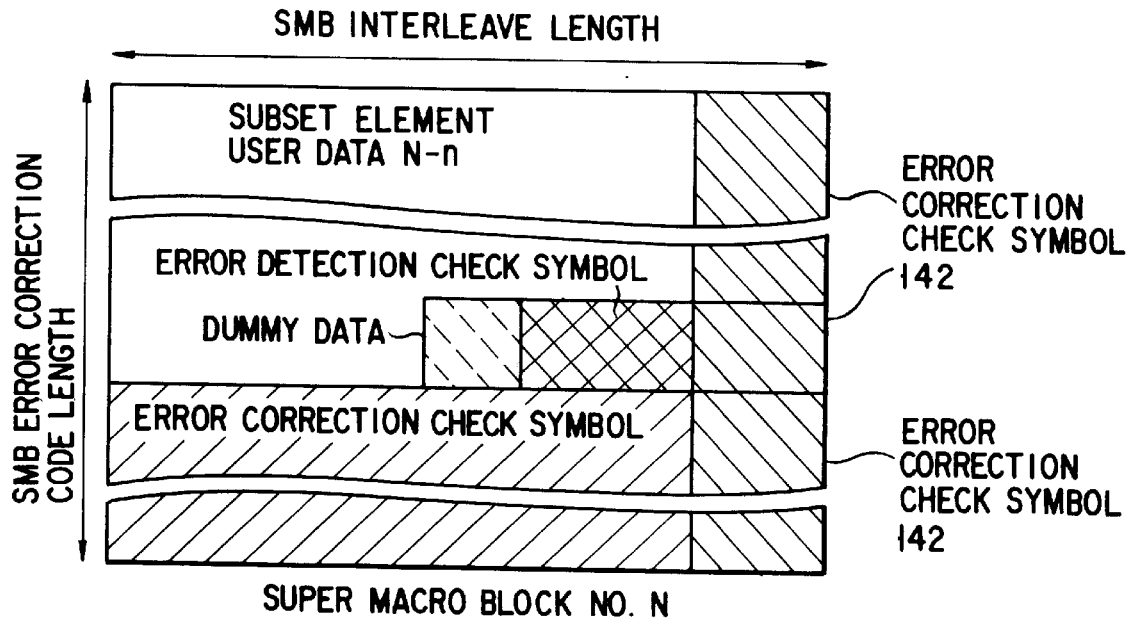

As shown in FIGS. 20A and 20B, in this super macro block as well, an error correction check symbol 142 in the row direction may be added, as in the above-mentioned macro block header. Alternatively, error correction may be performed in the oblique direction.

The subset element structure constituted by the subset element formation unit 92 shown in FIGS. 14 and 15 will be described below.

As shown in FIG. 19C, the subset element has a structure in which subset element linkage information 148 and a subset element user data size 150 are arranged subsequent to a set standard identification code 144 and a user data format type 146, and thereafter, subset element user data 152 is inserted. Such a subset element is transferred to layer 4 as 3-SDU1. This is only an example, as a matter of course, and the structure is appropriately changed in accordance with information necessary in the upper layer.

The status signal 3-SDU2 (4-PCI2 when viewed from the layer 4 side) and the parameter setting signal 3-SDU3 (4-PCI3 when viewed from the layer 4 side) are transferred between layer 3 (controller 66) and layer 4. The status signal includes a signal representing a state wherein correction by the header correction unit 86 has failed or a state wherein error correction by the super macro block ECC unit 90 has failed, a status signal representing that a subset element is sent as a service data unit prepared in layer 3, and a reception state signal for determining, in the opposite direction, whether layer 4 has received this subset element. The parameter setting signal includes a signal for setting data from the upper layer to the parameter storage memory 94 or a signal for reading out the content of the parameter storage memory 94 in the upper layer.

Figure 21A:
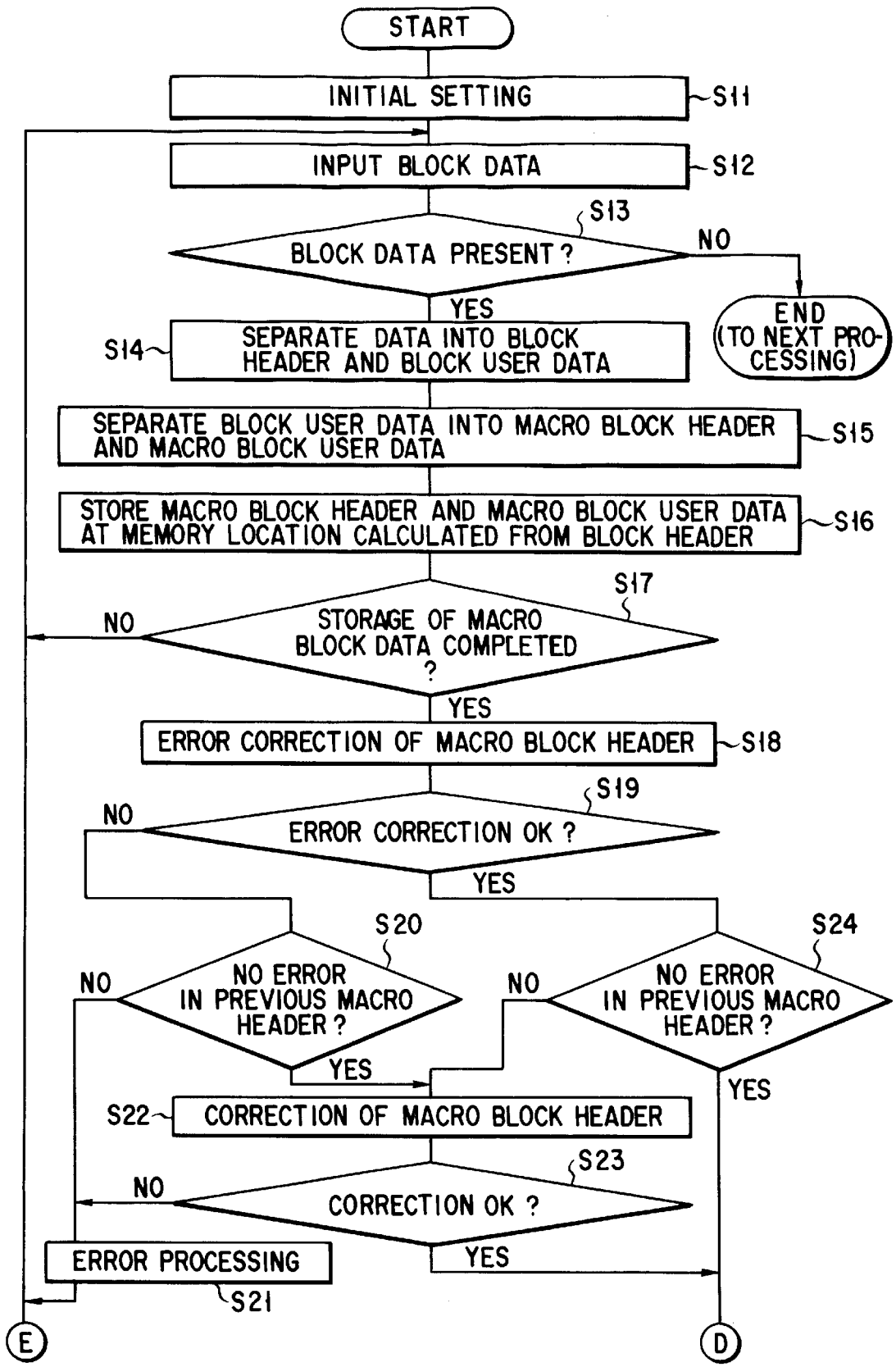

The operation of layer 3 in this arrangement will be described below with reference to flow charts in FIGS. 21A and 21B.

When a start signal is input from layer 2 as 2-SDU2 (3-PCI2) to start layer 3, a parameter setting signal and a set standard identification code 96 are acquired from 2-SDI3 (3-PCI3) and 2-SDU1 (3-PDU1), thereby performing initial setting of layer 3 (step S11). More specifically, in accordance with the parameter setting signal or the set standard identification code 96, various parameters such as the number of macro block header data distributed to each block, the method of linking macro block headers, the method of performing error correction of the macro block header are read out from the parameter storage memory 94 and stored in the controller.

Upon reception of the input of data 3-PDU1 (block data) from layer 2 (step S12), if block data is present (step S13), the first selector 68 separates the input block data into a block header and block user data 104. The block user data 104 is supplied to the second selector 70, and the block header is supplied to the block header identification unit 76 (step S14).

The block header identification unit 76 recognizes the block header, e.g., the block address 100 or the block user data size 102, and supplies the identified data to the memory controller 78.

The memory controller 78 receives information from the block header identification unit 76 and, at the same time, the parameters received by the controller 66 for initial setting, such as the number of macro block header data distributed to each block (block structure parameter), the MB header interleave length, and the MB header ECC code length. Using the information from the block header identification unit 76 and the three parameters, switching control of the second selector 70 and storage control of the first and second buffer memories 72 and 74 are performed. Actually, only the first several byte of the block user data 104 separated by the first selector 68, i.e., only the interleaved macro block header is supplied to the first buffer memory 72, and the remaining data, i.e., the macro block user data is supplied to the second buffer memory 74 (step S15).

In this case, as identification information from the block header identification unit 75, the block address 100 and the block user data size 102 are supplied to the memory controller 78. The memory controller 78 stores the output from the second selector 70 at positions in the first and second buffer memories 72 and 74, which are calculated using the block address 100 and the block user data size 102 (step S16). Alternatively, the data is temporarily written in the buffer memories 72 and 74, and thereafter, the block address error state flag 106 is referred to. If the current data is better than the previous data, i.e., if no error is present, the corresponding portion is rewritten.

The memory controller 78 determines on the basis of the block address 100 sent from the block header identification unit 76 whether macro block data is formed. That is, it is determined whether macro block data, i.e., header data and user data are accumulated in the buffer memories 72 and 74 (step S17). If the macro block data is not completely stored, the flow returns to step S12 to repeat the above operation.

When the macro block header data is accumulated in the first buffer memory 72, the data is sent to the macro block header de-interleave unit 80. The parameters such as the MB header interleave length and the MB header ECC code length from the controller 66 are set to the macro block header de-interleave unit 80. In accordance with these parameters, the macro block header de-interleave unit 80 de-interleaves the data supplied from the first buffer memory 72 and supplies the macro block header data obtained upon de-interleave processing to the macro block header ECC unit 82.

The MB header ECC code length from the controller 66 and the MB header omission position information from the memory controller 78 in the example shown in FIG. 15 are set in the macro block header ECC unit 82 as parameters. The macro block header ECC unit 82 performs error correction of the de-interleaved macro block header in accordance with these parameters (step S18). The data after error correction is supplied to the macro block header identification unit 84 for identifying the macro block header. The data correction status signal indicated by a dotted line in FIG. 14 or 15, which represents whether error correction is successfully completed, is also supplied to the macro block header identification unit 84.

The macro block header identification unit 84 determines on the basis of the correction status signal whether error correction of the macro block header is successfully completed (step S19). If NO in step S19, it is determined whether an error is present in the previous macro block header, i.e., a macro block header processed before that in respect of time (step S20). If YES in step S20, error processing is performed (step S21), and the flow returns to step S12 to process the next block data. If error correction of the first macro block header has failed, no previous macro block header is present. In this case, processing is performed assuming that an error is present in the previous block header.

If error correction is not successfully completed, and no error is present in the previous macro block header, the macro block header identification unit 84 supplies the macro block header data for which error correction could not be performed to the header correction unit 86, thereby correcting the macro block header (step S22). More specifically, the header correction unit 86 corrects the data content of the macro block header with the information of the previous macro block header. It is determined whether correction is successfully completed in this correction processing (step S23). If NO in step S23, the flow advances to error processing in step S21.

In error processing in step S21, basically, if errors are present in two macro block headers, i.e., if NO in step S20, processing may be forcibly terminated because that portion cannot be corrected any more from an adjacent macro block header at that point of time. In addition, if the macro block header cannot be corrected by the header correction unit 86, i.e., if NO in step S23, a correction error signal as indicated by a dotted line in FIG. 14 or 15 is output to the controller 66. The controller 66 performs error processing in accordance with this correction error signal so that a signal representing that the macro block header cannot be recognized is sent to layer 4 and the subsequent layer as a status signal (3-SDU2).

If correction is successfully completed by the header correction unit 86, the corrected macro block header data is returned to the macro block header identification unit 84.

When error correction of the macro block header is successfully completed (step S19), the macro block header identification unit 84 checks whether an error is present in the previous macro block header (step S24). If YES in step S24, the flow advances to step S22. Using the macro block header for which error correction is performed by the header correction unit 86, the previous macro block header for which error correction could not be performed is corrected.

If correction of the macro block header is successfully completed, or if error correction is successfully completed, and no error is present in the previous macro block header, the macro block header identification unit 84 identifies information in the macro block header and acquires super macro block formation parameters and subset element formation parameters (step S25). These parameters are set in the memory controller 78, the super macro block de-interleave unit 88, the super macro block ECC unit 90, and the subset element formation unit 92. More specifically, the SMB interleave length and the SMB/ECC code length are set in the memory controller 78 and the super macro block de-interleave unit 88, the SMB/ECC code length is set in the super macro block ECC unit 90, and the SEE header and the SEE user data size are set in the subset element formation unit 92.

When the SMB interleave length and the SMB/ECC code length are set in the memory controller 78, the size of a super macro block is defined by the two parameters. The memory controller 78 calculates the size and identifies whether data corresponding to that size is stored in the second buffer memory 74, i.e., whether a super macro block can be formed of the input macro block user data (step S26). If NO in step S26, the flow returns to step S12 to repeat the above processing.

If data corresponding to the size of the super macro block data is stored in the second buffer memory 74, the data is input from the second buffer memory 74 to the super macro block de-interleave unit 88. The macro block user data is de-interleaved by the super macro block de-interleave unit 88 to form a super macro block (step S27), and the super macro block is supplied to the super macro block ECC unit 90.

The SMB/ECC code length from the macro block header identification unit 84 and the SMB/header omission position information from the memory controller 78 in the example shown in FIG. 15 are set in the super macro block ECC unit 90 as parameters. The super macro block ECC unit 90 performs error correction of the de-interleaved super macro block in accordance with the parameters (step S28).

After error correction of the super macro block is completed, if an error is present in the super macro block (step S29), error processing is performed (step S30). For example, a signal for notifying the presence of an error is input to the controller 66, as indicated by a dotted line in FIG. 14 or 15, and this status signal is sent to layer 4 or layer 2. If no error is present (step S29), this data is supplied to the subset element formation unit 92 as the subset element user data 152.

The SSE header and the SSE user data size 150 from the macro block header identification unit 84 are set in the subset element formation unit 92 as parameters. The subset element formation unit 92 checks in accordance with these parameters whether necessary subset element user data is supplied, i.e., whether a subset element can be formed (step S31). If NO in step S31, the flow returns to step S26 to repeat the above processing.

If YES in step S31, the SSE header and the subset element user data size 150 from the macro block header identification unit 84 are added to the subset element user data 152 to form a subset element, which is output to layer 4 as 3-SDU1 in units of subset elements (step S32).

In the above description, blocks are linked to form a macro block, and macro blocks are linked to form a super macro block. However, a super macro block can also be directly formed from blocks without interposing macro blocks.

Layers 4 and 5 will be described below in detail.

Layer 4 links subset elements from layer 3 to form a subset and transfers the subset to layer 5. Layer 5 mainly serves as a file management system for transferring data to the application process in units of subsets. The following description will be made on the assumption that MS-DOS (trademark of Microsoft, U.S.) is employed as a file management system for layer 5.

When the system up to an MMP reproduction device 28, i.e., layer 3 is to be managed on the DOS base, the DOS can define the MMP reproduction device 28 as a block type device or a character type device.

A case wherein the MMP reproduction device 28 is regarded as a block type device will be described first.

FIG. 22A is a view showing the structure of 4-PDU1 (subset element data) output from layer 3 and input to layer 4, which is constituted by a pertinent subset ID number 154 as 4-PCI1, a subset generation reference standard ID number 156, a subset element count 158 representing the number of subset elements constituting a subset, and a subset generation structure identifier 160, and user data (subset element user data 152) 162 as 4-UD1. Although this structure differs from that shown in FIG. 19C, the set standard identification code 144, the user data format type 146, the subset element linkage information 148, and the subset element user data size 150 may also be included, as a matter of course.

The pertinent subset ID number 154 is a number representing a subset to which subset element data belongs because layer 4 links subset elements to form a subset. Note that a subset is recognizable information unit data, as described above. More specifically, a macro block or super macro block includes multimedia information such as audio information and video information. This multimedia information is divided into data blocks each recognizable as one information unit, i.e., a data block corresponding to only audio information and a data chunk corresponding to only video information. Each data chunk is called a subset.

The subset generation reference standard ID number 156 is information representing a reference level at which a subset is regarded to be completed. Assume that a subset cannot be formed unless all subset elements are properly acquired. In this case, if a certain subset element is not received from layer 3 due to some error, processing stops. To continue processing even in such a case, i.e., to send subset elements to the application to reproduce information although the quality slightly deteriorates, a generation reference is set so that a subset can be considered to be completed upon acquiring 90% subset elements. A plurality of generation references are provided, and the selected one is represented by the subset generation reference standard ID number 156.

The subset element count 158 is information representing the number of subset elements constituting a subset.

The subset generation structure identifier 160 is information for identifying one of a plurality of methods of linking subset elements.

FIGS. 22B and 22C are views showing the structure of a subset formed in layer 4. Several subsets constitute a file. A subset positioned at the start of the file (to be referred to as a start subset hereinafter) has a structure different from that of a subset at other portions (to be referred to as a general subset hereinafter).

As shown in FIG. 22B, a start subset comprises a subset standard title identifier 164 as a subset header, an MMP file type 166, a subset ID number 168, subset linkage information 170, a pertinent file ID number 172, a page number 174, a position in page 176, a file name 178, a file structure type 180, a DOS file type 182, a DOS file attribute 184, a book name 186, a book ID number 188, a user data format type (UFT) 190, a subset data control header (SDCH) 192, and user data 194.

As shown in FIG. 22C, a general subset comprises a subset standard title identifier 164 as a subset header, a MMP file type 166, a subset ID number 168, a subset linkage information 170, a pertinent file ID number 172, a page number 174, a position in page 176, a book ID number 188, a user data format type (UFT) 190, a subset data control header (SDCH) 192, and user data 194.

The subset data control header (SDCH) 192 is a control header for restoring audio data, image data, text data, or data as a mixture thereof to recognizable information. For example, the subset data control header 192 defines a compression method, and the like.

The subset header is information only necessary for managing the subset and includes various parameter information to be requested by the DOS. These parameters are not always necessary because they may be usable in the application. The order is not limited to this, either.

More specifically, the subset standard title identifier 164 may be either the above-described set standard identification code itself or an identifier including it.

The MMP file type 166 will be described below. Files include an index file and a general file, as will be described later. An index file corresponds to a table of contents. For example, when the transfer medium 30 is provided in the form of a book with a plurality of pages, an index file is placed at the start of the book, in which a list is written to inform files and pages where the files are present. A normal block type device, i.e., a disk such as a floppy disk or a hard disk has a file directory entry and an FAT (File Allocation Table) where a table of contents including directory entry information, i.e., file names and the first sector or cluster numbers of the file names is written. Therefore, to use the MMP reproduction device 28 as a block type device equivalent to such a disk, a file corresponding to the file directory entry and FAT must be prepared as an index file. The MMP file type 166 is information used to distinguish between an index file and a general file.

The subset ID number 168 is the ID number of a subset. The subset linkage information 170 is information used to link subsets to form a file. The pertinent file ID number 172 is information representing a file to which a subset is assigned. The page number 174 and the position in page 176 are information representing a page and a position in the page, where the subset itself is present. The file name 178 is information representing a file name.

The file structure type 180 is information representing whether the file is a single file or a file of a subset link structure type. This information represents that the start subset constitutes one file, i.e., a single file, or that several subsets constitute one file.

The DOS file type 182 represents the file type defined on the DOS, which is generally called an extension. Therefore, the DOS file type 182 may be included in the file name 178. The DOS file attribute 184 also represents an attribute defined on the DOS, such as a read only file or a hidden file.

The book name 186 and the book ID number 188 represent the name of a book and an ID number for specifying the book when the MMP code indicates a book form.

The user data format type (UFT) 190 is used to identify the structure of the subset data control header (SDCH) 192 and parameters set thereto. More specifically, when a certain subset is a speech subset, a compression method, parameters associated with the compression method, a sampling frequency, parameters for quantization, and the like are set in the SDCH 192, as described above. Several types of SDCHs 192 are prepared, and the UFT 190 is used as information for selecting one of them.

FIGS. 23A to 23C are views showing various methods of using the subset standard title identifier 164.

FIG. 23A shows a general structure. This subset comprises the subset standard title identifier 164, a subset header 196 including the various above-described information, the user data format type (UFT) 190, the subset data control header (SDCH) 192, and the user data 194.

FIG. 23B shows a structure in which the subset header 196 is omitted because its content can be determined from the subset standard title identifier 164, e.g., "001". In this case, however, the user data format type 190 is not omitted because the structures or parameter structures of the subset data control header (SDCH) 192 and the user data 194 cannot be identified unless the user data format type (UFT) 190 is referred to.

FIG. 23C shows a structure in which the subset header 196 is omitted because its content can be determined from the subset standard title identifier 164, e.g., "002". In this case, however, the UFT 190 is not omitted because the structures or parameter structures of the subset data control header (SDCH) 192 and the user data 194 cannot be identified unless the UFT 190 is referred to. The SDCH 192 is omitted because the structure or parameter structure of the SDCH 192 can be determined from the UFT 190.

FIGS. 24A and 24B are views showing the structures of a general file and an index file in a file formed by linking subsets.

A general file has a structure in which a start subset as described above is placed at the start, and a plurality of general subsets are arranged subsequently, as shown in FIGS. 24A1 and 24A2.

To the contrary, an index file is constituted by one subset. The subset header is similar to a start subset. As shown in FIGS. 24B1 and 24B2, however, indices 198 corresponding to so-called file directory entries and FATs are written as the content of user data. Each index 198 represents a corresponding file. This index file may also be formed by linking several subsets, as a matter of course.

FIG. 25 is a view showing the relationship between subset elements, subsets, and a file. Referring to FIG. 25, SSECI represents subset element constitution information; SSE-H<An>, the nth subset element header of a subset A; SSE-UD<An>, the nth subset element user data of the subset A; SS-H<A>, the subset header of the subset A; SS-UD<A>, the subset user data of the subset A; ACH, an application control header; and AP-UD<A>, application user data A.

Subset elements in a super macro block from layer 3 are combined in layer 4 to generate a subset. Subsets are linked to form one file. The subset basically has a subset header, a subset data control header, and subset user data. Therefore, the content of the subset user data need not be known. Minimum necessary information for management, i.e., information representing the type of medium such as audio information or image information is written in the subset data control header. On the DOS, neither subset data control header nor subset user data need be referred to so that file management can be performed on the basis of only the subset header. As for a final file format processed by the application process, subset headers or subset data control headers of subsets A to D are acquired and linked to form one application control header. Alternatively, a specific subset header or user data of a specific subset forms one application control header in some cases.

The application control header has information representing the medium type of each user data and the method of thawing, i.e., recognizing the medium. The application control header also has information representing the arrangement of the application user data A to D on a sheet surface, a method of outputting audio data simultaneously in accordance with a certain operation of image data, or the structure of data corresponding to the respective subsets, i.e., the arrangement of data and the relationship therebetween on an application.

Figure 26:
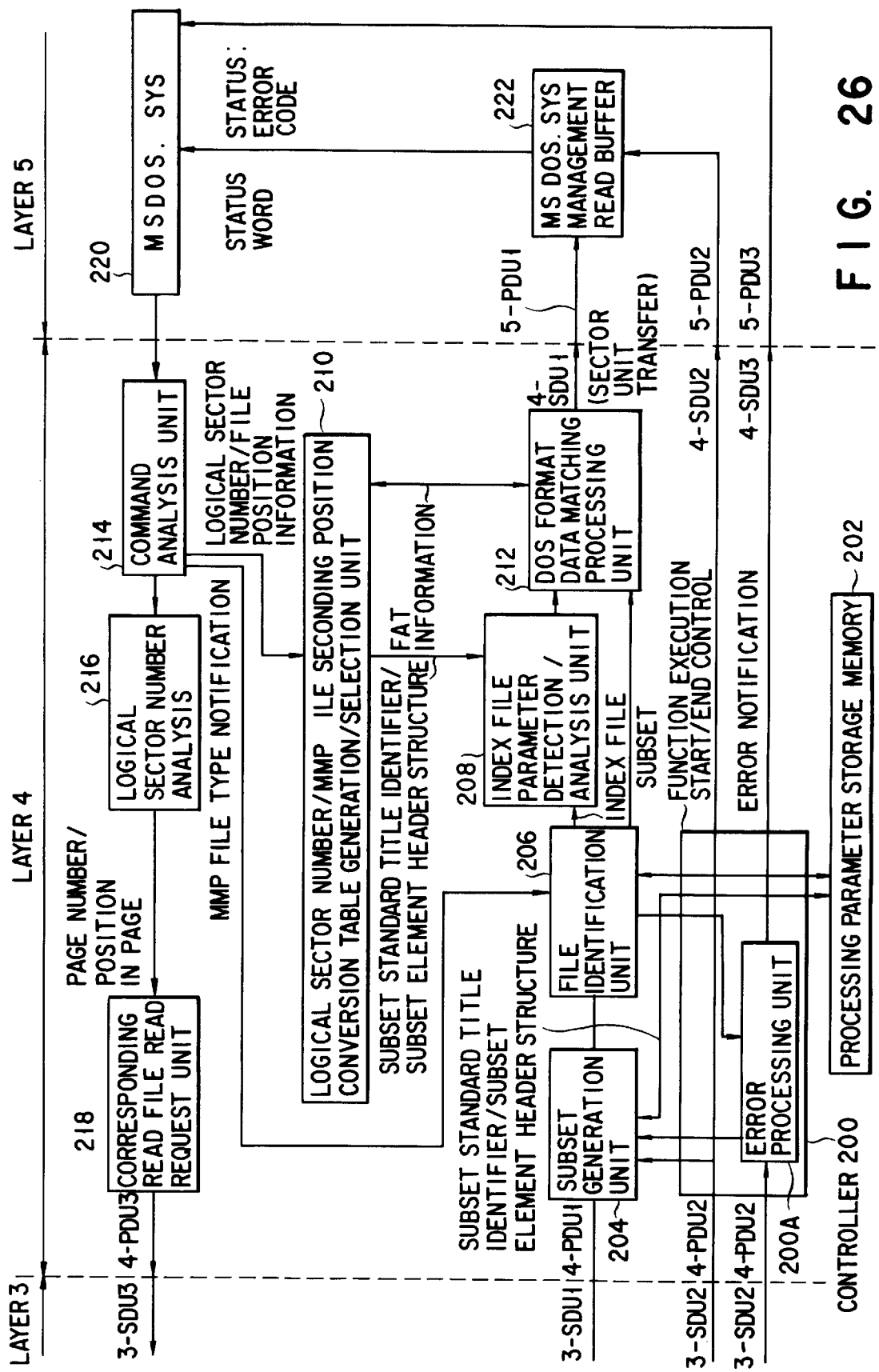
FIG. 26 is a functional block diagram showing the arrangement of layers 4 and 5 for an MMP reproduction device regarded as a block type device.

The structure of layers 4 and 5 for the MMP reproduction device 28 defined as a block type device will be described below with reference to a functional block diagram shown in FIG. 26.

Layer 4 comprises a controller 200 including an error processing unit 200A, a processing parameter storage memory 202, a subset generation unit 204, a file type identification unit 206, an index file parameter detection/analysis unit 208, a logical sector number/MMP file recording position conversion table generation/selection unit 210, a DOS format data matching processing unit 212, a command analysis unit 214, a logical sector number analysis unit 216, and a corresponding read file read request unit 218. Of these units, e.g., the file type identification unit 206 to the corresponding read file read request unit 218 are provided as a device driver MMP.SYS. More specifically, this MMP.SYS performs only read/write processing in units of sectors and stores data at a memory location designated by the DOS.

Layer 5 comprises an MSDOS.SYS 220 serving as a file management system and an MSDOS.SYS management read buffer 222 as a main memory location designated by the MSDOS.SYS.

The MSDOS.SYS 220 of layer 5 outputs a request for reading a certain file. For example, the MSDOS.SYS 220 outputs a command packet for reading a file having a file name "XXXXXXXX.MMP".

The command analysis unit 214 of layer 4 analyzes the content of the command packet output from the MSDOS.SYS 220. If it is a read command, a logical sector number included in the command packet is supplied to the logical sector number analysis unit 216.

That is, the MSDOS.SYS 220 basically only designates the sector number of a disk, i.e., only issues an instruction for reading a sector at that number. The logical sector number analysis unit 216 interprets the logical sector number from the MSDOS.SYS 220. When a file is to be read, the MSDOS.SYS 220 first designates to read the file directory entry and FAT, i.e., an index portion where the format is defined on the DOS. The sector number of a file directory entry is set at, e.g., "No. 1", in advance. Therefore, the MSDOS.SYS 220 outputs the sector number and a read command as a command packet. When the sector number corresponding to the file directory entry is designated from the MSDOS.SYS 220, the logical sector number analysis unit 216 designates the corresponding read file read request unit 218 to read the corresponding position in page.

The corresponding read file read request unit 218 designates the user to read a portion of a certain page of the book, i.e., to scan that portion, with a display or sound.

Using the service functions of layer 3 and the subsequent layers, data is acquired as 3-SDU1 and input as 4-PDU1 to the subset generation unit 204. The controller 200 receives the status signal 3-SDU2 as 4-PDU2 and controls the subset generation unit 204 in accordance with a function execution start/end control signal in the data 4-PDU2.

Upon reception of an instruction for starting function execution from the controller 200, the subset generation unit 204 uses parameters such as the subset standard title identifier and the subset element header structure stored in the processing parameter storage memory 202 to generate a subset from subset elements from layer 3. The resultant subset is supplied to the file type identification unit 206.

The file type identification unit 206 interprets the subset header 196 in the subset generated by the subset generation unit 204 and determines on the basis of the MMP file type 166 whether the subset is part of an index file or part of a general file. The MMP file type from the logical sector number analysis unit 216, i.e., information representing that the file is an index file or a general file is set in the file type identification unit 206 as a parameter. The file type identification unit 206 compares the MMP file type set from the logical sector number analysis unit 216 with that interpreted from the subset header 196. If the they are different from each other, the error processing unit 200A in the controller 200 performs necessary error processing.

For example, when the MSDOS.SYS 220 designates to read a file directory entry, this instruction corresponds to an instruction for reading an index file. Therefore, an MMP file type representing an index file is set as a parameter. If the MMP file type does not coincide with that interpreted from the subset header 196, the subsequent processing cannot be performed. For this reason, the error processing unit 200A sends an error notification to the MSDOS.SYS 220 and causes the MSDOS.SYS 220 to designate to read the index again.

If the MMP file type represents an index file, as has been requested, the file type identification unit 206 sends the index file to the index file parameter detection/analysis unit 208.

The index file parameter detection/analysis unit 208 extracts and analyzes necessary parameters in the supplied index file. More specifically, the file name, the first page number and position in page of the corresponding file are extracted from each index 198 written in the user data of the index file and sends these parameters to the logical sector number/MMP file recording position conversion table generation/selection unit 210.

The logical sector number/MMP file recording position conversion table generation/selection unit 210 prepares a conversion table in accordance with this information. More specifically, a logical sector number is appropriately assigned, and a list is prepared such that the logical sector number corresponds to a file location, i.e., the first page number of the corresponding file and the position in page. In addition, the FAT of the entry file is generated and set in the conversion table.

Upon reception of the content of the index file from the index file parameter detection/analysis unit 208 and the FAT information from the logical sector number/MMP file recording position conversion table generation/selection unit 210, the DOS format data matching processing unit 212 performs matching of the information with the data format on the DOS, i.e., the format of the file directory entry, and writes the data in the MSDOS.SYS management read buffer 222 of layer 5, i.e., the management buffer memory of the MSDOS.SYS 220 as 4-SDU1 in units of sectors.

With this processing, the MSDOS.SYS 220 can read out the data from the MSDOS.SYS management read buffer 222 and refer to the file directory entry list.

Upon detecting the presence of a file name, the MSDOS.SYS 220 outputs the corresponding sector number to the command analysis unit 214. In this case, this sector number corresponds to the sector number set by the logical sector number/MMP file recording position conversion table generation/selection unit 210.

With reference to the conversion table prepared by the logical sector number/MMP file recording position conversion table generation/selection unit 210, the logical sector number analysis unit 216 analyzes the file name and position corresponding to the sector number analyzed by the command analysis unit 214. The page number and position in page corresponding to the sector number are supplied to the corresponding read file read request unit 218. The corresponding read file read request unit 218 guides the user to read the page and the position in page.

The subset generation unit 204 generates a subset from subset elements read by the functions of layer 3 and the subsequent layers. The file type identification unit 206 identifies the file type. In this case, however, a general file must be read, and it is identified whether the file type represents a general file. If an index file is read, an error occurs.

If the file type represents a general file, data is sent to the DOS format data matching processing unit 212 in units of subsets, matched with data in the DOS format, and written in the MSDOS.SYS management read buffer 222 of layer 5.

Figure 27:
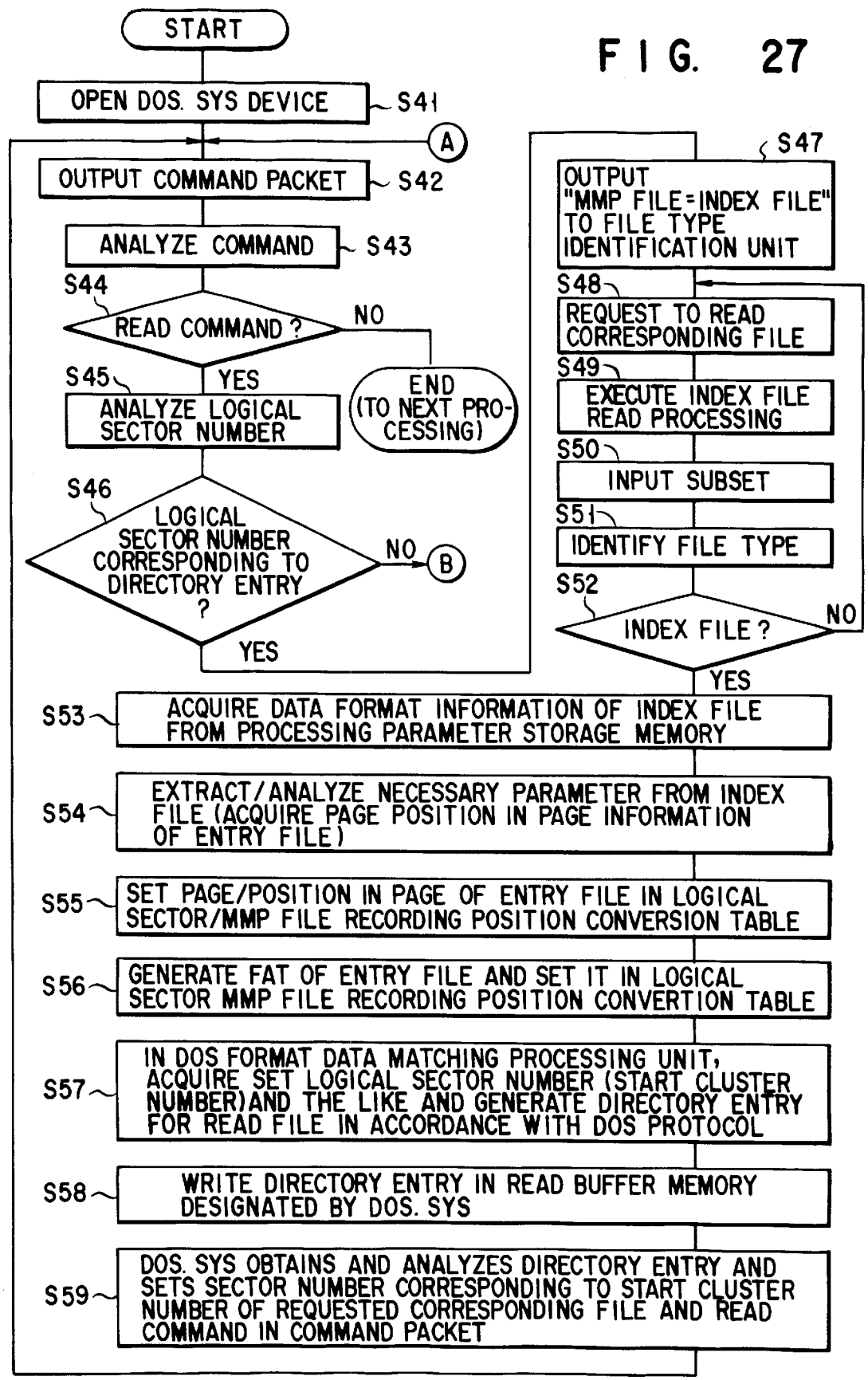
FIG. 27 is a flow chart for explaining the first half operation of the arrangement shown in FIG. 26.
Figure 28B:
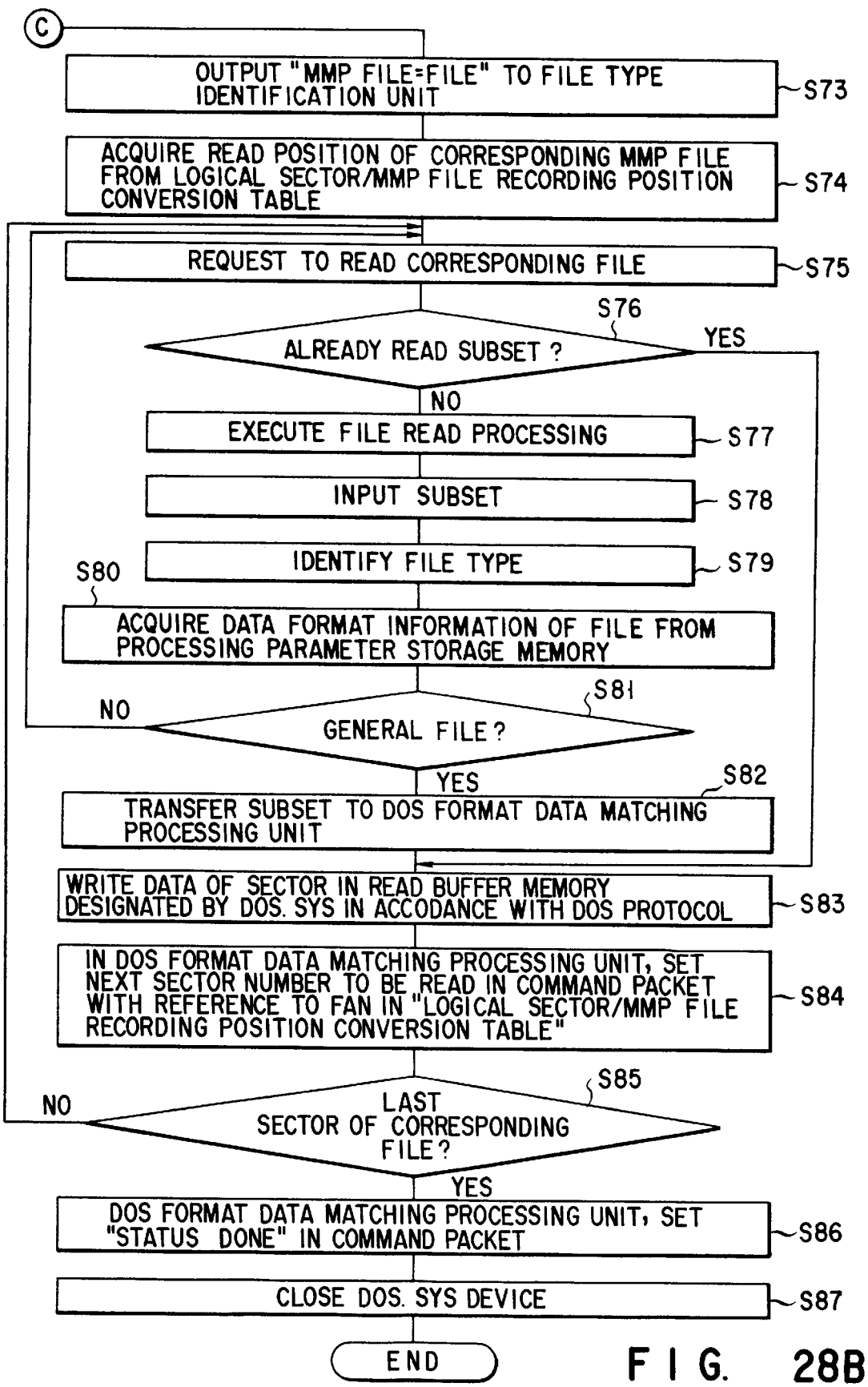

FIGS. 27, 28A and 28B are flow charts showing the operation in this arrangement.

First, the MSDOS.SYS 220 opens the device driver MMP.SYS (step S41) and outputs a command packet, as described above (step S42). More specifically, a read instruction and an instruction for reading a certain sector are set by the MSDOS.SYS 220 and output as a packet.

In the MMP.SYS, the command is analyzed by the command analysis unit 214 (step S43), and it is determined whether the command is a read command (step S44). If NO in step S44, the processing of this flow chart is ended. That is, the flow advances to another processing such as write processing.

If YES in step S44, the logical sector number analysis unit 216 analyzes the logical sector number (step S45) and determines whether the analysis result is a logical sector number corresponding to a directory entry (step S46).

If YES in step S46, an index file is read because a file corresponding to the logical sector number is an index file. Before this processing, an MMP file type notification, i.e., "MMP file=index file" is output to the file type identification unit 206 (step S47). The corresponding read file read request unit 218 is requested to read the corresponding file (step S48).

The corresponding read file read request unit 218 guides the user to read the corresponding file, i.e., a portion of a page of the book by using a scanner (not shown). In accordance with this guiding instruction, the user scans the index file by the scanner, and executes read processing of the index file by using the functions of layer 3 and the subsequent layers. As a result, a subset is generated by the subset generation unit 204 (step S49).

When this subset is input to the file type identification unit 206 of the MMP.SYS (step S50), the file type identification unit 206 identifies the file type of this subset (step S51). Since "MMP file=index file" is set from the logical sector number analysis unit 216, it is determined whether the identified file type is an index file (step S52). If NO in step S52, error processing is performed so that the flow returns to step S48 to repeat read request processing of the corresponding file again.

If YES in step S52, the file type identification unit 206 acquires the data format information of the index file from the processing parameter storage memory 202 (step S53). More specifically, to read, i.e., interpret the index file, the data format information registered in the processing parameter storage memory 202, which represents the index file structure, is read out. The index file and the readout data format information are sent to the index file parameter extraction/analysis unit 208.

The index file parameter extraction/analysis unit 208 uses the data format information to interpret the index file, extracts necessary parameters such as information of the page number and position in page of the entry file from the index file, and sends the information to the logical sector number/MMP file recording position conversion table generation/selection unit 210 (step S54).

The logical sector number/MMP file recording position conversion table generation/selection unit 210 sets the page number and position in page of the entry file in the target table logical sector number/MMP file recording position conversion table (step S55). More specifically, a table on which logical sector numbers are listed in advance is prepared, and information of the page number and position in page corresponding to the logical sector number is set in a table area provided in correspondence with the logical sector number.

The logical sector number/MMP file recording position conversion table generation/selection unit 210 generates the FAT of the entry file and sets the FAT in the logical sector/MMP file conversion table (step S56). The reason why the FAT is set in the table is as follows. The number of bytes of a sector is determined in advance. The MSDOS.SYS 220 manages a predetermined number of sectors in units called clusters. When an instruction is issued from the MSDOS.SYS 220, a sector number corresponding to a cluster number is designated. For this reason, when an MMP file is read, the file must be divided in accordance with the cluster size. For example, for subset data corresponding to a plurality of clusters, cluster numbers must be assigned to divide the data into units manageable by the MSDOS.SYS 220. Cluster linkage information for designating the next cluster is written in the FAT. Therefore, unless the FAT conversion table is prepared, the MSDOS.SYS 220 cannot be informed of the next sector to be read.

The DOS format data matching processing unit 212 receives the information of the content of the index file from the index file parameter extraction/analysis unit 208, acquires the logical sector number and the like set from the logical sector number/MMP file recording position conversion table generation/selection unit 210, generates a directory entry according to the DOS protocol of the read file, and issues the directory entry (step S57).

This issued directory entry is written in the read buffer memory designated by the MSDOS.SYS 220, i.e., the MSDOS.SYS management read buffer 222 (step S58).

The MSDOS.SYS 220 obtains the directory entry from the buffer 222 and interprets the directory entry. The MSDOS.SYS 220 sets the sector number corresponding to the start cluster number of the requested file and a read command in a command packet (step S59). The flow returns to step S42, and the command packet is output. More specifically, the MSDOS.SYS 220 obtains the content of the directory entry, interprets the directory entry in the MSDOS.SYS 220, determines the next portion to be read, and outputs the corresponding sector number.

By repeating this processing, all directory entries are obtained.

When the MSDOS.SYS 220 interprets the obtained directory entries, and a target file is detected, the MSDOS.SYS 220 outputs the logical sector number corresponding to the file as a command packet. In this case, it is determined in step S46 that the logical sector number does not correspond to a directory entry, and the flow advances to step S60.

With reference to the conversion table prepared by the logical sector number/MMP file recording position conversion table generation/selection unit 210, the logical sector number analysis unit 216 checks whether the logical sector number requested by the MSDOS.SYS 220 is the logical sector number corresponding to the end cluster number of the file (step S60). If NO in step S60, an MMP file type notification, i.e., "MMP file=general file" is output to the file type identification unit 206 (step S61). Subsequently, with reference to the conversion table prepared by the logical sector number/MMP file recording position conversion table generation/selection unit 210, the logical sector number analysis unit 216 acquires the read position of the corresponding MMP file (step S62), and requests the corresponding read file read request unit 218 to read the corresponding file (step S63).

The corresponding read file read request unit 218 determines whether the read position of the requested file is a position corresponding to the already readout subset (step S64). The reason for this is as follows. In a general disk, read processing of a target sector and instruction of the target sector by the DOS must be alternately repeated. In this embodiment, however, an aggregate of subsets are temporarily read out and issued in units of sectors because a sector issued to layer 5 is smaller than a subset. Since the sector designated by the MSDOS.SYS 220 may be included in the already readout subset, check processing is performed. If YES in step S64, the flow advances to step S71 as will be described later.

If NO in step S64, the corresponding read file read request unit 218 guides the user to read a portion of a certain page of the book by using a scanner (not shown). In accordance with this instruction, the user scans the file by the scanner and uses the functions of layer 3 and the subsequent layers to execute read processing of the file. As a result, a subset is generated by the subset generation unit 204 (step S65).

When this subset is input to the file type identification unit 206 (step S66), the file type identification unit 206 identifies the file type of this subset (step S67), acquires the data format information of the file from the processing parameter storage memory 202 (step S68), and interprets the content of the subset. With this processing, it can be determined whether the file is an index file or a general file. "MMP file=general file" is set from the logical sector number analysis unit 216. Therefore, if the identified file type does not represent a general file (step S69), the flow returns to step S63 to repeat read request processing of the corresponding file again.

If the file type represents a general file, the subset is sent to the DOS format data matching processing unit 212 (step S70).

With reference to the FAT information in the conversion table prepared by the logical sector number/MMP file recording position conversion table generation/selection unit 210, the DOS format data matching processing unit 212 sets the next sector number to be read in a command packet (step S71), and writes the data of the readout sector in the MSDOS.SYS management read buffer 222 in accordance with the DOS protocol (step S72). More specifically, the data is issued in a data format according to the DOS protocol, i.e., in units of sectors. Simultaneously, to inform the MSDOS-.SYS 220 of the next sector number to be read, the next sector number is set in the command packet and the data is written in the buffer 222.

Thereafter, the flow returns to step S42 to repeat the above processing.

When the logical sector number requested by the MSDOS.SYS 220 coincides with a logical sector number corresponding to the end cluster number of the file (step S60), the flow advances to step S73.

The logical sector number analysis unit 216 outputs an MMP file type notification, i.e., MMP file=general file" to the file type identification unit 206 (step S73). With reference to the conversion table prepared by the logical sector number/MMP file recording position conversion table generation/selection unit 210, the logical sector number analysis unit 216 acquires the read position of the corresponding MMP file (step S74), and requests the corresponding read file read request unit 218 to read the corresponding file (step S75).

The corresponding read file read request unit 218 determines whether the read position of the requested file is a position corresponding to the already readout subset (step S76). If YES in step S76, the flow advances to step S83.

If NO in step S76, the corresponding read file read request unit 218 guides the user to read the corresponding file, i.e., a portion of a certain page of the book by using a scanner (not shown). In accordance with this instruction, the user scans the file by the scanner and uses the functions of layer 3 and the subsequent layers to execute read processing of the file. As a result, a subset is generated by the subset generation unit 204 (step S77).

When this subset is input to the file type identification unit 206 of the MMP.SYS (step S78), the file type identification unit 206 identifies the file type of the subset (step S79), acquires the data format information of the file from the processing parameter storage memory 202 (step S80), and interprets the content of the subset. With this processing, it can be determined whether the file is an index file or a general file. "MMP file=general file" is set from the logical sector number analysis unit 216. Therefore, if the identified file type does not represent a general file (step S81), the flow returns to step S75 to repeat read request processing of the corresponding file again.

If the identified file type represents a general file, the subset is sent to the DOS format data matching processing unit 212 (step S82).

The DOS format data matching processing unit 212 writes the data of the readout sector in the MSDOS.SYS management read buffer 222 in accordance with the DOS protocol (step S83). In addition, with reference to the FAT information in the conversion table prepared by the logical sector number/MMP file recording position conversion table generation/selection unit 210, the DOS format data matching processing unit 212 sets the next sector number to be read in a command packet (step S84).

It is determined whether the sector number corresponds to the last sector of the file, i.e., whether the sector number corresponds to the last sector, i.e., the last read cluster requested by the MSDOS.SYS 220 (step S85). If NO in step S85, the above processing from step S75 is repeated.

If the sector number corresponds to the last sector of the file, i.e., the last sector which can be input to the MSDOS-.SYS 220, the DOS format data matching processing unit 212 sets "status=DONE" in the command packet (step S86).

The MSDOS.SYS 220 reads out this status from the MSDOS.SYS management read buffer 222 and closes the device driver MMP.SYS (step S87), thereby ending the file read processing.

Figure 29:
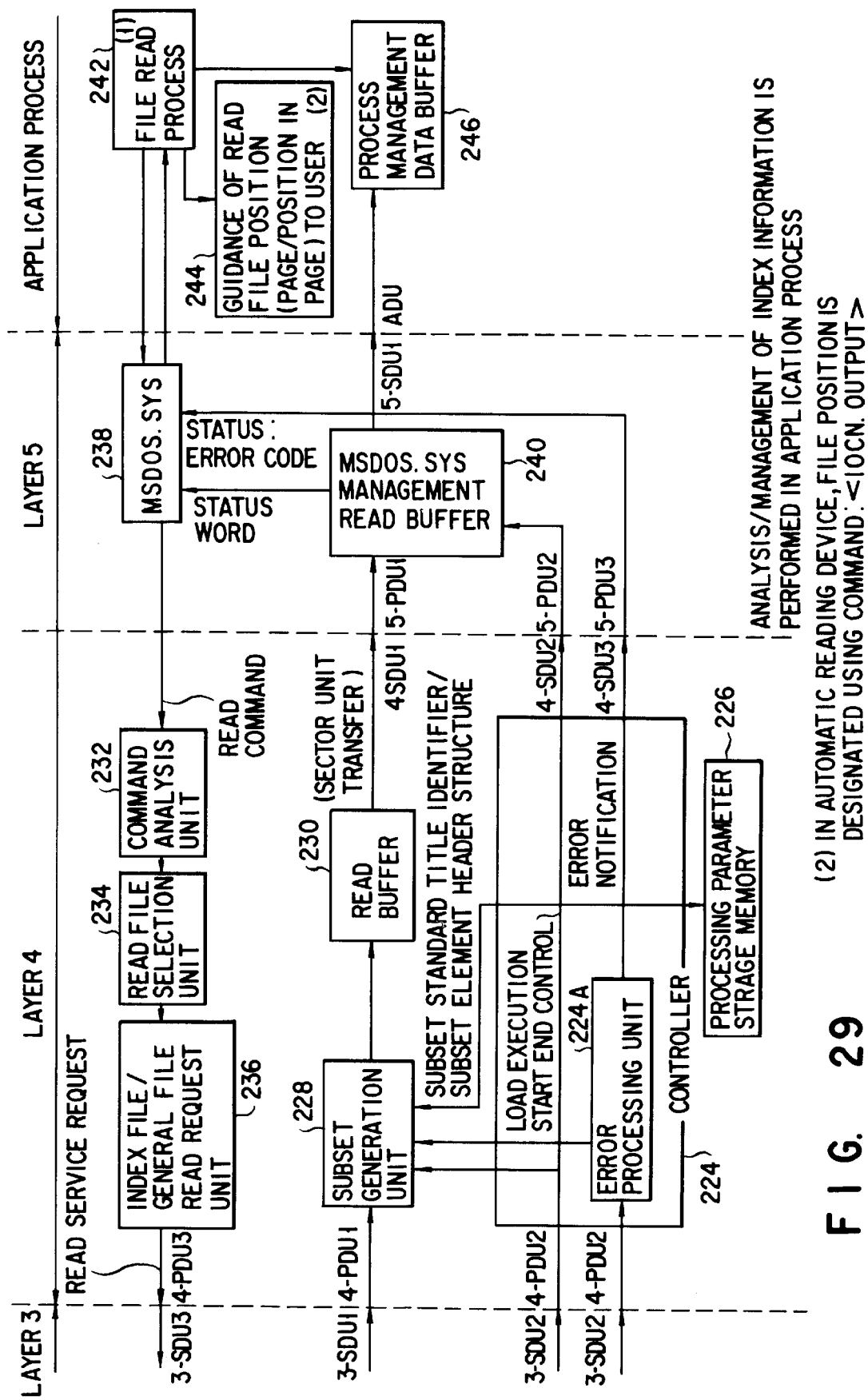
FIG. 29 is a functional block diagram showing the arrangement of layers 4 and 5 for an MMP reproduction device regarded as a character type device.

The arrangement including layers 4 and 5 and the application process for the MMP reproduction device 28 regarded as a character type device will be described below with reference to a functional block diagram shown in FIG. 29.

Layer 4 comprises a controller 224 including an error processing unit 224A, a processing parameter storage memory 226, a subset generation unit 228, a read buffer 230, a command analysis unit 232, a read file selection unit 234, and an index file/general file read request unit 236. Of these units, for example, the read buffer 230 to the index file/general file read request unit 236 are provided as a device driver MMP.SYS. In this case, the MMP.SYS performs read/write processing in units of bytes and stores data at a memory position designated by the application.

Layer 5 comprises an MSDOS.SYS 238 serving as a file management system, and an MSDOS.SYS management read buffer 240.

The application process comprises a file read process 242, a read file position 244, and a process management data buffer 246.

The file read process 242 is a read subroutine in the application process, which issues a file read request including a read file position to the MSDOS.SYS 238. Simultaneously, the file read process 242 guides the user to scan the file by using a scanner (not shown) with a display unit or sound output device (not shown).

Upon reception of a request from the file read process 242, the MSDOS.SYS 238 outputs a read command.

The command analysis unit 232 of the MMP.SYS analyzes the command. If the command is a read command, a read file position is output to the read file selection unit 234.

The read file selection unit 234 selects the read file. In fact, this processing means a selection operation by the user because the file to be scanned is designated in the application process.

The index file/general file read request unit 236 outputs a read service request signal to layer 3 and the subsequent layers.

The subset generation unit 228 generates a subset under the control of the controller 224, as in the above-described block type device.

The read buffer 230 temporarily stores the subset generated by the subset generation unit 228 and transfers the subset to the MSDOS.SYS management read buffer 240 visible from the MSDOS.SYS 238 in units of bytes.

The data temporarily stored in the MSDOS.SYS management read buffer 240 is accumulated in the process management data buffer 246 as an application data unit.

Figure 30:
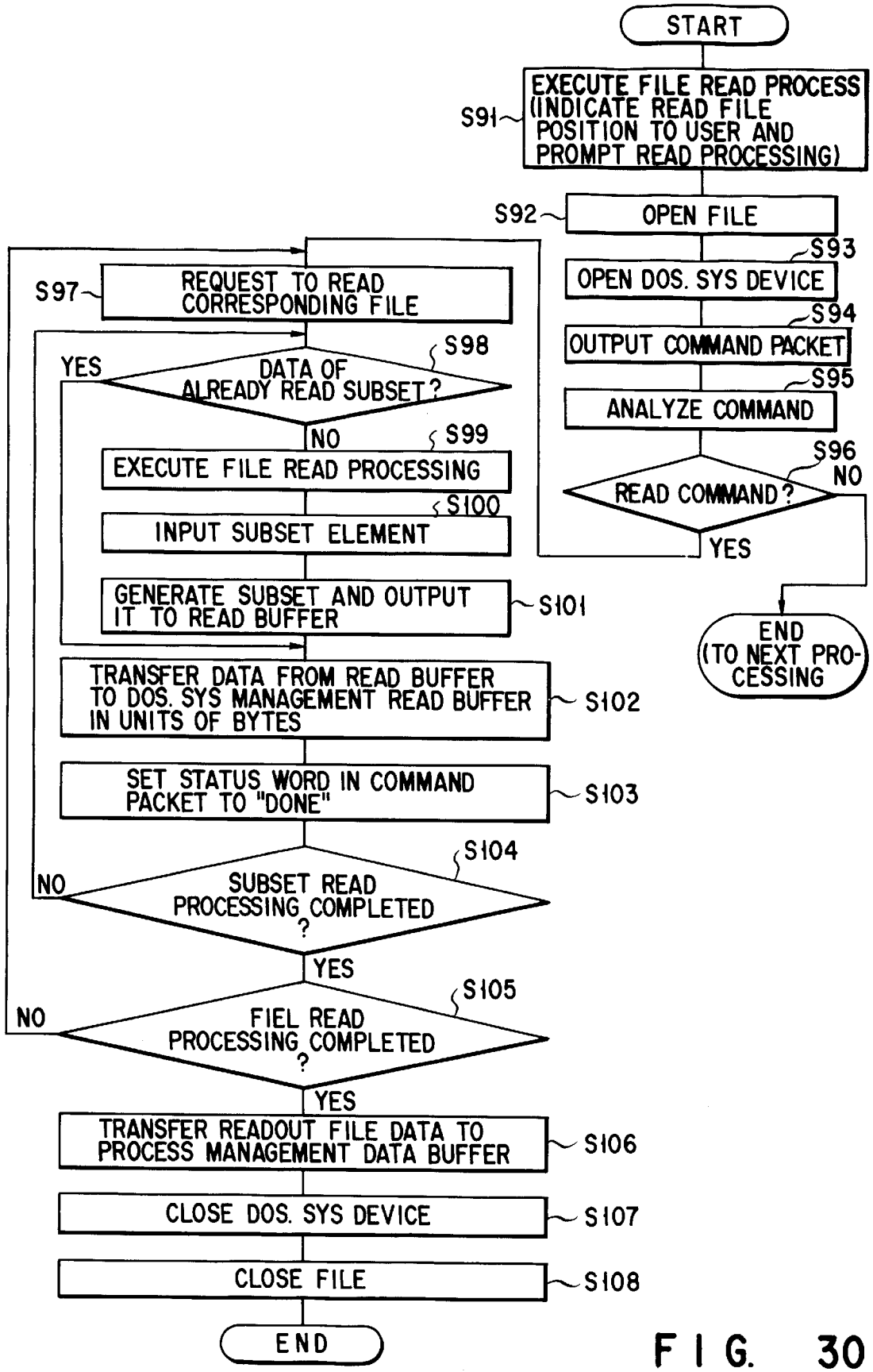
FIG. 30 is a flow chart for explaining the operation of the arrangement shown in FIG. 29.

FIG. 30 is a flow chart showing an operation in this arrangement.

First, the file read process 242 is executed. A file read request including a read file position is output to the MSDOS.SYS 238, and at the same time, the read file position is indicated to the user (step S91).

The MSDOS.SYS 238 opens the file (step S92), opens the device driver MMP.SYS (step S93), and outputs a command packet (step S94).

The command analysis unit 232 analyzes this command (step S95). If the command is not a read command (step S96), the flow advances to another processing corresponding to the command.

If the command is a read command, a file read request is issued to the read file selection unit 234 (step S97) to prompt the user to perform an actual read operation.

The index file/general file read request unit 236 determines whether the read position of the requested file is a position corresponding to the already readout subset (step S98). If YES in step S98, the flow advances to step S102.

If NO in step S98, the index file/general file read request unit 236 uses the functions of layer 3 and the subsequent layers to execute file read processing (step S99).

As a result, subset elements are input from layer 3 to the subset generation unit 228 (step S100). A subset is generated by the subset generation unit 228 and output to the read buffer 230 (step S101).

The data is transferred from the read buffer 230 to the MSDOS.SYS management read buffer 240 in units of bytes (step S102).

Upon completion of transfer, the controller 224 sets the status word in the command packet to "DONE" by 4-SDU2 (step S103).

The MSDOS.SYS 238 determines whether subset read processing is completed (step S104). If NO in step S104, the flow returns to step S98 to repeat the above processing.

If YES in step S104, the MSDOS.SYS 238 determines whether file read processing is completed (step S105). If NO in step S105, the flow returns to step S97 to repeat the above processing.

If YES in step S105, the read file data is transferred from the MSDOS.SYS management read buffer 240 to the process management data buffer 246 (step S106).

The MSDOS.SYS 238 closes the device driver MMP.SYS (step S107) and closes the file (step S108), thereby ending the processing.

The process management data buffer 246 is not always necessary, and only the storage position of the MSDOS.SYS management read buffer 240 may be informed.

Embodiments of the present invention based on the above summary and assumption will be described below with reference to the accompanying drawings.

FIG. 1 is a block diagram showing the first embodiment of the present invention.

Referring to FIG. 1, a detection unit 300, a scan conversion unit 302, a data array adjustment unit 308, and an error correction unit 310 have the same functions as those of U.S. Ser. No. 08/407,018 shown in FIG. 31.

An output device 365 is constituted by a loudspeaker or a headphone for obtaining an audio output, various display units for obtaining an image output, or a printer or facsimile apparatus for obtaining a data output.

More specifically, the detection unit 300 serves as a read means for optically reading a code from a recording medium having a portion where multimedia information including at least one of audio information, video information, and digital code data is recorded as an optically readable code.

The scan conversion unit 302 and the data array adjustment unit 308 serve as a restoration means for demodulating the code read by the detection unit 300 serving as the read means and outputting demodulated data.

The error correction unit 310 serves as a reproduction means for performing processing associated with error correction in units of partial data blocks each consisting, as a unit, of an aggregate of a predetermined amount of demodulated data output from the data array adjustment unit 308 serving as the restoration means.

The output device 365 serves as an output means for acquiring a predetermined number of partial data blocks output from the error correction unit 310 serving as the reproduction means to form final output data and outputting the data as the recognizable original multimedia information.

In the information reproduction system for reproducing multimedia information recorded as a dot code, as is apparent from the above-described assumption, a status signal representing a subset element (SSE) as an error portion data block for which error correction by the error correction unit 310 has failed and an error remains, or an omitted SSE is output from the error correction unit 310, together with a subset element (SSE) as a partial data block for which error correction is completed.

Subset elements are sequentially output from the error correction unit 310. At this time, subset elements in which errors remain can be known from information (status signal) from layer 3.

An SSE link unit 360 performs processing of generating a subset from subset elements in layer 4 by linking the subset elements from the error correction unit. Simultaneously, an error SSE detection unit 361 detects an error subset element on the basis of the status signal accompanying the subset element.

When the linked subset is output while an error subset element remains, error noise is generated at that portion in the output device 365. The above processing is performed to prevent such error noise.

More specifically, in this embodiment, an error change unit 362 performs appropriate error change processing for preventing error noise at an error subset element portion in the subset from the SSE link unit 360 on the basis of the error subset element from the error SSE detection unit 361.

For the subset for which appropriate error change processing is performed by the error change unit 362 to prevent error noise, a series of processes necessary for output processing are performed by a reproduction processing unit 363. Thereafter, the subset is output to the output device 365.

Referring to FIG. 1, reference numeral 400 denotes a system controller for controlling the entire information reproduction system. The system controller 400 is constituted by peripheral circuits such as a CPU, a ROM, and a RAM.

FIG. 2 is a flow chart for explaining the operation of the first embodiment.

In error correction performed by the error correction unit 310, it is determined whether error correction is successfully performed (steps S1 and S2).

If YES in step S2, subset elements generated and output from the error correction unit 310 are linked by the SSE link unit 360 to generate and output a subset (steps S3 to S5).

If NO in step S2, the error SSE detection unit 361 detects an error subset element from the status signal accompanying the error subset element on the basis of the error subset element generated and output from the error correction unit (steps S6 and S7).

Simultaneously, the error SSE detection unit 361 links subset elements including the error subset element to generate and output a subset (step S8).

At this time, the error change unit 362 recognizes, on the basis of the error subset element detected in step S7, the error portion in the subset output from the SSE link unit 360, and outputs a subset with the error portion for which appropriate error change processing is performed to prevent error noise (steps S9, S10, and S5).

In this manner, in the first embodiment, a portion where noise is generated in the reproduction signal can be detected during reproduction signal generation processing. Therefore, the reproduction signal can be output while suppressing noise.

In the first embodiment, the error SSE detection unit 361 serves as an error partial data block detection means for detecting an omitted portion or a portion for which error correction by the reproduction means has failed as an error partial data block in units of partial data blocks.

The error change unit 362 serves as a data change means for recognizing the error partial data block detected by the error partial data block detection means and correcting/changing data of a portion corresponding to the error partial data block.

FIGS. 3A to 3C are views showing examples of error change processing executed by the error change unit 362 in the first embodiment in detail.

FIG. 3A shows processing applied in reproduction of speech information. The error change unit 362 changes a volume control signal in correspondence with an error subset element portion in a speech subset so that the volume is decreased at that portion.

FIG. 3B shows processing applied in reproduction of image information. The error change unit 362 performs filtering processing using, e.g., a low-pass filter for removing noise at a peripheral or neighboring portion of an error subset element portion in one frame, thereby changing a filtering control signal for correcting and reducing the error portion.

FIG. 3C shows a modification of FIG. 3B. The error change unit 362 changes an image control signal for setting the average value of four subset elements a to d adjacent to an error subset element as the value of this element.

More specifically, the error change unit 362 in the first embodiment receives a subset (SS) signal and a detected error subset element (SSE) to detect an error portion, and changes the error portion in the SS signal in a predetermined form, or changes a control signal representing an output method.

With this processing, an error portion in a speech or image signal is interpolated using peripheral signals and reproduced.

For speech information, the control signal can also be changed such that the volume at the error portion is decreased at the time of reproduction.

In addition, simple noise removing filtering processing may be performed (e.g., a low-pass filter is used as a noise removing filter).

Figure 4A:
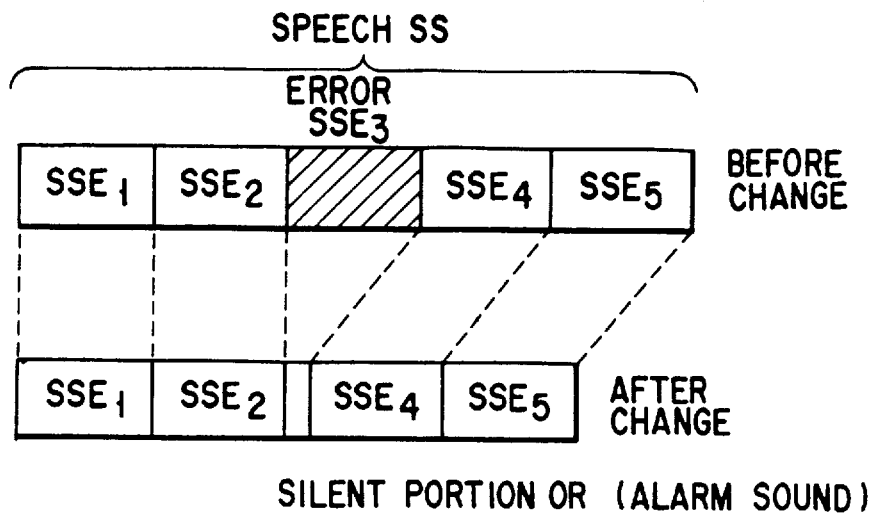
FIGS. 4A and 4B are views showing other examples of error change processing in the first embodiment.
Figure 4B:
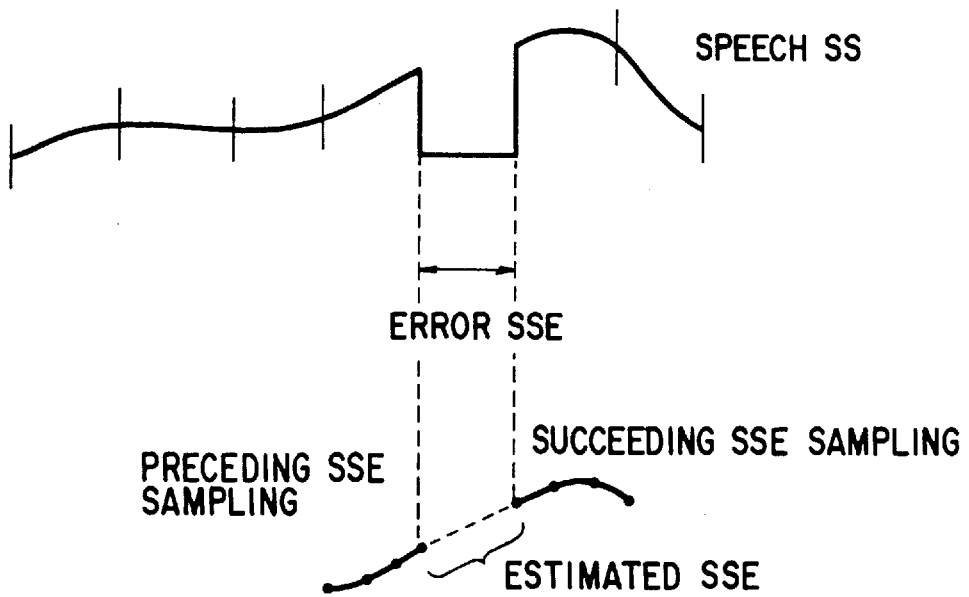

FIGS. 4A and 4B show other examples of error change processing executed by the reproduction processing unit 363 in the first embodiment.

FIG. 4A shows an example wherein an error SSE in a speech SS signal is deleted, and a substitute signal (silent portion) is inserted in the speech SS signal.

When an error subset element SSE3 is simply deleted, and a signal is reproduced, subset elements SSE2 and SSE4 are connected to result in unnatural reproduction. To prevent this disadvantage, a silent portion is inserted between the subset elements SSE2 and SSE4.

This silent portion may be replaced with an alarm sound for informing the operator of the presence of an error. In this case, the operator is promoted to perform an input operation (a scanning operation in this case) again.

FIG. 4B shows an example wherein a signal at an error portion is estimated from signals surrounding the error portion in, e.g., a speech SS signal and is used as a substitute signal to replace the error portion.

More specifically, as shown in FIG. 4B, sampling of a previous SSE and a subsequent SSE is performed. The signal of an error SSE is replaced with an estimation signal by using spline interpolation.

To insert a substitute signal in, e.g., an image signal, predetermined luminance level data may be inserted in the deleted portion.

Figure 5:
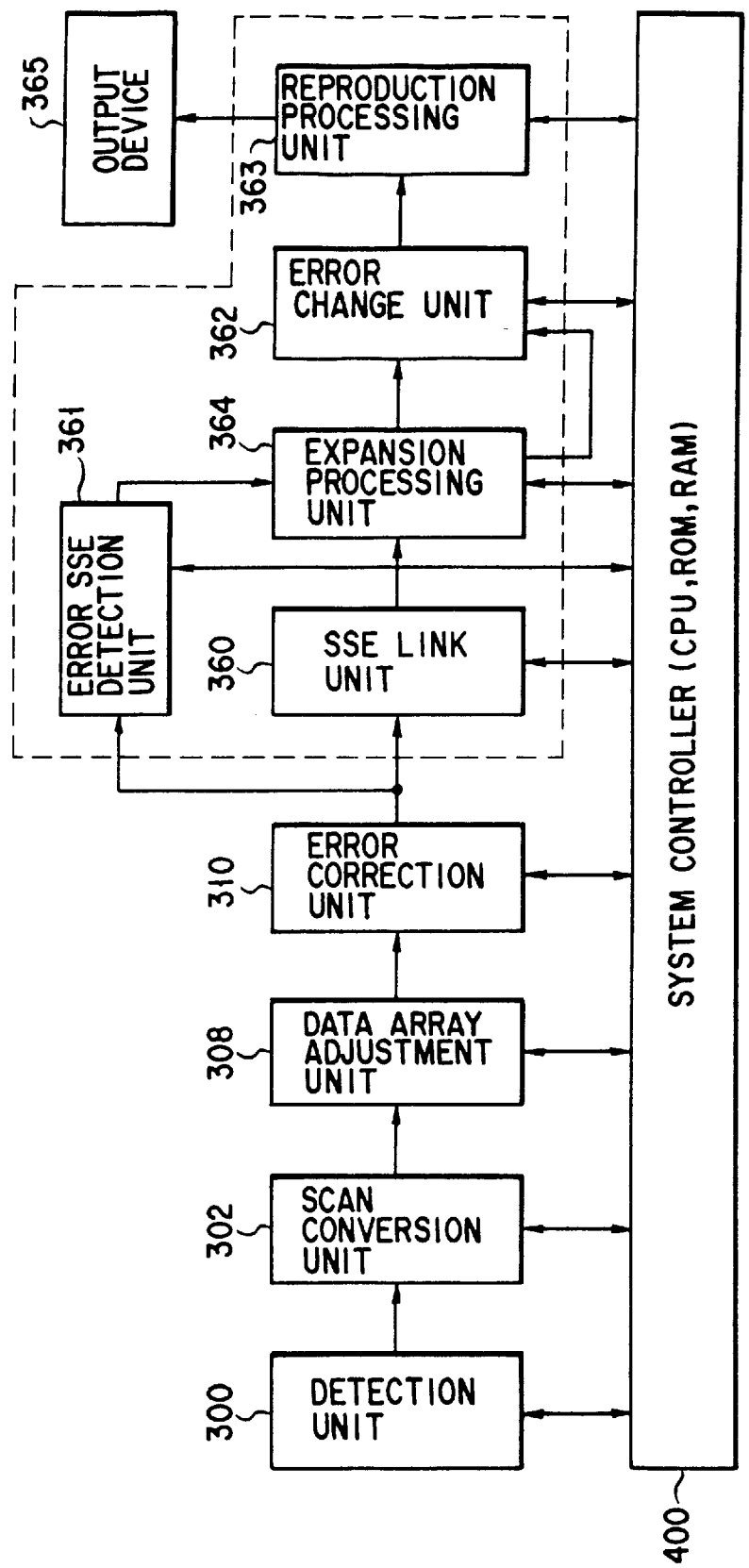
FIG. 5 is a block diagram showing the arrangement of the second embodiment of the present invention.

FIG. 5 is a block diagram showing the second embodiment of the present invention.

The second embodiment is applied to an information reproduction system for reproducing image or speech information which is compressed and recorded.

The same reference numerals as in FIG. 1 denote the same parts in FIG. 5, and a detailed description thereof will be omitted. FIG. 5 differs from FIG. 1 in that an expansion processing unit 364 is inserted between an SSE link unit 360, an error SSE detection unit 361, and an error change unit 362.

Image or speech information is often compressed and recorded. In such a case, after data passes through the expansion processing unit 364, partial signals within a range influenced by an error SSE are rewritten by appropriate change processing by the error change unit 362.

For example, when an SSE is omitted in a code of speech information compressed by CELP or the like, information portions except for the omitted SSE, for which reproduction signals can be generated, are normally reproduced. However, by the signal of the omitted SSE noise is generated in a portion for which a reproduction signal is to be generated. Therefore, a volume control signal is changed by the error change unit 362, as in the first embodiment, thereby decreasing the volume and reproducing the information, as shown in FIG. 6.

Figure 6:
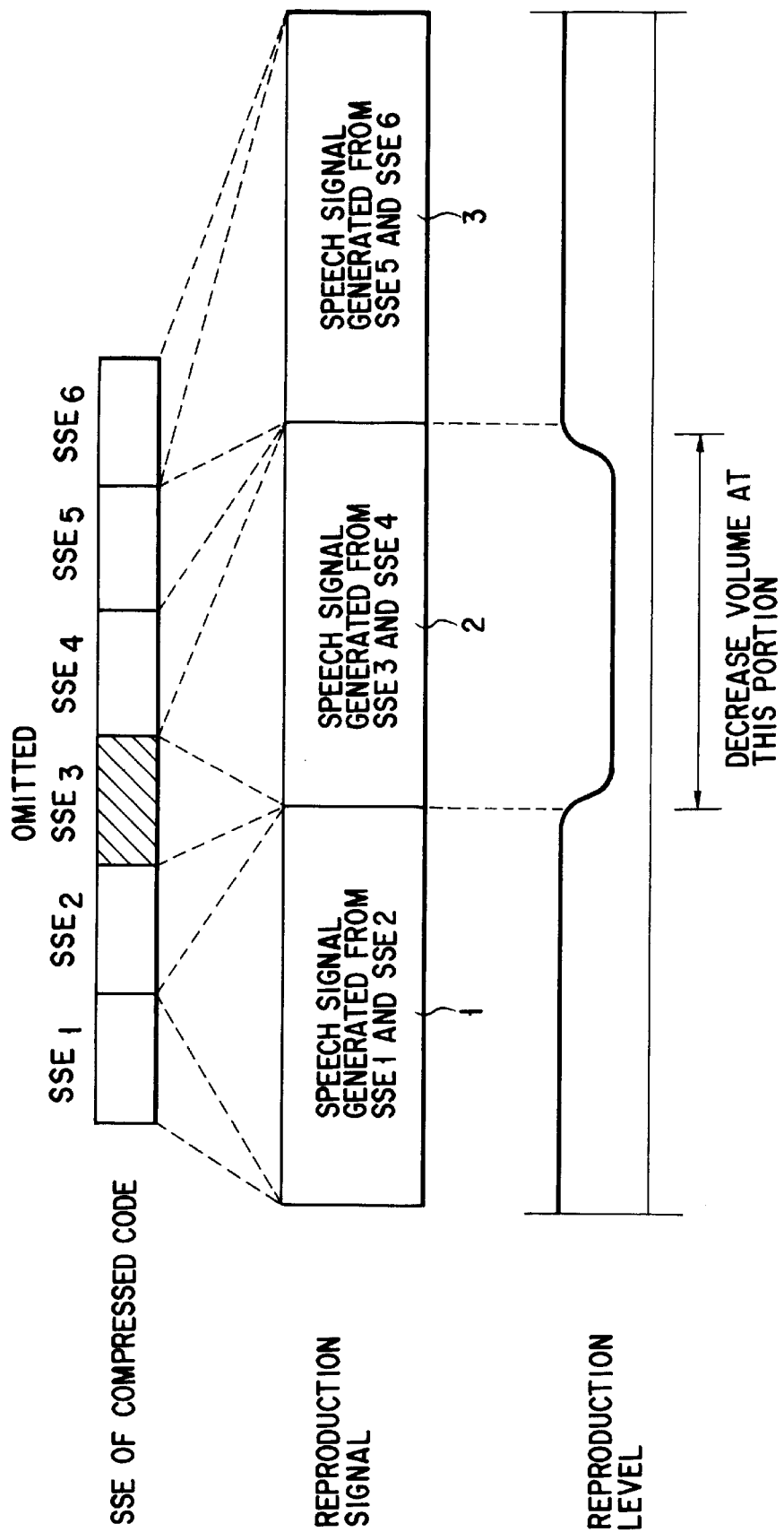
FIG. 6 is a view showing an example of error change processing in the second embodiment.

More specifically, as shown in FIG. 6, a compressed code of speech information has subset elements SSE1 to SSE6. In this state, the subset elements SSE1 and SSE2, SSE3 and SSE4, and SSE5 and SSE6 are sequentially used to output reproduction signals 1 to 3. At this time, if the subset element SSE3 is detected as an error subset element in expansion processing, it is found that the error has propagated throughout the range of reproduction signal 2. Therefore, the reproduction level is decreased at a portion corresponding to reproduction signal 2 in error change processing, thereby outputting the reproduction signal.

A case wherein the second embodiment is applied to reproduction of image information will be described below.

Figure 7A:
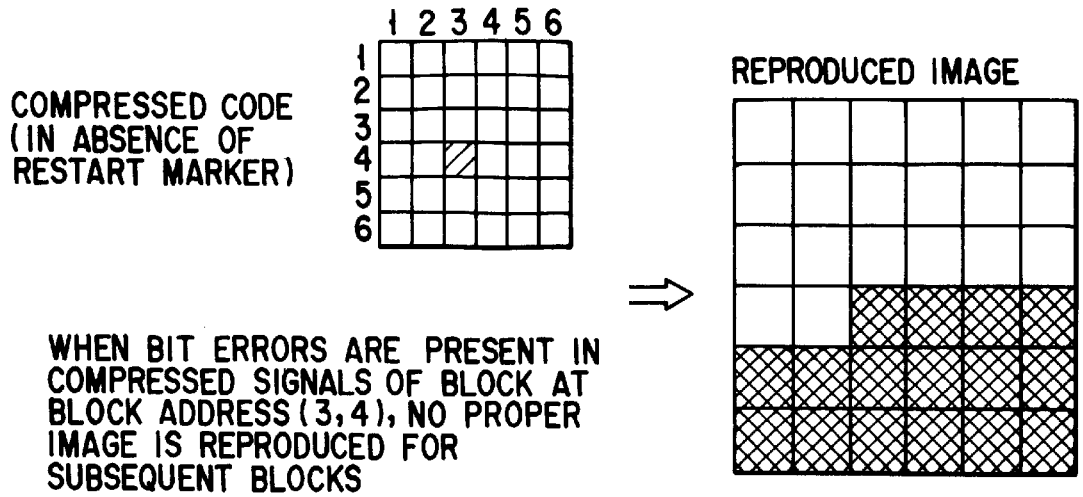
FIGS. 7A and 7B are views showing another example of error change processing in the second embodiment.

As shown in FIG. 7A, in an image signal compressed by JPEG, even one bit error causes errors in all subsequent blocks.

Figure 7B:
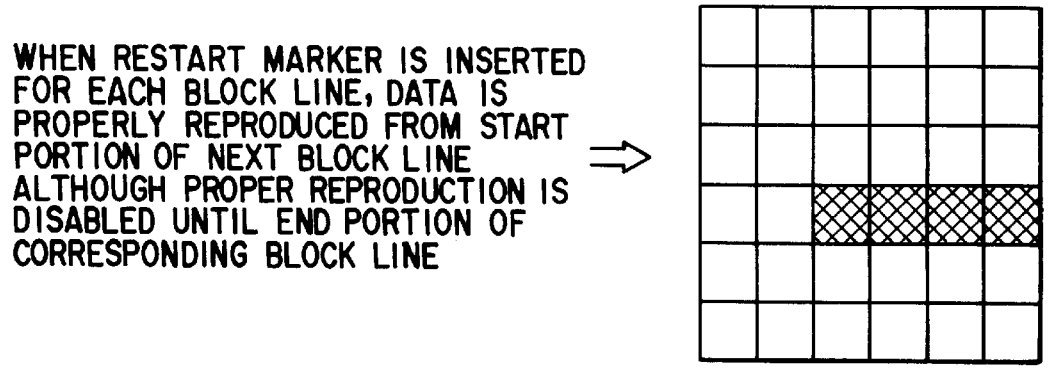

To minimize the influence of the error, a code called a restart marker is used, as shown in FIG. 7B. When a bit error occurs in a compressed signal in which a restart marker is inserted, the error is liable to propagation in all subsequent blocks, though the error does not propagate to blocks after the restart marker.

When a restart marker is inserted to the end portion of each block line, the influence of the bit error is confined within only the corresponding block line.

In expansion processing by the expansion processing unit 364, by detecting the restart marker to find a block in the compressed code, which corresponds to the error SSE, it is found that blocks up to the next restart marker cannot be properly displayed. Therefore, when these blocks are to be displayed, a display control signal from the error change unit 362 is changed. With this processing, a more natural image can be reproduced while correcting the error blocks.

More specifically, the expansion processing unit 364 receives a signal representing the error bit position from the start of the compressed code, in relation to the correspondence between the error SSE and the block in the compressed code, from the error SSE detection unit 361, and counts the number of expanded blocks while performing expansion processing, thereby obtaining a block number including the error bit.

On the basis of this block number, the error change unit 362 rewrites, e.g., a partial signal of the reproduction signal, thereby changing the blocks from the block number to the next restart marker.

As described above, in the second embodiment, when an SS signal is a compressed code, a signal after expansion processing is corrected on the basis of the information of an error portion obtained during expansion processing. In a compressed code, the range of noise generated upon decoding the error SSE cannot be determined until the signal is actually decoded (expanded). However, with the above processing, noise in the signal after expansion processing can be suppressed.

Figure 8:
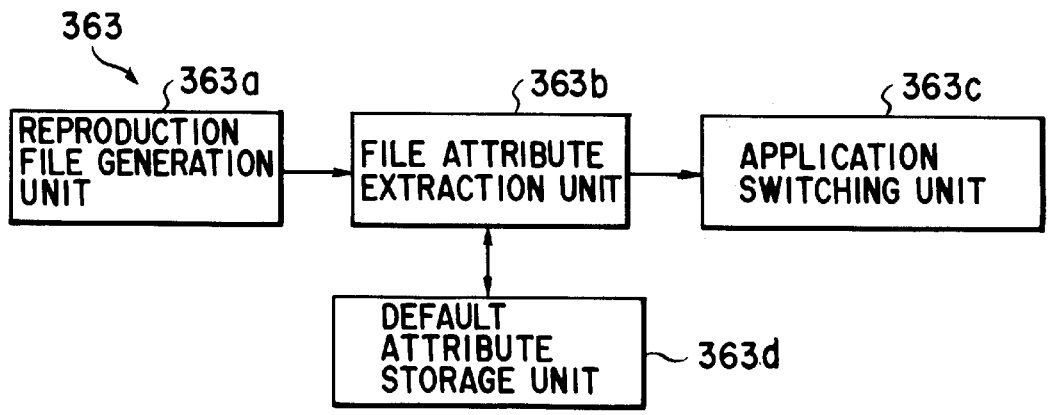
FIG. 8 is a block diagram showing the arrangement of the third embodiment of the present invention.

FIG. 8 is a block diagram showing the main part of the third embodiment, in which a portion constituted as part of the reproduction processing unit 363 in the first or second embodiment is shown.

As described in the first and second embodiments, appropriate error change processing is performed for an SS having an omitted SSE of an SSE for which error correction by the error correction unit 310 has failed, and finally, the SS is subjected to necessary processing (file formation and the like) by the reproduction processing unit 363 and output. In the third embodiment, when the header of a file generated from the subsets (SS) is destroyed and incomplete, the attribute is replaced with a default value, thereby performing processing as rationally as possible.

If the header of a subset is destroyed, the attribute cannot be determined. For this reason, when the data is output as an application, it cannot be identified whether the data is speech, image, or text data.

In view of this problem, as shown in FIG. 8, a reproduction file is prepared by a reproduction file generation unit 363a in the reproduction processing unit 363. In a complete file header, when the file attribute is extracted by a file attribute extraction unit 363b from the file header information of the reproduction file, the content of the reproduction file is output from an application switching unit 363c in accordance with the file attribute extracted on the basis of the file header information. However, if the file header extracted by the file attribute extraction unit 363b is incomplete, a default value recorded in advance in a default attribute storage unit 363d is read out and used to replace the incomplete file header, thereby performing the subsequent processing.

Since a file is generally repeatedly reproduced in many cases, the attribute information of a file header in a previous output reproduction signal can be used as default attribute information stored in advance in the default attribute storage unit 363d.

With this processing, data is output in some form. The operator can be notified of the presence of an error on the basis of the output result. In addition, the probability for outputting proper data can be increased by using the most likely default attribute.

The default attribute information may be selected and switched such that, as the default attribute information, an attribute most frequently used in units of media, in units of operators, or in units of operation periods is set.

When an attribute of the same medium is used, data can be conveniently obtained from, e.g., a book consisting of speech information.

In addition, if the application purpose of each operator is relatively fixed, the attribute can be effectively estimated from the past use of each operator.

Similarly, the default information can also be effectively estimated from several immediately preceding uses.

In each of the above embodiments, a means for notifying the operator in advance of processing such as change/correction output, estimation signal output, default attribute estimation for an error portion can be effectively added. This arrangement allows output confirmation by the operator, so that data can be output on the basis of confirmation of the operator.

As the notification means, character information may be displayed on a monitor, an icon or an alarm sound may be output, or a warning LED may be turned on.

The present invention has been described above on the basis of the first to third embodiments. However, the present invention is not limited to the above embodiments, and various changes and modifications can be made within the spirit and scope of the present invention.

Additional embodiments of the present invention will be apparent to those skilled in the art from consideration of the specification and practice of the present invention disclosed herein. It is intended that the specification and examples be considered as exemplary only, with the true scope of the present invention being indicated by the following claims.

What is claimed is:

1. An information reproduction system comprising:

read means for optically reading a code from a recording medium having a portion where multimedia information including at least one of audio information, video information, and digital code data is recorded as an optically readable code;

restoration means for demodulating the code read by said read means and outputting demodulated data;

reproduction means for performing processing associated with error correction of the demodulated data output from said restoration means;

output means for outputting the data output from said reproduction means as the recognizable original multimedia information;

in which the data output from said reproduction means includes, as header information, attribute information representing a type of data as an output target, said output means outputs the multimedia information of the corresponding data in accordance with the attribute information;

attribute information detection means for detecting, from the attribute information, an omitted portion or a portion for which error correction by said reproduction means has failed; and default value setting means for replacing the attribute information of the data as the output target with a default value when the attribute information is not detected by said attribute information detection means.

2. A system according to claim 1, further comprising an attribute information memory for storing the attribute information detected in a previous read operation performed before a current read operation, and wherein said default value setting means includes means for using the attribute information stored in said attribute information memory as the default value.

3. A system according to claim 1, wherein said default value setting means includes means for changing the default value in units of recording media, in units of operators, or in units of operation periods.

4. A system according to claim 3, wherein said default value setting means includes means for setting, as the default value, attribute information most frequently used in units of recording media, in units of operators, or in units of operation periods.

5. A system according to claim 1, further comprising notification means for notifying that the default value is set by said default value setting means.

6. A system according to claim 1, wherein said read means optically reads the code by a manual scanning operation.

7. An information reproduction system comprising:

read means for optically reading a code from a recording medium, the recording medium having at least a portion wherein multimedia information including at least one of audio information, video information, and digital code data is recorded as an optically readable code;

restoration means for demodulating the code read by said read means and outputting demodulated data;

reproduction means for performing error correction processing in units of one partial data chunk, the one partial data chunk including an aggregate of a predetermined amount of demodulated data output from said restoration means;

error partial data chunk detection means for detecting an omitted portion of the partial data chunk or a portion of the partial data chunk for which error correction by said reproduction means has failed as an error partial data chunk in units of one partial data chunk; and output means for acquiring a predetermined number of partial data chunks output from said reproduction means to form final output data, the output means outputting the final output data as recognizable original multimedia information;

wherein said output means, before outputting the final output data as recognizable original multimedia information, executes predetermined processing with respect to a portion of the final output data to be output, which corresponds to the error partial data chunk, so as to change an output form of data of the portion of the final output data corresponding to the error partial data chunk.

8. A system according to claim 1, wherein said read means optically reads the code by a manual scanning operation.

9. A system according to claim 7, wherein said output means includes data change means for recognizing the error partial data chunk detected by said error partial data chunk detection means and replacing the data of the portion of the final output data corresponding to the error partial data chunk with predetermined data.

10. A system according to claim 9, wherein when the multimedia information is audio information, said data change means includes means for decreasing an audio output level of the portion of the final output data corresponding to the error partial data chunk.

11. A system according to claim 9, wherein when the multimedia information is image information, said data change means includes means for shading an image of the portion of the final output data corresponding to the error partial data chunk.

12. A system according to claim 9, wherein said data change means includes means for deleting the error partial data chunk as a change target and inserting substitute data in the deleted portion.

13. A system according to claim 12, wherein, when the multimedia information is the audio information, the substitute data to be inserted in the deleted portion is silent data.

14. A system according to claim 12, wherein, when the multimedia information is the image information, the substitute data to be inserted in the deleted portion is predetermined luminance level data.

15. A system according to claim 12, wherein said data change means includes means for generating the substitute data to be inserted in the deleted portion on the basis of data before and after or around the error partial data chunk.

16. A system according to claim 9, further comprising notification means for notifying that the error partial data chunk is changed by said data change means.

17. A system according to claim 9, wherein when the final output data obtained upon acquiring the predetermined number of partial data chunks is compression data compressed using a predetermined technique, said data change means detects, from the final output data after expansion processing, an error propagation range based on the error partial data chunk, and changes the final output data after expansion processing on the basis of the detected error propagation range information.

18. A system according to claim 7, wherein said output means includes control signal generation means for recognizing the error partial data chunk detected by said error partial data chunk detection means and generating a control signal for changing the output form of the data of the portion of the final output data corresponding to the error partial data chunk.

19. A system according to claim 18, wherein when the multimedia information is audio information, the control signal is a signal for decreasing an audio output level of the portion of the final output data corresponding to the error partial data chunk.

20. A system according to claim 18, wherein when the multimedia information is image information, the control signal is a signal for shading an image of the portion of the final output data corresponding to the error partial data chunk.

21. A system according to claim 18, further comprising notification means for notifying that the control signal is generated by said control signal generation means.

\* \* \* \* \*